(12) United States Patent
Baek et al.

(10) Patent No.: US 9,576,978 B2
(45) Date of Patent: Feb. 21, 2017

(54) CELLS INCLUDING AT LEAST ONE FIN FIELD EFFECT TRANSISTOR AND SEMICONDUCTOR INTEGRATED CIRCUITS INCLUDING THE SAME

(71) Applicant: Samsung Electronics Co., Ltd., Suwon-Si, Gyeonggi-Do (KR)

(72) Inventors: Sang-hoon Baek, Seoul (KR); Sang-Kyu Oh, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 291 days.

(21) Appl. No.: 14/042,900

(22) Filed: Oct. 1, 2013

(65) Prior Publication Data

US 2014/0097493 A1 Apr. 10, 2014

(30) Foreign Application Priority Data

Oct. 9, 2012 (KR) .................. 10-2012-0112089
Nov. 8, 2012 (KR) .................. 10-2012-0126164

(51) Int. Cl.
| | |
|---|---|
| *H01L 27/12* | (2006.01) |
| *H01L 21/8234* | (2006.01) |
| *H01L 21/84* | (2006.01) |
| *H01L 29/66* | (2006.01) |
| *H01L 27/088* | (2006.01) |

(52) U.S. Cl.
CPC ... *H01L 27/1211* (2013.01); *H01L 21/823431* (2013.01); *H01L 21/845* (2013.01); *H01L 27/0886* (2013.01); *H01L 29/6681* (2013.01)

(58) Field of Classification Search
None
See application file for complete search history.

(56) References Cited

U.S. PATENT DOCUMENTS

| | | |
|---|---|---|
| 6,770,516 B2 | 8/2004 | Wu et al. |
| 6,787,823 B2 | 9/2004 | Shibutani |
| 7,221,031 B2 | 5/2007 | Ryoo et al. |
| 7,446,352 B2 | 11/2008 | Becker et al. |
| 7,595,542 B2 | 9/2009 | Park et al. |
| 7,900,176 B2 | 3/2011 | Kim et al. |
| 8,003,466 B2 | 8/2011 | Shi et al. |
| 2007/0045736 A1 | 3/2007 | Yagishita |
| 2008/0021689 A1 | 1/2008 | Yamashita et al. |
| 2008/0179682 A1* | 7/2008 | Bauer et al. ............ 257/365 |
| 2010/0181613 A1 | 7/2010 | Kim et al. |
| 2010/0237436 A1* | 9/2010 | Inaba ............ H01L 27/0924 257/392 |

(Continued)

FOREIGN PATENT DOCUMENTS

| | | |
|---|---|---|
| KR | 100615581 B1 | 8/2006 |
| KR | 20070107336 A | 11/2007 |

(Continued)

*Primary Examiner* — Whitney T Moore
(74) *Attorney, Agent, or Firm* — Harness, Dickey & Pierce

(57) ABSTRACT

A semiconductor integrated circuit (IC) may comprise at least one cell comprising at least one fin field-effect transistor (FET). The at least one cell may comprise a plurality of fins that extend in a first direction and are arranged in parallel to each other in a second direction that is perpendicular to the first direction. A size of the at least one cell in the second direction may correspond to a number and a pitch of the plurality of fins.

19 Claims, 33 Drawing Sheets

(56) References Cited

U.S. PATENT DOCUMENTS

| | | | |
|---|---|---|---|
| 2012/0001232 A1* | 1/2012 | Liaw | 257/208 |
| 2013/0277760 A1* | 10/2013 | Lu et al. | 257/401 |
| 2014/0315363 A1* | 10/2014 | Balakrishnan | H01L 29/0673 438/233 |

FOREIGN PATENT DOCUMENTS

| | | |
|---|---|---|
| KR | 100827696 B1 | 5/2008 |
| KR | 20080045517 A | 5/2008 |
| KR | 100843900 B1 | 7/2008 |
| KR | 20090108390 A | 10/2009 |

* cited by examiner

CELLS INCLUDING AT LEAST ONE FIN FIELD EFFECT TRANSISTOR AND SEMICONDUCTOR INTEGRATED CIRCUITS INCLUDING THE SAME

CROSS-REFERENCE TO RELATED APPLICATION(S)

This application claims priority from Korean Patent Application Nos. 10-2012-0112089 and 10-2012-0126164, filed on Oct. 9, 2012, and Nov. 8, 2012, respectively, in the Korean Intellectual Property Office (KIPO), the disclosures of which are incorporated herein in their entirety by reference.

BACKGROUND

1. Field

Some example embodiments may relate to semiconductor integrated circuits. Some example embodiments may relate to cells including a fin field effect transistor and/or semiconductor integrated circuits including the same.

2. Description of Related Art

A fin transistor such as a fin field-effect transistor (FET) or a fin type transistor is a three-dimensional (3D) transistor having a fin structure protruding from a substrate. Since the fin transistor may use an entire surface of the fin structure as a channel region, a sufficient channel length may be ensured. Accordingly, a short channel effect may be prevented or minimized, and thus problems of leakage current and a small area caused due to the short channel effect in a conventional planar transistor may be reduced or solved.

SUMMARY

Some example embodiments may provide semiconductor integrated circuits capable of improving integration by reducing a size of a cell included in a fin field effect transistor.

Some example embodiments may provide cell circuits capable of improving integration by reducing a size of a cell included in a fin field effect transistor.

Some example embodiments may provide semiconductor integrated circuits including active fins having fixed pitches irrespective of a change in a height of a cell.

Some example embodiments may provide fin field effect transistors including active fins having fixed pitches irrespective of a change in a height of a cell.

In some example embodiments, a semiconductor integrated circuit (IC) may comprise at least one cell comprising at least one fin field-effect transistor (FET). The at least one cell may comprise a plurality of fins that extend in a first direction and are arranged in parallel to each other in a second direction that is perpendicular to the first direction. A size of the at least one cell in the second direction may correspond to a number and a pitch of the plurality of fins.

In some example embodiments, the plurality of fins may comprise a plurality of active fins and/or a plurality of dummy fins.

In some example embodiments, the plurality of fins may comprise a plurality of active fins adjacent to each other; and/or a plurality of dummy fins adjacent to each other.

In some example embodiments, the at least one cell may further comprise a plurality of metal lines extending in the first direction and arranged in parallel to each other in the second direction.

In some example embodiments, the plurality of metal lines may comprise two power lines arranged at both ends of the at least one cell in the second direction; and/or a plurality of wires disposed between the two power lines.

In some example embodiments, the plurality of metal lines may have a same width.

In some example embodiments, the plurality of wires may have a same width.

In some example embodiments, a width of each of the two power lines may be greater than a width of each of the plurality of wires.

In some example embodiments, a semiconductor integrated circuit (IC) may comprise at least one cell comprising at least one fin field-effect transistor (FET). The at least one cell may further comprise a first region comprising a plurality of active fins arranged in parallel to each other in a first direction; and/or a second region comprising a plurality of dummy fins arranged in parallel to the plurality of active fins.

In some example embodiments, the first region may include no dummy fins.

In some example embodiments, the second region may include no active fins.

In some example embodiments, the second region may further comprise a power region in which a power line configured to supply power to the plurality of active fins is disposed; and/or at least one middle region in which input and output terminals with respect to the at least one cell are disposed.

In some example embodiments, the second pitch may be greater than or equal to the first pitch.

In some example embodiments, the plurality of active fins and the plurality of dummy fins may have a same width.

In some example embodiments, the first region may include no dummy fins and/or the second region may include no active fins.

In some example embodiments, the first region may further comprise a first active region and/or a second active region. The second region may further comprise a first dummy region disposed between a first cell boundary of the at least one cell and the first active region; a second dummy region disposed between the first active region and the second active region; and/or a third dummy region disposed between a second cell boundary of the at least one cell and the second active region.

In some example embodiments, a semiconductor integrated circuit (IC) may comprise at least one cell comprising at least one fin field-effect transistor (FET); a first region; and/or a second region that does not overlap the first region. The first region may comprise at least two active fins arranged in parallel to each other with a first pitch. The second region may comprise at least two dummy fins arranged in parallel to each other with a second pitch.

In some example embodiments, the second pitch may be greater than or equal to the first pitch.

In some example embodiments, the first region may include no dummy fins and/or the second region may include no active fins.

In some example embodiments, two or more of the at least two active fins may be arranged consecutively in a direction that is perpendicular to the arrangement direction of the at least two active fins, wherein two or more of the at least two dummy fins may be arranged consecutively in a direction that is perpendicular to the arrangement direction of the at least two dummy fins, or wherein two or more of the at least two active fins may be arranged consecutively in the direction that is perpendicular to the arrangement direction of the at least two active fins, and two or more of the at least two dummy fins may be arranged consecutively in the direction that is perpendicular to the arrangement direction of the at least two dummy fins.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION OF THE EMBODIMENTS

Figure 1:
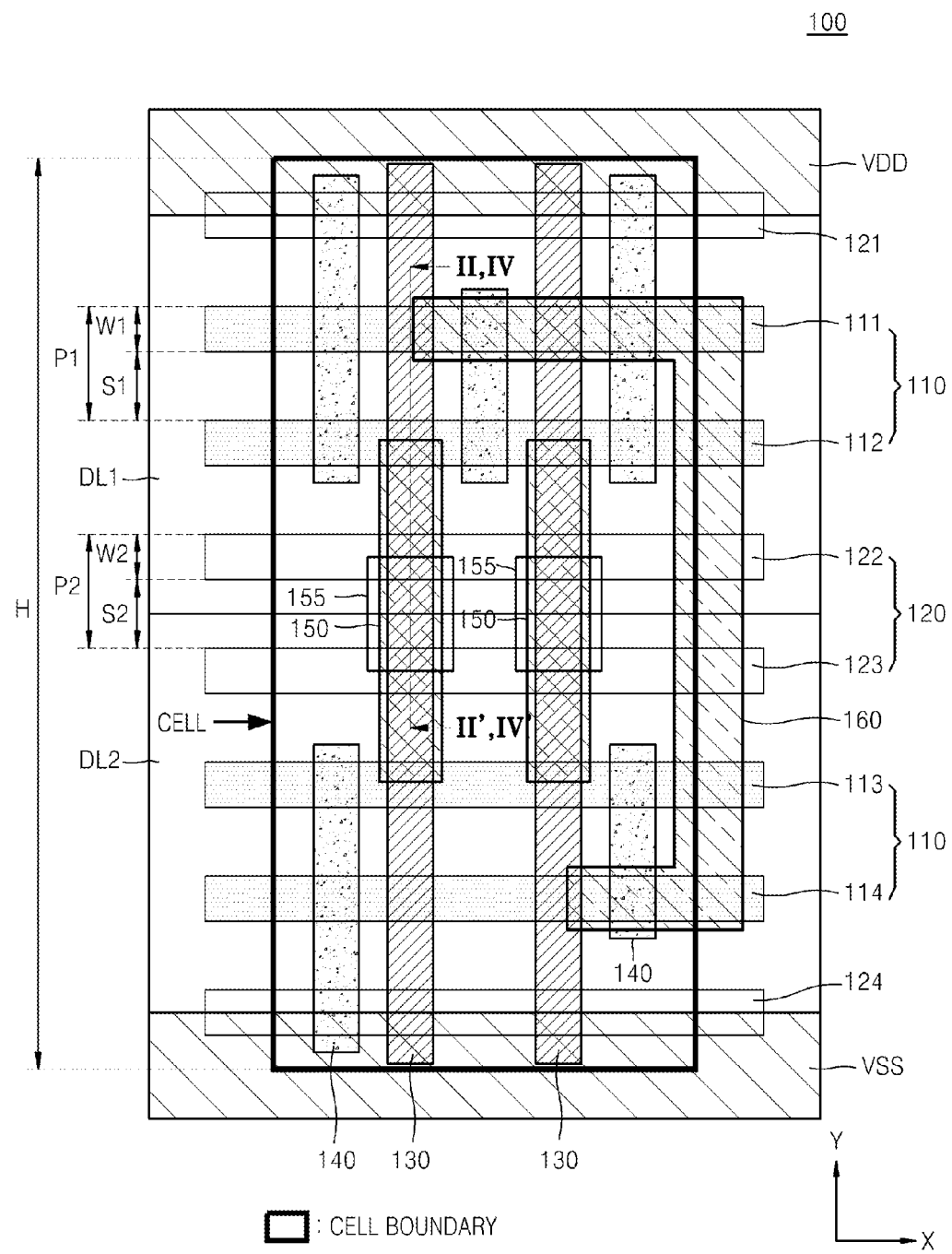
FIG. 1 is a layout of a semiconductor integrated circuit (IC) according to some example embodiments of the inventive concepts.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a layout of a semiconductor integrated circuit (IC) 100 according to some example embodiments of the inventive concepts.

Referring to FIG. 1, the semiconductor IC 100 may include at least one cell CELL limited by a cell boundary indicated in a bold solid line. The cell CELL may include a plurality of fins including a plurality of active fins 110 and a plurality of dummy fins 120, a plurality of gate electrodes 130, a plurality of source and drain contacts 140, two input terminals 150, two input contacts 155, an output terminal 160, and two power lines VDD and VSS. Although not shown, a plurality of conductive lines, for example, metal lines, may be further disposed above the cell CELL.

As known to a person having ordinary skill in the art (PHOSITA), active fins 110 provide electrical connection between source and drain contacts 140 to support transistor functionality via gate electrodes 130. As also known to a PHOSITA, dummy fins 120 do not provide electrical connection between source and drain contacts 140 to support transistor functionality via gate electrodes 130.

In some example embodiments, the cell CELL may be a standard cell. Such a standard cell based layout design method may reduce a time taken to design a layout by previously designing a device such as an OR gate or an AND gate that is repeatedly used as the standard cell, storing the standard cell in a computer system, and placing and wiring the standard cell at a necessary location during the layout design.

The plurality of active fins 110 may include first through fourth active fins 111 through 114. However, the number of the plurality of active fins 110 included in the at least one cell CELL is not limited to 4, and may be modified in various ways. In some example embodiments of the inventive concepts, the number of the plurality of active fins 110 included in the at least one cell CELL may be greater than 4. In some example embodiments of the inventive concepts, the number of the plurality of active fins 110 included in the at least one cell CELL may be smaller than 4.

Among the first through fourth active fins 111 through 114, the active fins arranged adjacent to each other may constitute a fin field effect transistor (fin FET). A channel width of the fin FET may be increased in proportional to the number of active fins constituting the fin FET, and thus, a current amount flowing through the fin FET may be increased. The channel width of the fin FET will be described later in greater detail with respect to FIGS. 2 through 5.

The plurality of dummy fins 120 may include first through fourth dummy fins 121 through 124. However, the number of the plurality of dummy fins 120 included in the at least one cell CELL is not limited to 4, and may be modified in various ways. In some example embodiments of the inventive concepts, the number of the plurality of dummy fins 120 included in the at least one cell CELL may be greater than 4. In some example embodiments of the inventive concepts, the number of the plurality of dummy fins 120 included in the at least one cell CELL may be smaller than 4.

The first and second active fins 111 and 112 and the first and second dummy fins 121 and 122 may be disposed in a first limit layer DL1. The third and fourth active fins 113 and 114 and the third and fourth dummy fins 123 and 124 may be disposed in a second limit layer DL2. In some example embodiments, the first limit layer DL1 may be a p+ impurity doped p-channel metal-oxide-semiconductor (PMOS) limit layer, and the second limit layer DL2 may be an n+ impurity doped PMOS limit layer. The first and second active fins 111 and 112 disposed in the first limit layer DL1 may constitute a PMOS fin FET. The third and fourth active fins 113 and 114 disposed in the second limit layer DL2 may be an n-channel metal-oxide-semiconductor (NMOS) fin FET.

More specially, two gate electrodes 130 and three source and drain contacts 140 are disposed above the first and second active fins 111 and 112, and thus the first and second active fins 111 and 112 may constitute two PMOS fin FETs that are connected to each other in parallel. The two gate electrodes 130 and two source and drain contacts 140 are disposed above the third and fourth active fins 113 and 114, and thus the third and fourth active fins 113 and 114 may constitute two NMOS fin FETs that are connected to each other in series.

In some example embodiments, the first through fourth active fins 111 through 114 and the first through fourth dummy fins 121 through 124 may extend in a first direction (for example, an X direction) and may be arranged in a second direction (for example, a Y direction) in parallel to each other. In this regard, the second direction may be substantially perpendicular to the first direction.

In a width W1 of each of the first through fourth active fins 111 through 114, a space S1 between two adjacent active fins among the first through fourth active fins 111 through 114, and a pitch P1 of the first through fourth active fins 111 through 114, P1=W1+S1. In some example embodiments, the width W1, the space S1, and the pitch P1 may have constant values irrespective of the number of the active fins 110 included in the cell CELL or the number of the active fins 110 and the dummy fins 120.

In a width W2 of each of the first through fourth dummy fins 121 through 124, a space S2 between two adjacent dummy fins among the first through fourth dummy fins 121 through 124, and a pitch P2 of the first through fourth dummy fins 121 through 124, P2=W2+S2. In some example embodiments, the width W2, the space S2, and the pitch P2 may have constant values irrespective of the number of the active fins 110 included in the cell CELL or the number of the active fins 110 and the dummy fins 120.

In some example embodiments, the width W1 of each of the first through fourth active fins 111 through 114 may be substantially the same as the width W2 of each of the first through fourth dummy fins 121 through 124. Also, the space S1 between two adjacent active fins among the first through fourth active fins 111 through 114 may be substantially the same as the space S2 between two adjacent dummy fins among the first through fourth dummy fins 121 through 124. Therefore, the pitch P1 of the first through fourth active fins 111 through 114 may be substantially the same as the pitch P2 of the first through fourth dummy fins 121 through 124. Thus, both the pitch P1 of the first through fourth active fins 111 through 114 and the pitch P2 of the first through fourth dummy fins 121 through 124 is referred to as P below.

A size of the cell CELL in the second direction (for example, the Y direction) is denoted by H. The size of the cell CELL in the second direction is referred to as a "height" below. If the number of the plurality of active fins 110 and dummy fins 120 included in the cell CELL is N, the height H of the cell CELL may correspond to the number N and the pitch P of the plurality of active fins 110 and dummy fins 120. More specifically, the height H of the cell CELL may be expressed as a multiplication of the number N and the pitch P of the plurality of active fins 110 and dummy fins 120 (i.e. H=N*P).

In some example embodiments, the number of the active fins 110 is 4, and the number of the dummy fins 120 is 4, and thus the number N of the plurality of active fins 110 and dummy fins 120 is 8. In this regard, the height H of the cell CELL may be expressed as 8*P that is the multiplication of the number N (i.e. 8) and the pitch P of the plurality of active fins 110 and dummy fins 120 (i.e. H=8*P).

As described above, according to some example embodiments, the pitch P of the plurality of active fins 110 and dummy fins 120 has a constant value irrespective of the number N of the plurality of active fins 110 and dummy fins 120 included in the cell CELL, and the height H of the cell CELL corresponds to the number N and the pitch P of the plurality of active fins 110 and dummy fins 120. Therefore, the pitch P of the plurality of active fins 110 and dummy fins 120 may be constantly applied to cells having different libraries, thereby facilitating a design of the semiconductor IC 100. Furthermore, the plurality of active fins 110 and dummy fins 120 having the constant pitch P may be manufactured for the cells having different libraries, thereby simplifying a process of the semiconductor IC 100.

Further, according to some example embodiments, the height H of the cell CELL may correspond to the number N and the pitch P of the plurality of active fins 110 and dummy fins 120 included in the cell CELL. In this regard, the height H of the cell CELL is relatively lower than the height H of the cell CELL corresponding to the number and pitch of the metal lines disposed above the cell CELL. As described above, integration of the semiconductor IC 100 may be further enhanced by reducing the height H of the cell CELL.

Figure 2:
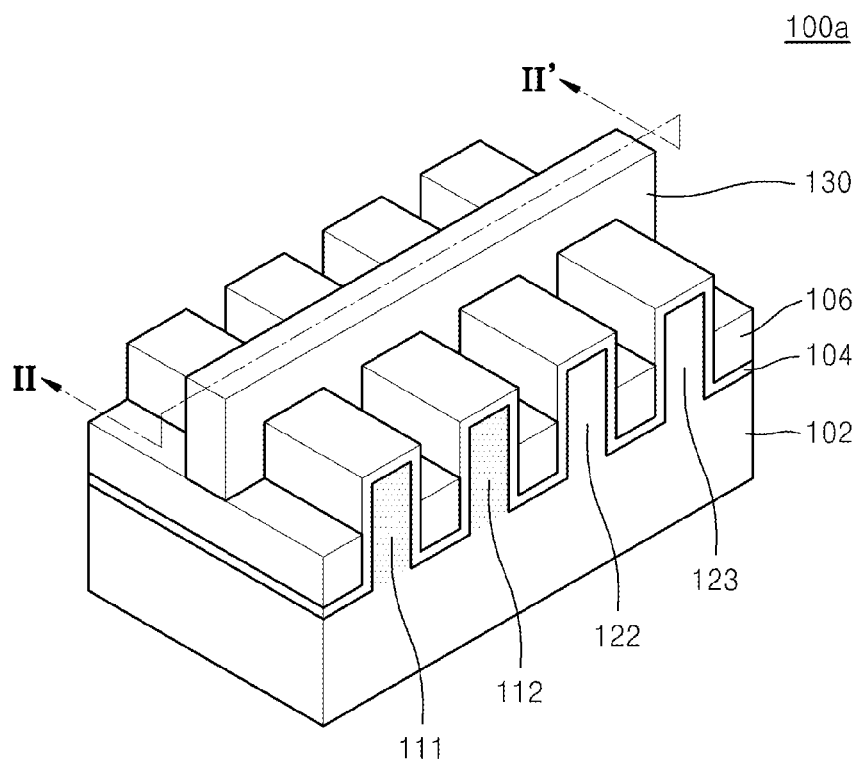
FIG. 2 is a perspective view of a semiconductor device with the layout of FIG. 1, according to some example embodiments of the inventive concepts.

FIG. 2 is a perspective view of a semiconductor device 100a with the layout of FIG. 1, according to some example embodiments of the inventive concepts.

Figure 3:
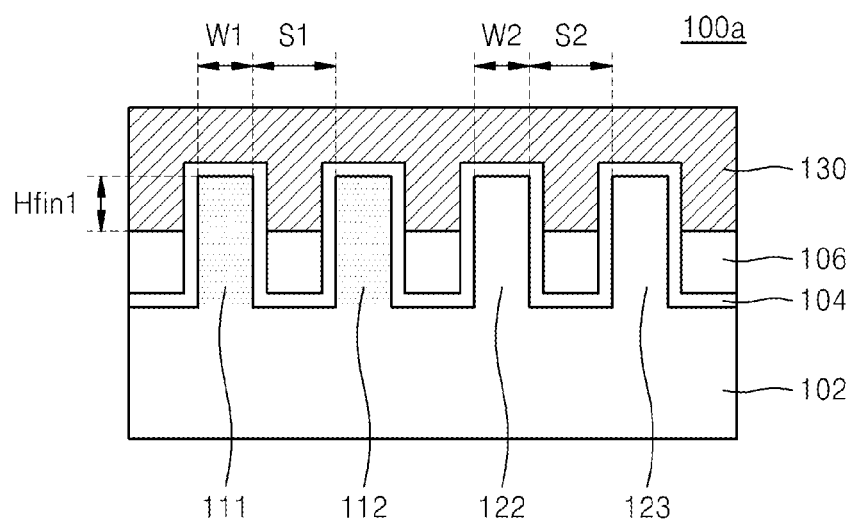
FIG. 3 is a cross-sectional view taken along line II-IF of FIG. 2.

FIG. 3 is a cross-sectional view taken along line II-IF of FIG. 2.

Referring to FIGS. 2 and 3, the semiconductor device 100a may be a bulk type fin FET. The semiconductor device 100a may include a substrate 102, a first insulating layer 104, a second insulating layer 106, first and second active fins 111 and 112, second and third dummy fins 122 and 123, and a gate electrode 130.

The substrate 102 may be a semiconductor substrate. For example, the substrate 102 may include one of silicon, silicon-on-insulator (SOI), silicon-on-sapphire (SOS), germanium, silicon-germanium, and gallium-arsenide.

The first and second active fins 111 and 112 and the second and third dummy fins 122 and 123 may be arranged to be connected to the substrate 102. In some example embodiments, protruding portions of the first and second active fins 111 and 112 that are perpendicular with respect to the substrate 102 may be n+ or p+ doped active regions, and protruding portions of the second and third dummy fins 122 and 123 that are perpendicular with respect to the substrate 102 may be undoped regions. In some example embodiments, the first and second active fins 111 and 112 and the second and third dummy fins 122 and 123 may all be n+ or p+ doped active regions.

The first and second active fins 111 and 112 may each have a width W1 and a height Hfin1, and thus, may each have a channel width (or an effective channel width) of (2*Hfin1+W1). The height Hfin1 indicates a height from an upper surface of the second insulating layer 106 to an upper surface of each of the first and second active fins 111 and 112. When an M number of active fins constitute one fin FET, the fin FET may have a channel width (or an effective channel width) of (2*Hfin1+W1)*M. In some example embodiments, the first and second active fins 111 and 112 constitute one fin FET, and thus the fin FET may have a channel width (or an effective channel width) of (2*Hfin1+W1)*2.

The first and second insulating layers 104 and 106 may include an insulating material, for example, which may include one of an oxide layer, a nitride layer, and an oxynitride layer. The first insulating layer 104 may be disposed on the first and second active fins 111 and 112 and the second and third dummy fins 122 and 123. The first insulating layer 104 may be disposed between the first and second active fins 111 and 112, and the gate electrode 130, and thus, may serve as a gate insulating layer. The second insulating layer 106 may be disposed in a space between the first and second active fins 111 and 112 and the second and third dummy fins 122 and 123 to have a desired height (that may or may not be predetermined). The second insulating layer 106 may be disposed among the first and second active fins 111 and 112 and the second and third dummy fins 122 and 123, and thus, may be used as a device isolation layer.

The gate electrode 130 may be arranged on the first and second insulating layers 104 and 106 to have a structure surrounding the first and second active fins 111 and 112, the second and third dummy fins 122 and 123, and the second insulating layer 106, i.e., a structure including the first and second active fins 111 and 112 and the second and third dummy fins 122 and 123 in the gate electrode 130. The gate electrode 130 may include at least one of a metallic material such as tungsten (W) and tantalum (Ta), a nitride thereof, a silicide thereof, and a doped polysilicon, and may be formed using a deposition process.

Figure 4:
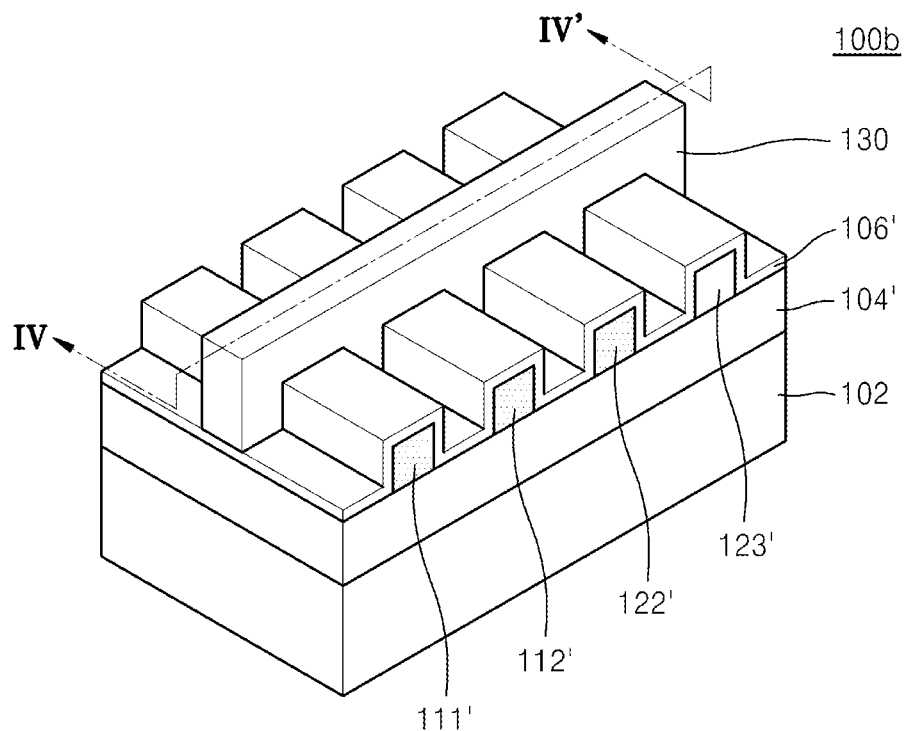
FIG. 4 is a perspective view of a semiconductor device with the layout of FIG. 1, according to some example embodiments of the inventive concepts.

FIG. 4 is a perspective view of a semiconductor device 100b with the layout of FIG. 1, according to some example embodiments of the inventive concepts.

Figure 5:
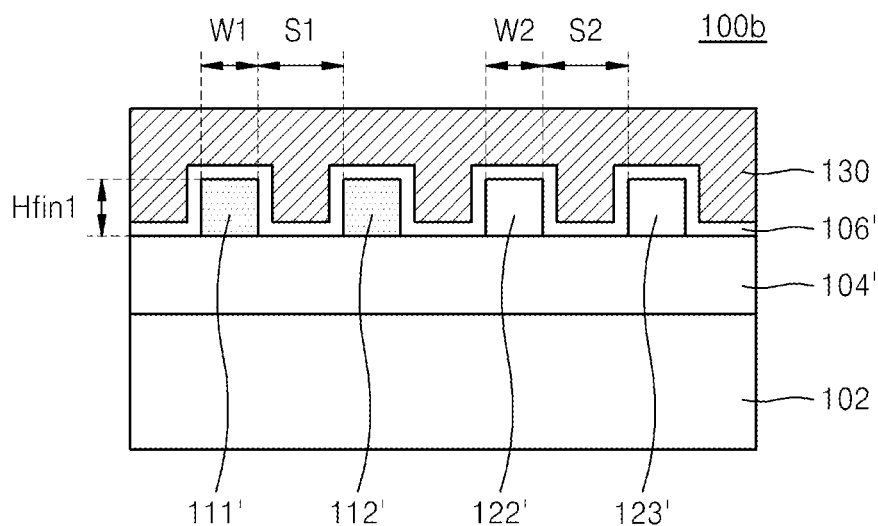
FIG. 5 is a cross-sectional view taken along line IV-IV' of FIG. 4.

FIG. 5 is a cross-sectional view taken along line IV-IV' of FIG. 4.

Referring to FIGS. 4 and 5, the semiconductor device 100b may be an SOI type fin FET. The semiconductor device 100b may include a substrate 102, a first insulating layer 104', a second insulating layer 106', first and second active fins 111' and 112', second and third dummy fins 122' and 123', and the gate electrode 130. The semiconductor device 100b in some example embodiments is a modified example of the semiconductor device 100a of FIGS. 2 and 3, and thus, some example embodiments will be described focusing on a difference from the semiconductor device 100a, and a repeated detailed description thereof is not provided.

The first insulating layer 104' may be arranged on the substrate 102. The second insulating layer 106' may be disposed between the first and second active fins 111' and 112', the second and third dummy fins 122' and 123', and the gate electrode 130, and thus, may serve as a gate insulating layer. The first and second active fins 111' and 112' and the second and third dummy fins 122' and 123' may include a semiconductor material, for example, silicon or doped silicon.

The gate electrode 130 may be arranged on the second insulating layer 106' to have a structure surrounding the first and second active fins 111' and 112', the second and third dummy fins 122' and 123', and the second insulating layer 106', i.e., a structure including the first and second active fins 111' and 112' and the second and third dummy fins 122' and 123' in the gate electrode 130.

Figure 6:
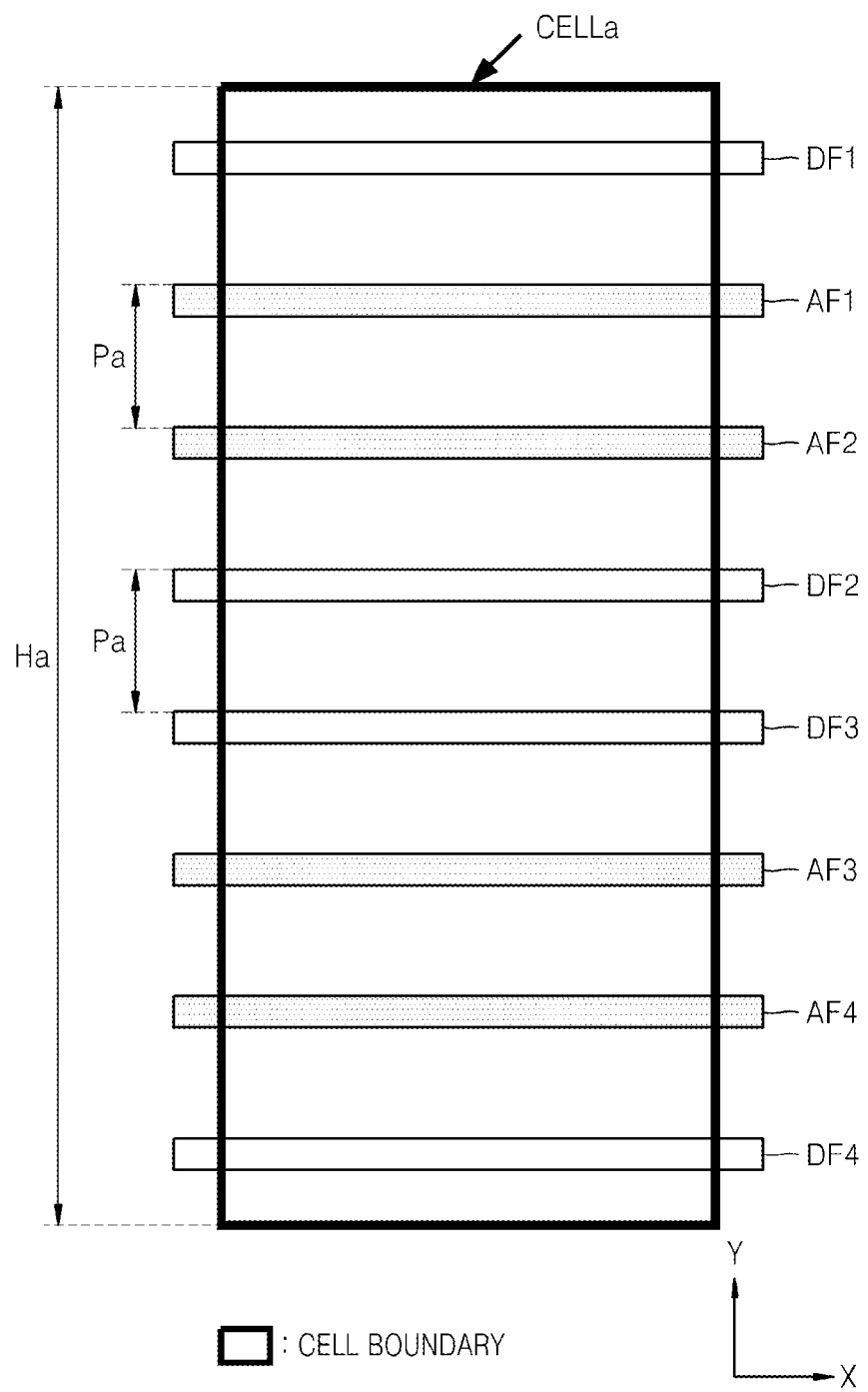
FIG. 6 is a layout of a semiconductor IC on which 8 metal lines are disposed, according to some example embodiments of the inventive concepts.

FIG. 6 is a layout of a semiconductor IC 100A on which 8 metal lines are disposed, according to a comparison example.

Referring to FIG. 6, the semiconductor IC 100A may include at least one cell CELLa limited by a cell boundary indicated in a bold solid line. FIG. 6 shows a plurality of active fins AF1 through AF4 and a plurality of dummy fins DF1 through DF4 that are included in the cell CELLa for convenience of description.

A size of the cell CELLa in a second direction (for example, a Y direction), i.e. a height Ha, may correspond to the number and pitch of metal lines (not shown) disposed above the cell CELLa. As described above, if the height Ha of the cell CELLa corresponds to the number and pitch of the metal lines disposed above the cell CELLa, the number Na and pitch Pa of the plurality of active fins AF1 through AF4 and the plurality of dummy fins DF1 through DF4 that are included in the cell CELLa are adaptively determined based on the height Ha of the cell CELLa.

For example, if a number and pitch of the metal lines disposed above the cell CELLa are 8 and 45, respectively, the height Ha of the cell CELLa is determined as 8*45=360. In this regard, if a minimum value of the pitch Pa of the plurality of active fins AF1 through AF4 and the plurality of dummy fins DF1 through DF4 that are included in the cell CELLa is 40.5, the number Na of the plurality of active fins AF1 through AF4 and the plurality of dummy fins DF1 through DF4 that are included in the cell CELLa may be determined as 8 (i.e., 40.5*8≤360). Also, the pitch Pa of the plurality of active fins AF1 through AF4 and the plurality of dummy fins DF1 through DF4 that are included in the cell CELLa may be determined as 45 (i.e., Pa=360/8). In this regard, the pitch Pa of the plurality of active fins AF1 through AF4 and the plurality of dummy fins DF1 through DF4 and the height Ha of the cell CELLa are normalized values. Likewise, all values of pitches and heights described below are normalized values.

Figure 7:
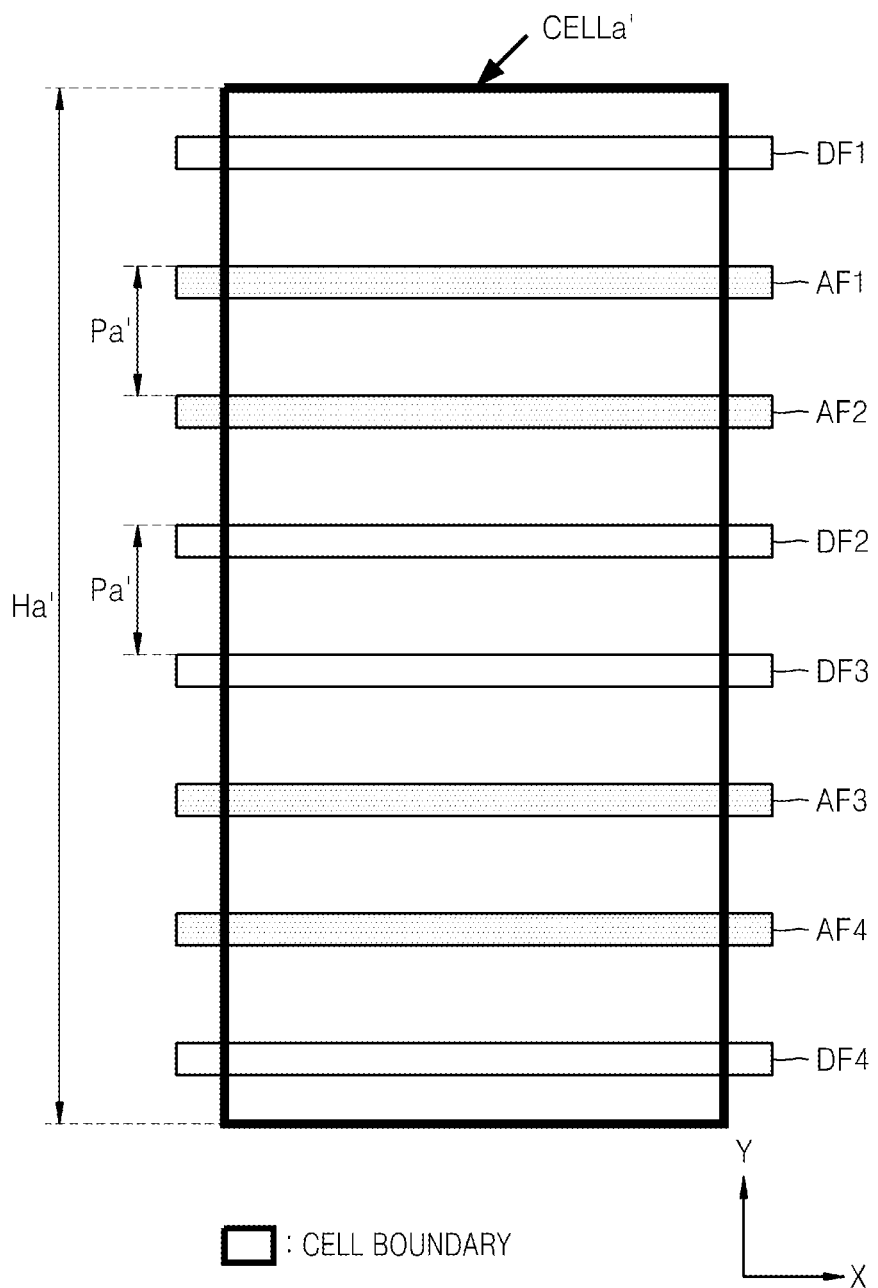
FIG. 7 is a layout of a semiconductor IC on which 8 metal lines are disposed, according to some example embodiments of the inventive concepts.

FIG. 7 is a layout of a semiconductor IC 100B on which 8 metal lines are disposed, according to some example embodiments of the inventive concepts.

Referring to FIG. 7, the semiconductor IC 100B may include at least one cell CELLa' limited by a cell boundary indicated in a bold solid line. FIG. 7 shows the plurality of active fins AF1 through AF4 and the plurality of dummy fins DF1 through DF4 that are included in the cell CELLa' for convenience of description.

In some example embodiments, a size of the cell CELLa' in a second direction (for example, a Y direction), i.e. a height Ha', may correspond to the number Na and pitch Pa' of the plurality of active fins AF1 through AF4 and the plurality of dummy fins DF1 through DF4 that are included in the cell CELLa'. In this regard, the pitch Pa' of the plurality of active fins AF1 through AF4 and the plurality of dummy fins DF1 through DF4 may have a constant value irrespective of the number Na of the plurality of active fins AF1 through AF4 and the plurality of dummy fins DF1 through DF4 that are included in the cell CELLa'.

For example, if a number of the metal lines disposed above the cell CELLa' is 8, as shown in FIG. 6, the number Na of the plurality of active fins AF1 through AF4 and the plurality of dummy fins DF1 through DF4 may be determined as 8. In this regard, if the pitch Pa' of the plurality of active fins AF1 through AF4 and the plurality of dummy fins DF1 through DF4 is 40.5, the height Ha' of the cell CELLa' is determined as 8*Pa' (i.e., 8*40.5=324).

As described above, according to some example embodiments, the height Ha' of the cell CELLa' may correspond to the number Na and pitch Pa' of the plurality of active fins AF1 through AF4 and the plurality of dummy fins DF1 through DF4 that are included in the cell CELLa' other than the number and pitch of the metal lines disposed above the cell CELLa'. Therefore, the height Ha' of the cell CELLa' may be lower compared to the comparison example of FIG. 6 in which the number of metal lines disposed above the cell CELLa is the same as that of metal lines disposed above the cell CELLa', thereby further enhancing the integration of the semiconductor IC 100B.

Figure 8:
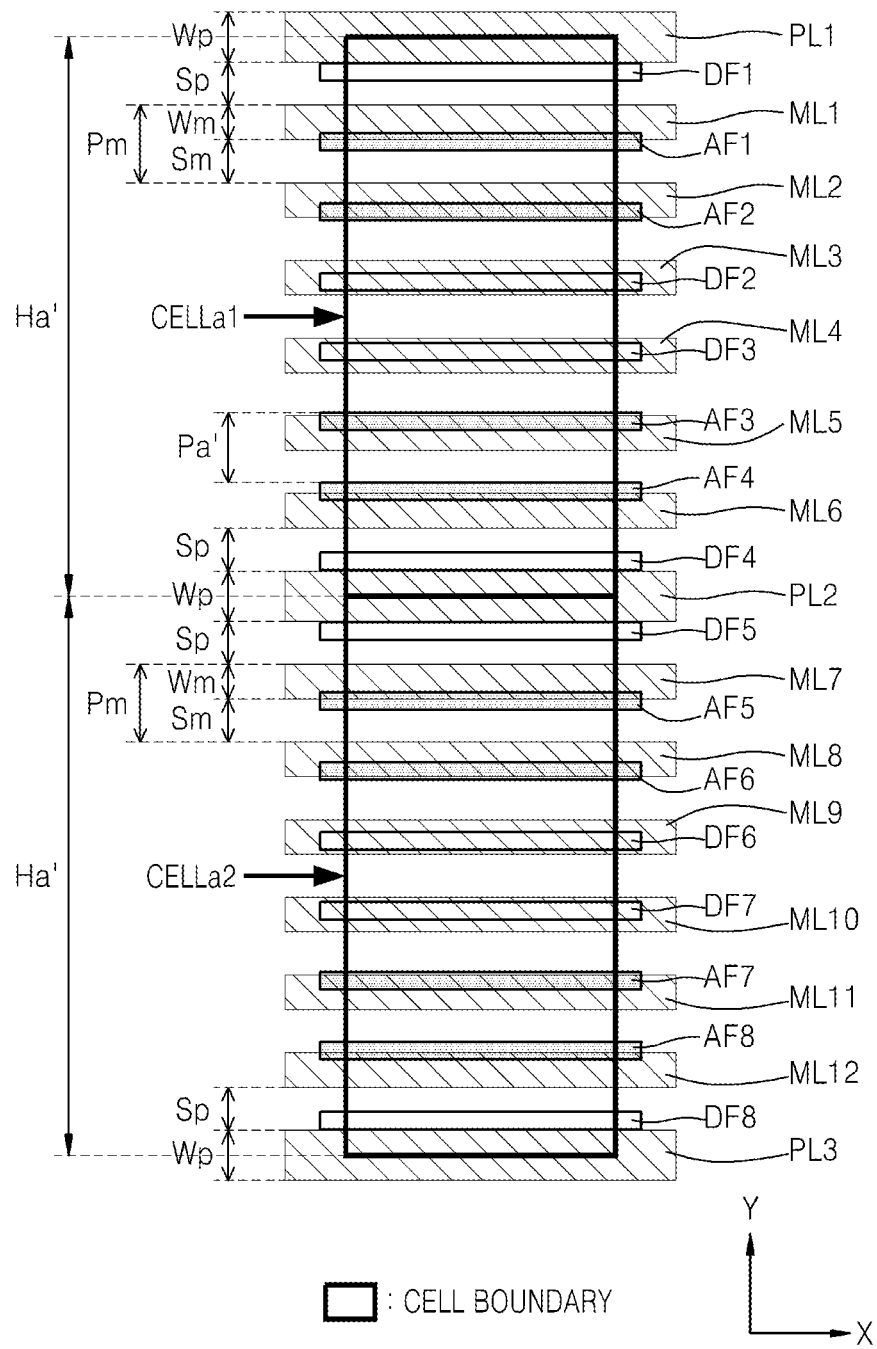
FIG. 8 is a layout of a semiconductor IC including two adjacent cells including a cell of FIG. 7, according to some example embodiments of the inventive concepts.

FIG. 8 is a layout of a semiconductor IC 100C including two adjacent cells including a cell of FIG. 7, according to some example embodiments of the inventive concepts.

Referring to FIG. 8, the semiconductor IC 100C may include first and second adjacent cells CELLa1 and CELLa2 limited by a cell boundary indicated in a bold solid line. In this regard, the first cell CELLa1 or the second cell CELLa2 may correspond to the cell CELLa' of FIG. 7.

The first cell CELLa1 may include first through fourth active fins AF1 through AF4 and the first through fourth dummy fins DF1 through DF4. A plurality of metal lines (for example, 8) may be disposed above the first cell CELLa1. In this regard, the plurality of metal lines may extend in a first direction (for example, an X direction) and arranged in parallel to each other in a second direction (for example, a Y direction). The plurality of metal lines may also include first and second power lines PL1 and PL2 disposed at both ends of the first cell CELLa1 in the second direction and first through sixth wires ML1 through ML6 arranged between the first and second power lines PL1 and PL2.

In a width Wm of each of the first through sixth wires ML1 through ML6 and a space Sm between two adjacent wires among the first through sixth wires ML1 through ML6, a pitch Pm of the first through sixth wires ML1 through ML6 is Wm+Sm. In some example embodiments, the width Wm of each of the first through sixth wires ML1 through ML6, the space Sm between two adjacent wires among the first through sixth wires ML1 through ML6, and the pitch Pm of the first through sixth wires ML1 through ML6 may have constant values irrespective of the number of wires included in the first cell CELLa1 or the number of the metal lines.

The first power line PL1 is disposed over a boundary of the first cell CELLa1 and another cell (not shown) disposed to be adjacent to an upper portion of the first cell CELLa1. The second power line PL2 is disposed over a boundary of the first and second cells CELLa1 and CELLa2. In this regard, a width Wp of each of the first and second power lines PL1 and PL2 may be greater than the width Wm of each of the first through sixth wires ML1 through ML6.

In some example embodiments, the width Wp of each of the first and second power lines PL1 and PL2 may have a variable value according to a size of the first cell CELLa1 in the second direction, i.e. the height Ha'. More specifically, the width Wp of each of the first and second power lines PL1 and PL2 may be determined according to the height Ha' of the first cell CELLa1 excluding a size corresponding to a multiplication of the number and the pitch Pm of the first through sixth wires ML1 through ML6.

Meanwhile, a space Sp between the first power line PL1 and the first wire ML1 may be substantially the same as the space Sm between two adjacent wires among the first through sixth wires ML1 through ML6. The space Sp between the second power line PL2 and the sixth wire ML6 may also be substantially the same as the space Sm between two adjacent wires among the first through sixth wires ML1 through ML6.

The second cell CELLa2 may include fifth through eighth active fins AF5 through AF8 and fifth through eighth dummy fins DF5 through DF8. A plurality of metal lines (for example, 8) may be disposed above the second cell CELLa2. In this regard, the plurality of metal lines may extend in the first direction (for example, the X direction) and arranged in parallel to each other in the second direction (for example, the Y direction). The plurality of metal lines may also include the second power line PL2 and a third power line PL3 disposed at both ends of the second cell CELLa2 in the second direction and seventh through twelfth wires ML7 through ML12 arranged between the second and third power lines PL2 and PL3.

In the width Wm of each of the seventh through twelfth wires ML7 through ML12 and the space Sm between two adjacent wires among the seventh through twelfth wires ML7 through ML12, the pitch Pm of the seventh through twelfth wires ML7 through ML12 is Wm+Sm. In some example embodiments, the width Wm of each of the seventh through twelfth wires ML7 through ML12, the space Sm between two adjacent wires among the seventh through twelfth wires ML7 through ML12, and the pitch Pm of the seventh through twelfth wires ML7 through ML12 may have constant values irrespective of the number of wires included in the second cell CELLa2 or the number of the metal lines.

The second power line PL2 is disposed over the boundary of the first and second cells CELLa1 and CELLa2. The third power line PL3 is disposed over a boundary of the second cell CELLa2 and another cell (not shown) disposed to be adjacent to a lower portion of the second cell CELLa2. In this regard, the width Wp of each of the second and third power lines PL2 and PL3 may be greater than the width Wm of each of the seventh through twelfth wires ML7 through ML12.

In some example embodiments, the width Wp of each of the second and third power lines PL2 and PL3 may have a variable value according to a size of the second cell CELLa2 in the second direction, i.e. the height Ha'. More specifically, the width Wp of each of the second and third power lines PL2 and PL3 may be determined according to the height Ha' of the second cell CELLa2 excluding a size corresponding to a multiplication of the number and the pitch Pm of the seventh through twelfth wires ML7 through ML12.

Meanwhile, the space Sp between the second power line PL2 and the seventh wire ML7 may be substantially the same as the space Sm between two adjacent wires among the seventh through twelfth wires ML7 through ML12. The space Sp between the third power line PL3 and the twelfth wire ML12 may also be substantially the same as the space Sm between two adjacent wires among the first through sixth wires ML1 through ML6.

As described above, according to some example embodiments, the height Ha' of each of the first and second cells CELLa1 and CELLa2 may correspond to the number Na and the pitch Pa' of a plurality of active fins and a plurality of dummy fins, and the pitch Pa' may have a constant value irrespective of the number Na of the plurality of active fins and the plurality of dummy fins. The pitch Pm of wires disposed above each of the first and second cells CELLa1 and CELLa2 may have a constant value irrespective of the number of the wires, and the width Wp of power lines may be adaptively determined according to the height Ha' of each of the first and second cells CELLa1 and CELLa2.

Figure 9:
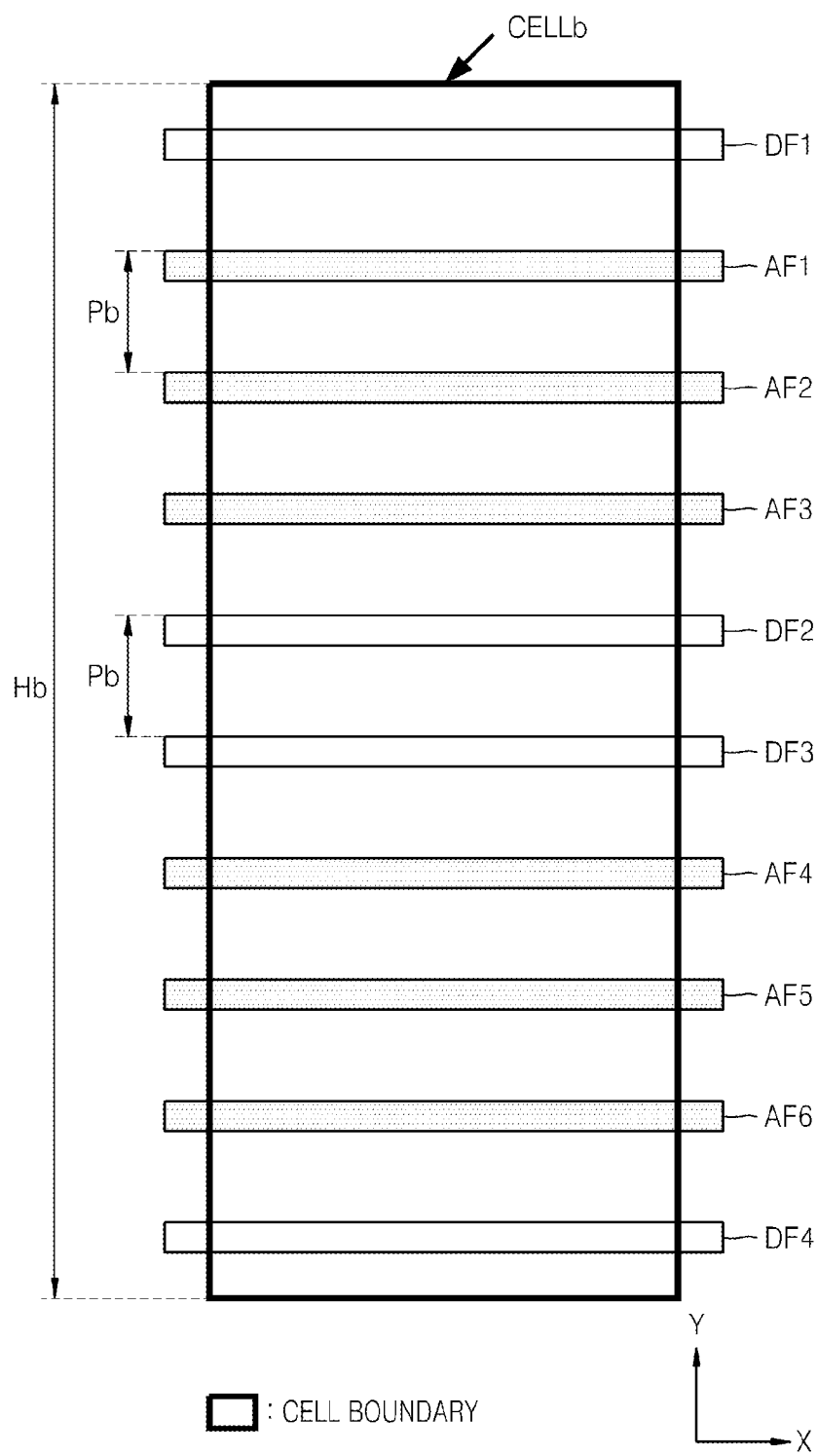
FIG. 9 is a layout of a semiconductor IC on which 9 metal lines are disposed, according to a comparison example.

FIG. 9 is a layout of a semiconductor IC 200A on which 9 metal lines are disposed, according to a comparison example.

Referring to FIG. 9, the semiconductor IC 200A may include at least one cell CELLb limited by a cell boundary indicated in a bold solid line. FIG. 9 shows the plurality of active fins AF1 through AF6 and the plurality of dummy fins DF1 through DF4 that are included in the cell CELLb for convenience of description.

A size of the cell CELLb in a second direction (for example, a Y direction), i.e. a height Hb, may correspond to the number and pitch of metal lines (not shown) disposed above the cell CELLb. As described above, if the height Hb of the cell CELLb corresponds to the number and pitch of the metal lines disposed above the cell CELLb, a number Nb and pitch Pb of the plurality of active fins AF1 through AF6 and the plurality of dummy fins DF1 through DF4 that are included in the cell CELLb are adaptively determined based on the height Hb of the cell CELLb.

For example, if a number and pitch of the metal lines disposed above the cell CELLb are 9 and 45, respectively, the height Hb of the cell CELLb is determined as 9*45=405. In this regard, if a minimum value of the pitch Pb of the plurality of active fins AF1 through AF6 and the plurality of dummy fins DF1 through DF4 that are included in the cell CELLb is 40.5, the number Nb of the plurality of active fins AF1 through AF6 and the plurality of dummy fins DF1 through DF4 that are included in the cell CELLb may be determined as 10 (i.e., 40.5*10≤405). Also, the pitch Pb of the plurality of active fins AF1 through AF6 and the plurality of dummy fins DF1 through DF4 that are included in the cell CELLb may be determined as 45 (i.e., Pb=405/10).

Figure 10:
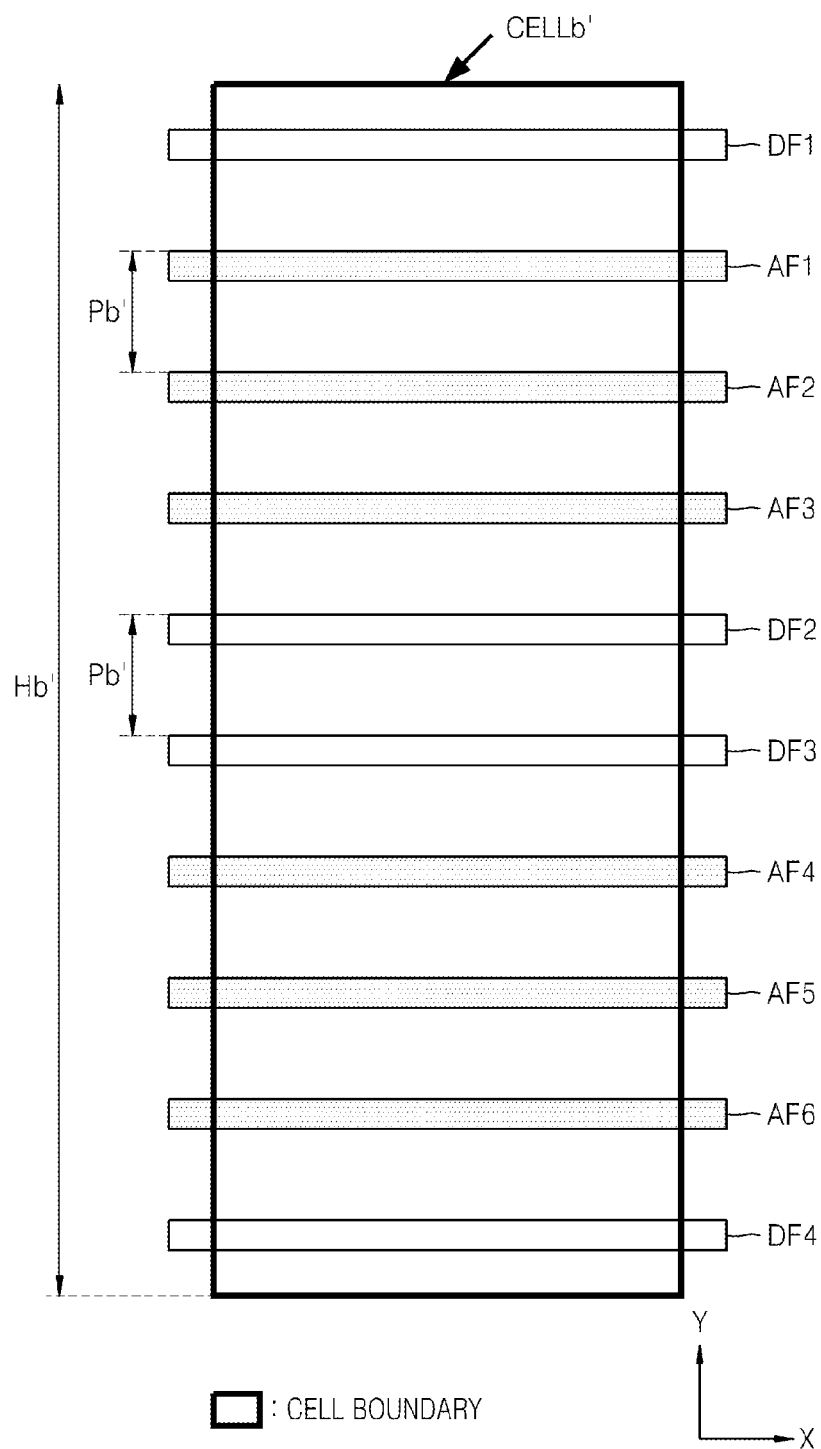
FIG. 10 is a layout of a semiconductor IC on which 9 metal lines are disposed, according to some example embodiments of the inventive concepts.

FIG. 10 is a layout of a semiconductor IC 200B on which 9 metal lines are disposed, according to some example embodiments of the inventive concepts.

Referring to FIG. 10, the semiconductor IC 200B may include at least one cell CELLb' limited by a cell boundary indicated in a bold solid line. FIG. 10 shows the plurality of active fins AF1 through AF6 and the plurality of dummy fins DF1 through DF4 that are included in the cell CELLb' for convenience of description.

In some example embodiments, a size of the cell CELLb' in a second direction (for example, a Y direction), i.e. a height Hb', may correspond to the number Nb and pitch Pb' of the plurality of active fins AF1 through AF6 and the plurality of dummy fins DF1 through DF4 that are included in the cell CELLb'. In this regard, the pitch Pb' of the plurality of active fins AF1 through AF6 and the plurality of dummy fins DF1 through DF4 may have a constant value irrespective of the number Nb of the plurality of active fins AF1 through AF6 and the plurality of dummy fins DF1 through DF4 that are included in the cell CELLb'.

For example, if a number of the metal lines disposed above the cell CELLb' is 9, as shown in FIG. 9, the number Nb of the plurality of active fins AF1 through AF6 and the plurality of dummy fins DF1 through DF4 may be determined as 10. In this regard, if the pitch Pb' of the plurality of active fins AF1 through AF6 and the plurality of dummy fins DF1 through DF4 is 40.5, the height Hb' of the cell CELLb' is determined as 10*Pb' (i.e., 10*40.5=405).

As described above, according to some example embodiments, the height Hb' of the cell CELLb' may correspond to the number Nb and pitch Pb' of the plurality of active fins AF1 through AF6 and the plurality of dummy fins DF1 through DF4 that are included in the cell CELLb' other than the number and pitch of the metal lines disposed above the cell CELLb'.

Figure 11:
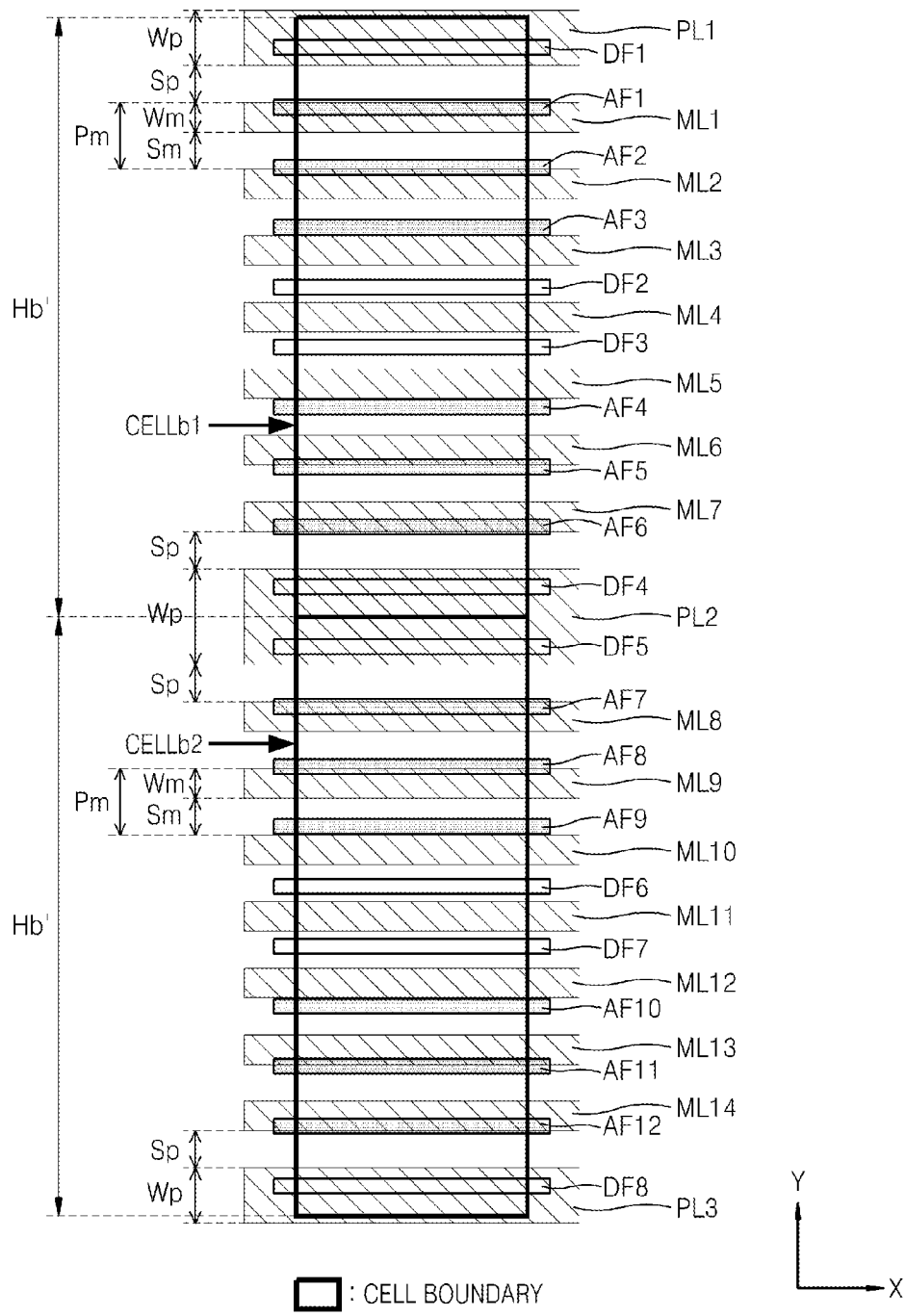
FIG. 11 is a layout of a semiconductor IC including two adjacent cells including a cell of FIG. 10, according to some example embodiments of the inventive concepts.

FIG. 11 is a layout of a semiconductor IC 200C including two adjacent cells including a cell of FIG. 10, according to some example embodiments of the inventive concepts.

Referring to FIG. 11, the semiconductor IC 200C may include first and second adjacent cells CELLb1 and CELLb2 limited by a cell boundary indicated in a bold solid line. In this regard, the first cell CELLb1 or the second cell CELLb2 may correspond to the cell CELLb' of FIG. 10.

The first cell CELLb1 may include the first through sixth active fins AF1 through AF6 and the first through fourth dummy fins DF1 through DF4. A plurality of metal lines (for example, 9) may be disposed above the first cell CELLb1. In this regard, the plurality of metal lines may extend in a first direction (for example, an X direction) and arranged in parallel to each other in a second direction (for example, a Y direction). The plurality of metal lines may also include the first and second power lines PL1 and PL2 disposed at both ends of the first cell CELLb1 in the second direction and the first through seventh wires ML1 through ML7 arranged between the first and second power lines PL1 and PL2.

In the width Wm of each of the first through seventh wires ML1 through ML7 and the space Sm between two adjacent wires among the first through seventh wires ML1 through ML7, the pitch Pm of the first through seventh wires ML1 through ML7 is Wm+Sm. In some example embodiments, the width Wm of each of the first through seventh wires ML1 through ML7, the space Sm between two adjacent wires among the first through seventh wires ML1 through ML7, and the pitch Pm of the first through seventh wires ML1 through ML7 may have constant values irrespective of the number of wires included in the first cell CELLb1 or the number of the metal lines.

The first power line PL1 is disposed over a boundary of the first cell CELLb1 and another cell (not shown) disposed to be adjacent to an upper portion of the first cell CELLb1. The second power line PL2 is disposed over a boundary of the first and second cells CELLb1 and CELLb2. In this regard, the width Wp of each of the first and second power lines PL1 and PL2 may be greater than the width Wm of each of the first through seventh wires ML1 through ML7.

In some example embodiments, the width Wp of each of the first and second power lines PL1 and PL2 may have a variable value according to a size of the first cell CELLb1 in the second direction, i.e. the height Hb'. More specifically, the width Wp of each of the first and second power lines PL1 and PL2 may be determined according to the height Hb' of the first cell CELLb1 excluding a size corresponding to a multiplication of the number and the pitch Pm of the first through seventh wires ML1 through ML7.

Meanwhile, the space Sp between the first power line PL1 and the first wire ML1 may be substantially the same as the space Sm between two adjacent wires among the first through seventh wires ML1 through ML7. The space Sp between the second power line PL2 and the seventh wire ML7 may also be substantially the same as the space Sm between two adjacent wires among the first through seventh wires ML1 through ML7.

The second cell CELLb2 may include the seventh through twelfth active fins AF7 through AF12 and the fifth through eighth dummy fins DF5 through DF8. A plurality of metal lines (for example, 9) may be disposed above the second cell CELLb2. In this regard, the plurality of metal lines may extend in the first direction (for example, the X direction)

and arranged in parallel to each other in the second direction (for example, the Y direction). The plurality of metal lines may also include the power line PL2 and the third power line PL3 disposed at both ends of the second cell CELLb2 in the second direction and the eighth through fourteenth wires ML8 through ML14 arranged between the second and third power lines PL2 and PL3.

In the width Wm of each of the eighth through fourteenth wires ML8 through ML14 and the space Sm between two adjacent wires among the eighth through fourteenth wires ML8 through ML14, the pitch Pm of the eighth through fourteenth wires ML8 through ML14 is Wm+Sm. In some example embodiments, the width Wm of each of the eighth through fourteenth wires ML8 through ML14, the space Sm between two adjacent wires among the eighth through fourteenth wires ML8 through ML14, and the pitch Pm of the eighth through fourteenth wires ML8 through ML14 may have constant values irrespective of the number of wires included in the second cell CELLb2 or the number of the metal lines.

The second power line PL2 is disposed over the boundary of the first and second cells CELLb1 and CELLb2. The third power line PL3 is disposed over a boundary of the second cell CELLb2 and another cell (not shown) disposed to be adjacent to a lower portion of the second cell CELLb2. In this regard, the width Wp of each of the second and third power lines PL2 and PL3 may be greater than the width Wm of each of the eighth through fourteenth wires ML8 through ML14.

In some example embodiments, the width Wp of each of the second and third power lines PL2 and PL3 may have a variable value according to a size of the second cell CELLb2 in the second direction, i.e. the height Hb'. More specifically, the width Wp of each of the second and third power lines PL2 and PL3 may be determined according to the height Hb' of the second cell CELLb2 excluding a size corresponding to a multiplication of the number and the pitch Pm of the eighth through fourteenth wires ML8 through ML14.

Meanwhile, the space Sp between the second power line PL2 and the eighth wire ML8 may be substantially the same as the space Sm between two adjacent wires among the eighth through fourteenth wires ML8 through ML14. The space Sp between the third power line PL3 and the fourteenth wire ML14 may also be substantially the same as the space Sm between two adjacent wires among the eighth through fourteenth wires ML8 through ML14.

As described above, according to some example embodiments, the height Hb' of each of the first and second cells CELLb1 and CELLb2 may correspond to the number Nb and the pitch Pb' of a plurality of active fins and a plurality of dummy fins, and the pitch Pb' may have a constant value irrespective of the number N of the plurality of active fins and the plurality of dummy fins. The pitch Pm of wires disposed above each of the first and second cells CELLb1 and CELLb2 may have a constant value irrespective of the number of the wires, and the width Wp of power lines may be adaptively determined according to the height Hb' of each of the first and second cells CELLb1 and CELLb2.

Figure 12:
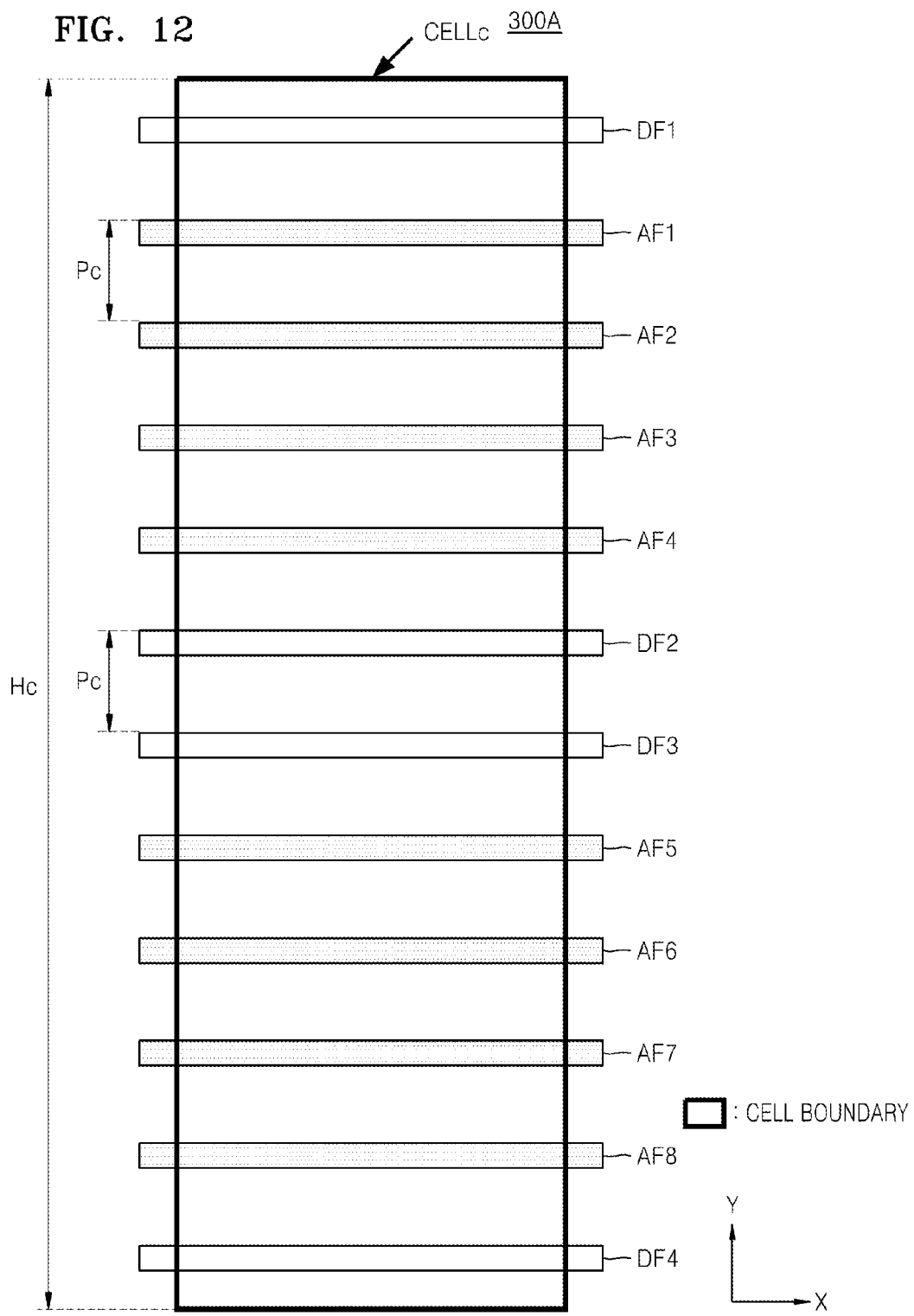
FIG. 12 is a layout of a semiconductor IC on which 11 metal lines are disposed, according to a comparison example.

FIG. 12 is a layout of a semiconductor IC 300A on which 11 metal lines are disposed, according to a comparison example.

Referring to FIG. 12, the semiconductor IC 300A may include at least one cell CELLc limited by a cell boundary indicated in a bold solid line. FIG. 12 shows the plurality of active fins AF1 through AF8 and the plurality of dummy fins DF1 through DF4 that are included in the cell CELLc for convenience of description.

A size of the cell CELLc in a second direction (for example, a Y direction), i.e. a height Hc, may correspond to the number and pitch of metal lines (not shown) disposed above the cell CELLc. As described above, if the height Hc of the cell CELLc corresponds to the number and pitch of the metal lines disposed above the cell CELLc, a number Nc and pitch Pc of the plurality of active fins AF1 through AF8 and the plurality of dummy fins DF1 through DF4 that are included in the cell CELLc are adaptively determined based on the height Hc of the cell CELLc.

For example, if a number and pitch of the metal lines disposed above the cell CELLc are 11 and 45, respectively, the height Hc' of the cell CELLc is determined as 11*45=495. In this regard, if a minimum value of the pitch Pc of the plurality of active fins AF1 through AF8 and the plurality of dummy fins DF1 through DF4 that are included in the cell CELLb is 40.5, the number Nc of the plurality of active fins AF1 through AF8 and the plurality of dummy fins DF1 through DF4 that are included in the cell CELLc may be determined as 12 (i.e., 40.5*12≤495). Also, the pitch Pc of the plurality of active fins AF1 through AF8 and the plurality of dummy fins DF1 through DF4 that are included in the cell CELLc may be determined as 41.25 (i.e., Pc=495/12).

Figure 13:
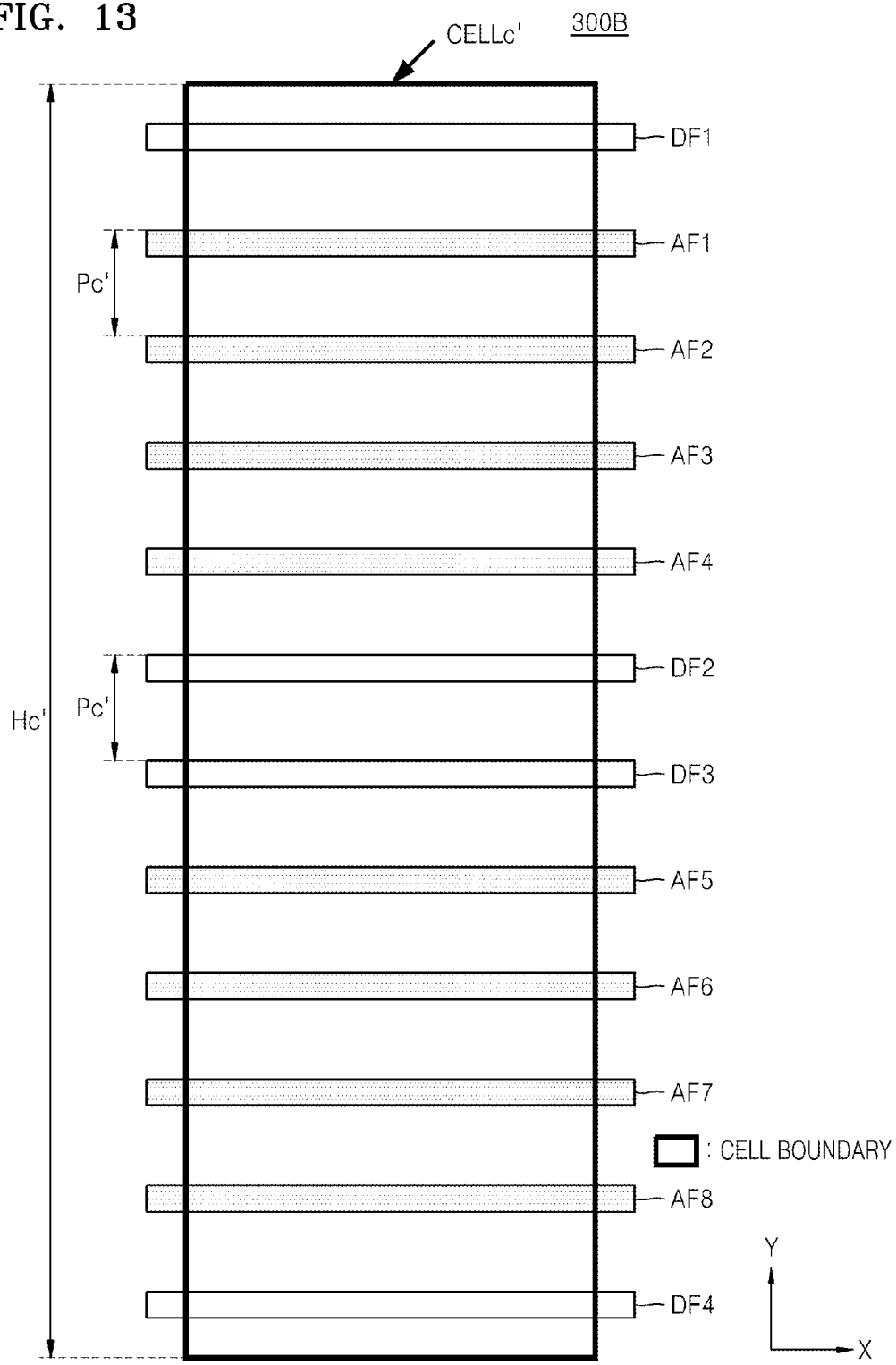
FIG. 13 is a layout of a semiconductor IC on which 11 metal lines are disposed, according to some example embodiments of the inventive concepts.

FIG. 13 is a layout of a semiconductor IC 300B on which 11 metal lines are disposed, according to some example embodiments of the inventive concepts.

Referring to FIG. 13, the semiconductor IC 300B may include at least one cell CELLc' limited by a cell boundary indicated in a bold solid line. FIG. 13 shows the plurality of active fins AF1 through AF8 and the plurality of dummy fins DF1 through DF4 that are included in the cell CELLc' for convenience of description.

In some example embodiments, a size of the cell CELLc' in a second direction (for example, a Y direction), i.e. a height Hc', may correspond to the number Nc and pitch Pc' of the plurality of active fins AF1 through AF8 and the plurality of dummy fins DF1 through DF4 that are included in the cell CELLc'. In this regard, the pitch Pc' of the plurality of active fins AF1 through AF8 and the plurality of dummy fins DF1 through DF4 may have a constant value irrespective of the number Nc of the plurality of active fins AF1 through AF8 and the plurality of dummy fins DF1 through DF4 that are included in the cell CELLc'.

For example, if a number of the metal lines disposed above the cell CELLc' is 11, as shown in FIG. 13, the number Nc of the plurality of active fins AF1 through AF8 and the plurality of dummy fins DF1 through DF4 may be determined as 12. In this regard, if the pitch Pc' of the plurality of active fins AF1 through AF8 and the plurality of dummy fins DF1 through DF4 is 40.5, the height Hc' of the cell CELLc' is determined as 12*Pc' (i.e., 12*40.5=486).

As described above, according to some example embodiments, the height Hc' of the cell CELLc' may correspond to the number Nc and pitch Pc' of the plurality of active fins AF1 through AF8 and the plurality of dummy fins DF1 through DF4 that are included in the cell CELLc' other than the number and pitch of the metal lines disposed above the cell CELLc'. Therefore, the height Hc' of the cell CELLc' may be lower compared to the comparison example of FIG. 12 in which the number of metal lines disposed above the cell CELLc is the same as that of metal lines disposed above the cell CELLc', thereby further enhancing the integration of the semiconductor IC 300B.

Figure 14:
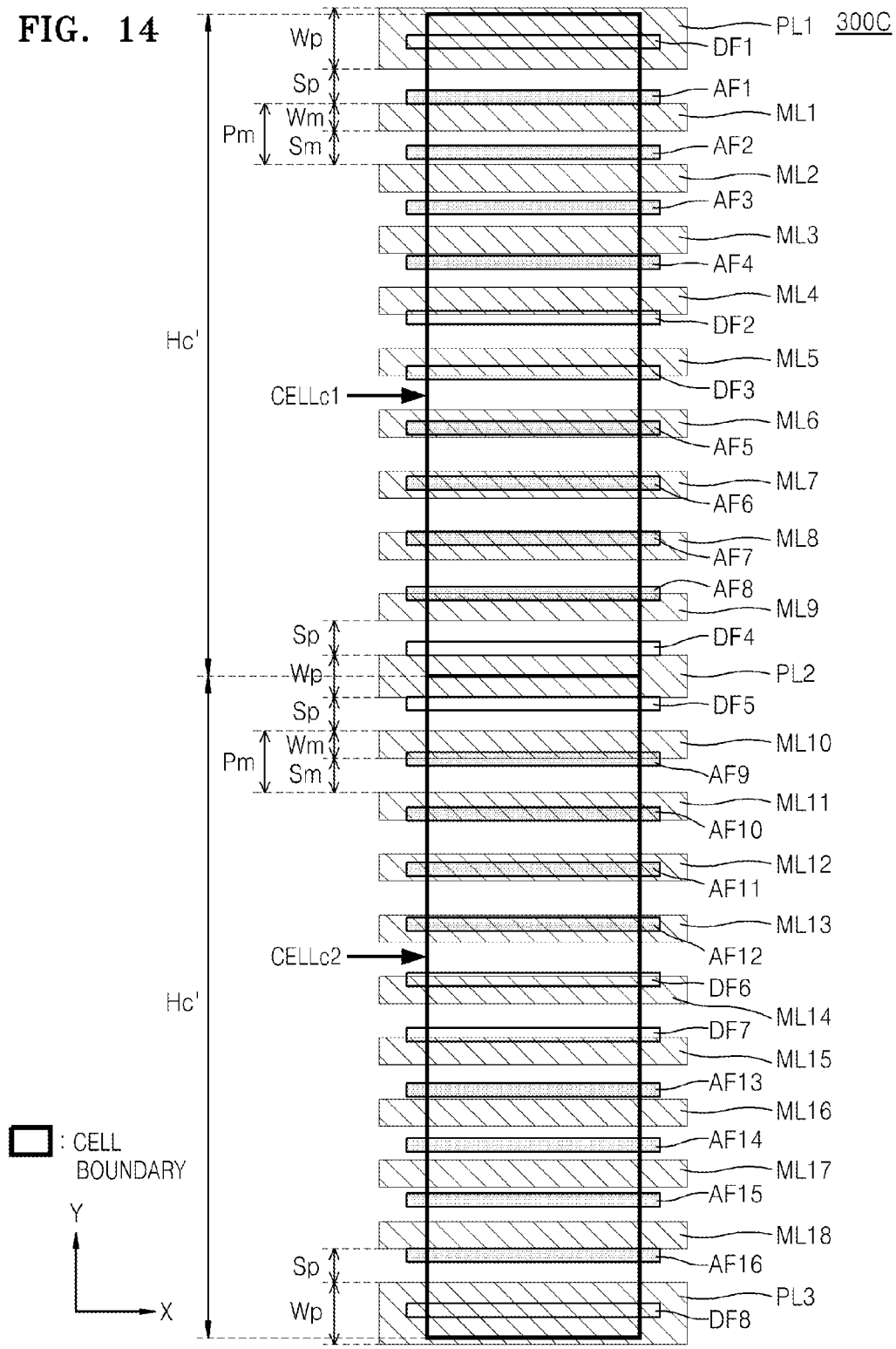
FIG. 14 is a layout of a semiconductor IC including two adjacent cells including a cell of FIG. 13, according to some example embodiments of the inventive concepts.

FIG. 14 is a layout of a semiconductor IC 300C including two adjacent cells including a cell of FIG. 13, according to some example embodiments of the inventive concepts.

Referring to FIG. 14, the semiconductor IC 300C may include first and second adjacent cells CELLc1 and CELLc2 limited by a cell boundary indicated in a bold solid line. In this regard, the first cell CELLc1 or the second cell CELLc2 may correspond to the cell CELLc' of FIG. 13.

The first cell CELLc1 may include the first through eighth active fins AF1 through AF8 and the first through fourth dummy fins DF1 through DF4. A plurality of metal lines (for example, 11) may be disposed above the first cell CELLc1. In this regard, the plurality of metal lines may extend in a first direction (for example, an X direction) and arranged in parallel to each other in a second direction (for example, a Y direction). The plurality of metal lines may also include the first and second power lines PL1 and PL2 disposed at both ends of the first cell CELLc1 in the second direction and the first through ninth wires ML1 through ML9 arranged between the first and second power lines PL1 and PL2.

In the width Wm of each of the first through ninth wires ML1 through ML9 and the space Sm between two adjacent wires among the first through ninth wires ML1 through ML9, the pitch Pm of the first through ninth wires ML1 through ML9 is Wm+Sm. In some example embodiments, the width Wm of each of the first through ninth wires ML1 through ML9, the space Sm between two adjacent wires among the first through ninth wires ML1 through ML9, and the pitch Pm of the first through ninth wires ML1 through ML9 may have constant values irrespective of the number of wires included in the first cell CELLc1 or the number of the metal lines.

The first power line PL1 is disposed over a boundary of the first cell CELLc1 and another cell (not shown) disposed to be adjacent to an upper portion of the first cell CELLc1. The second power line PL2 is disposed over a boundary of the first and second cells CELLc1 and CELLc2. In this regard, the width Wp of each of the first and second power lines PL1 and PL2 may be greater than the width Wm of each of the first through ninth wires ML1 through ML9.

In some example embodiments, the width Wp of each of the first and second power lines PL1 and PL2 may have a variable value according to a size of the first cell CELLc 1 in the second direction, i.e. the height Hc'. More specifically, the width Wp of each of the first and second power lines PL1 and PL2 may be determined according to the height Hc' of the first cell CELLc1 excluding a size corresponding to a multiplication of the number and the pitch Pm of the first through ninth wires ML1 through ML9.

Meanwhile, the space Sp between the first power line PL1 and the first wire ML1 may be substantially the same as the space Sm between two adjacent wires among the first through ninth wires ML1 through ML9. The space Sp between the second power line PL2 and the ninth wire ML9 may also be substantially the same as the space Sm between two adjacent wires among the first through ninth wires ML1 through ML9.

The second cell CELLc2 may include the ninth through sixteenth active fins AF9 through AF16 and the fifth through eighth dummy fins DF5 through DF8. A plurality of metal lines (for example, 11) may be disposed above the second cell CELLc2. In this regard, the plurality of metal lines may extend in the first direction (for example, the X direction) and arranged in parallel to each other in the second direction (for example, the Y direction). The plurality of metal lines may also include the power line PL2 and the third power line PL3 disposed at both ends of the second cell CELLc2 in the second direction and the tenth through eighteenth wires ML10 through ML18 arranged between the second and third power lines PL2 and PL3.

In the width Wm of each of the tenth through eighteenth wires ML10 through ML18 and the space Sm between two adjacent wires among the tenth through eighteenth wires ML10 through ML18, the pitch Pm of the tenth through eighteenth wires ML10 through ML18 is Wm+Sm. In some example embodiments, the width Wm of each of the tenth through eighteenth wires ML10 through ML18, the space Sm between two adjacent wires among the tenth through eighteenth wires ML10 through ML18, and the pitch Pm of the tenth through eighteenth wires ML10 through ML18 may have constant values irrespective of the number of wires included in the second cell CELLc2 or the number of the metal lines.

The second power line PL2 is disposed over the boundary of the first and second cells CELLc1 and CELLc2. The third power line PL3 is disposed over a boundary of the second cell CELLc2 and another cell (not shown) disposed to be adjacent to a lower portion of the second cell CELLc2. In this regard, the width Wp of each of the second and third power lines PL2 and PL3 may be greater than the width Wm of each of the tenth through eighteenth wires ML10 through ML18.

In some example embodiments, the width Wp of each of the second and third power lines PL2 and PL3 may have a variable value according to a size of the second cell CELLc2 in the second direction, i.e. the height Hc'. More specifically, the width Wp of each of the second and third power lines PL2 and PL3 may be determined according to the height Hc' of the second cell CELLc2 excluding a size corresponding to a multiplication of the number and the pitch Pm of the tenth through eighteenth wires ML10 through ML18.

Meanwhile, the space Sp between the second power line PL2 and the tenth wire ML10 may be substantially the same as the space Sm between two adjacent wires among the tenth through eighteenth wires ML10 through ML18. The space Sp between the third power line PL3 and the eighteenth wire ML18 may also be substantially the same as the space Sm between two adjacent wires among the tenth through eighteenth wires ML10 through ML18.

As described above, according to some example embodiments, the height Hc' of each of the first and second cells CELLc1 and CELLc2 may correspond to the number Nc and the pitch Pc' of a plurality of active fins and a plurality of dummy fins, and the pitch Pc' may have a constant value irrespective of the number N of the plurality of active fins and the plurality of dummy fins. The pitch Pm of wires disposed above each of the first and second cells CELLc1 and CELLc2 may have a constant value irrespective of the number of the wires, and the width Wp of power lines may be adaptively determined according to the height Hc' of each of the first and second cells CELLc1 and CELLc2.

Figure 15:
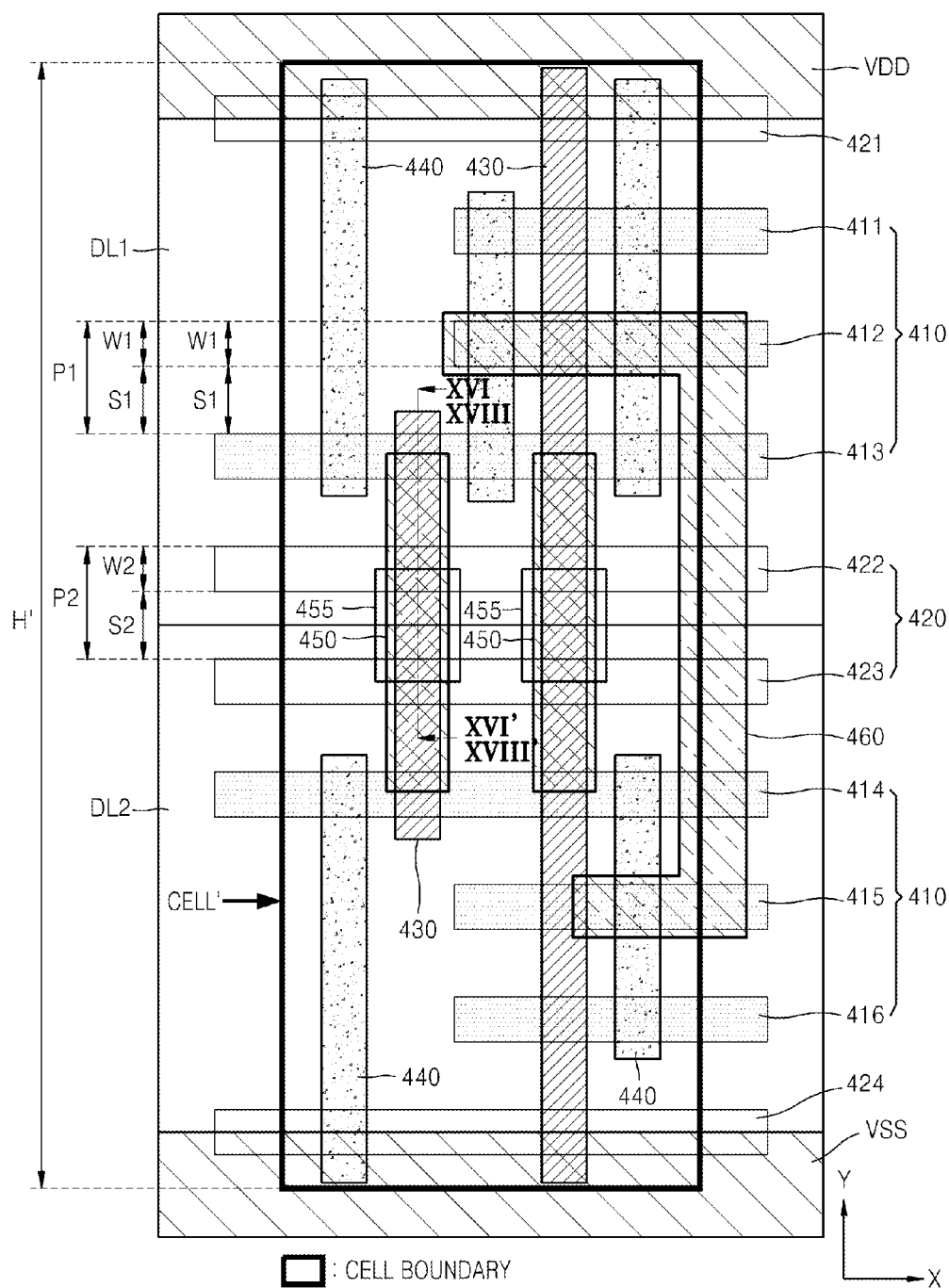
FIG. 15 is a layout of a semiconductor IC according to some example embodiments of the inventive concepts.

FIG. 15 is a layout of a semiconductor IC 400 according to some example embodiments of the inventive concepts.

Referring to FIG. 15, the semiconductor IC 400 may include at least one cell CELL' limited by a cell boundary indicated in a bold solid line. The cell CELL' may include a plurality of fins including a plurality of active fins 410 and a plurality of dummy fins 420, a plurality of gate electrodes 430, a plurality of source and drain contacts 440, two input terminals 450, two input contacts 455, an output terminal 460, and the two power lines VDD and VSS. Although not shown, a plurality of conductive lines, for example, metal lines, may be further disposed above the cell CELL'.

The plurality of active fins 410 may include first through sixth active fins 411 through 416. However, the number of the plurality of active fins 410 included in the at least one cell CELL' is not limited to 6, and may be modified in various ways. In some example embodiments of the inventive concepts, the number of the plurality of active fins 410 included in the at least one cell CELL' may be greater than 6. In some example embodiments of the inventive concepts, the number of the plurality of active fins 410 included in the at least one cell CELL' may be smaller than 6.

In some example embodiments, the single active fin 410 or the plurality of active fins 410 may a single fin FET. In this regard, the first through sixth active fins 411 through 416 may have different sizes in a first direction (for example, an X direction). More specifically, sizes of the first, second, fifth, and sixth active fins 411, 412, 415, and 416 in the first direction may be smaller than those of the third and fourth active fins 413 and 414 in the first direction. Thus, the first through third active fins 411 through 413 may configure a single FET, and the third active fin 413 may also configure a single FET. Likewise, the fourth through sixth active fins 414 through 416 may configure a single FET, and the fourth active fin 414 may also configure a single FET.

The plurality of dummy fins 420 may include first through fourth dummy fins 421 through 424. However, the number of the plurality of dummy fins 420 included in the at least one cell CELL' is not limited to 4, and may be modified in various ways. In some example embodiments of the inventive concepts, the number of the plurality of dummy fins 420 included in the at least one cell CELL' may be greater than 4. In some example embodiments of the inventive concepts, the number of the plurality of dummy fins 420 included in the at least one cell CELL' may be smaller than 4.

The first through third active fins 411 through 413 and the first and second dummy fins 421 and 422 may be disposed in the first limit layer DL1. The fourth through sixth active fins 414 through 416 and the third and fourth dummy fins 423 and 424 may be disposed in the second limit layer DL2. In some example embodiments, the first limit layer DL1 may be a p+ impurity doped PMOS limit layer, and the second limit layer DL2 may be an n+ impurity doped NMOS limit layer. The first through third active fins 411 through 413 disposed in the first limit layer DL1 may constitute a PMOS fin FET. The fourth through sixth active fins 414 through 416 disposed in the second limit layer DL2 may be an NMOS fin FET.

In some example embodiments, the first through sixth active fins 411 through 416 and the first through fourth dummy fins 421 through 424 may extend in the first direction (for example, the X direction) and may be arranged in a second direction (for example, a Y direction) in parallel to each other. In this regard, the second direction may be substantially perpendicular to the first direction.

In the width W1 of each of the first through sixth active fins 411 through 416, the space S1 between two adjacent active fins among the first through sixth active fins 411 through 416, and the pitch P1 of the first through sixth active fins 411 through 416, P1=W1+S1. In some example embodiments, the width W1, the space S1, and the pitch P1 may have constant values irrespective of the number of the active fins 410 included in the cell CELL' or the number of the active fins 410 and the dummy fins 420.

In the width W2 of each of the first through fourth dummy fins 421 through 424, the space S2 between two adjacent active fins among the first through fourth dummy fins 421 through 424, and the pitch P2 of the first through fourth dummy fins 421 through 424, P2=W2+S2. In some example embodiments, the width W2, the space S2, and the pitch P2 may have constant values irrespective of the number of the 0dummy fins 420 included in the cell CELL' or the number of the active fins 410 and the dummy fins 420.

In some example embodiments, the width W1 of each of the first through sixth active fins 411 through 416 may be substantially the same as the width W2 of each of the first through fourth dummy fins 421 through 424. Also, the space S1 between two adjacent active fins among the first through sixth active fins 411 through 416 may be substantially the same as the space S2 between two adjacent dummy fins among the first through fourth dummy fins 421 through 424. Therefore, the pitch P1 of the first through sixth active fins 411 through 416 may be substantially the same as the pitch P2 of the first through fourth dummy fins 421 through 424. Thus, both the pitch P1 of the first through sixth active fins 411 through 416 and the pitch P2 of the first through fourth dummy fins 421 through 424 is referred to as P below.

A size of the cell CELL' in the second direction (for example, the Y direction) is denoted by H'. If the number of the plurality of active fins 410 and dummy fins 420 included in the cell CELL' is N, the height H' of the cell CELL' may correspond to the number N and the pitch P of the plurality of active fins 410 and dummy fins 420. More specifically, the height H' of the cell CELL' may be expressed as a multiplication of the number N and the pitch P of the plurality of active fins 410 and dummy fins 420 (i.e. H'=N*P).

In some example embodiments, the number of the active fins 410 is 6, and the number of the dummy fins 420 is 4, and thus the number N of the plurality of active fins 410 and dummy fins 420 is 10. In this regard, the height H' of the cell CELL' may be expressed as 10*P that is the multiplication of the number N (i.e. 10) and the pitch P of the plurality of active fins 410 and dummy fins 420 (i.e. H=10*P).

As described above, according to some example embodiments, the pitch P of the plurality of active fins 410 and dummy fins 420 has a constant value irrespective of the number N of the plurality of active fins 410 and dummy fins 420 included in the cell CELL', and the height H' of the cell CELL' corresponds to the number N and the pitch P of the plurality of active fins 410 and dummy fins 420. Therefore, the pitch P of the plurality of active fins 410 and dummy fins 420 may be constantly applied to cells having different libraries, thereby facilitating a design of the semiconductor IC 400. Furthermore, the plurality of active fins 410 and dummy fins 420 having the constant pitch P may be manufactured for the cells having different libraries, thereby simplifying a process of the semiconductor IC 400.

Further, according to some example embodiments, the height H' of the cell CELL' may correspond to the number N and the pitch P of the plurality of active fins 410 and dummy fins 420 included in the cell CELL'. In this regard, the determined height H' of the cell CELL' is relatively lower than the height H' of the cell CELL' corresponding to the number and pitch of the metal lines disposed above the cell CELL'. As described above, integration of the semiconductor IC 400 may be further enhanced by reducing the height H' of the cell CELL'.

Figure 16:
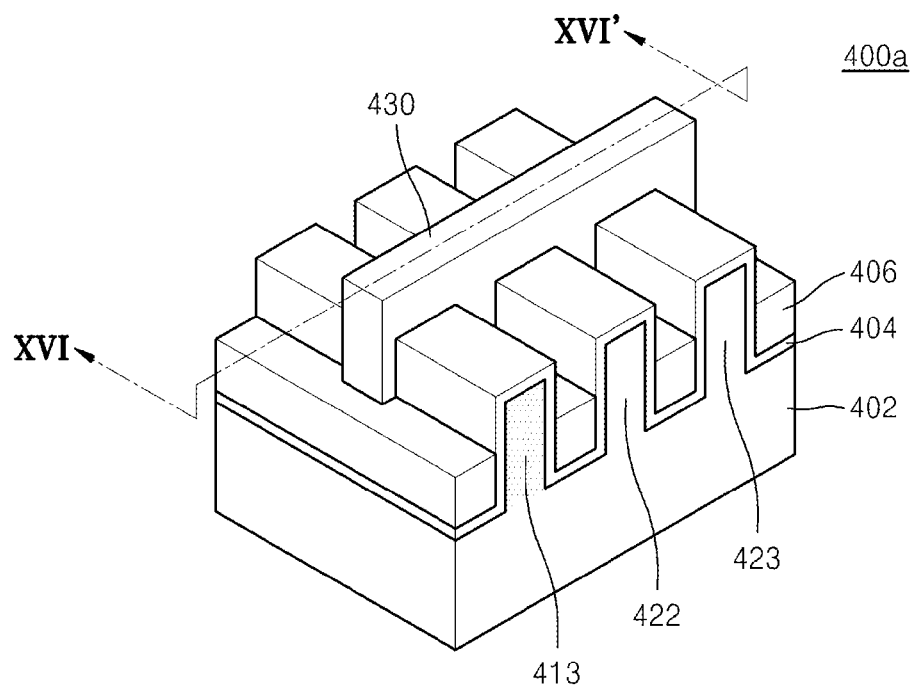
FIG. 16 is a perspective view of a semiconductor device with the layout of FIG. 15, according to some example embodiments of the inventive concepts.

FIG. 16 is a perspective view of a semiconductor device 400a with the layout of FIG. 15, according to some example embodiments of the inventive concepts.

Figure 17:
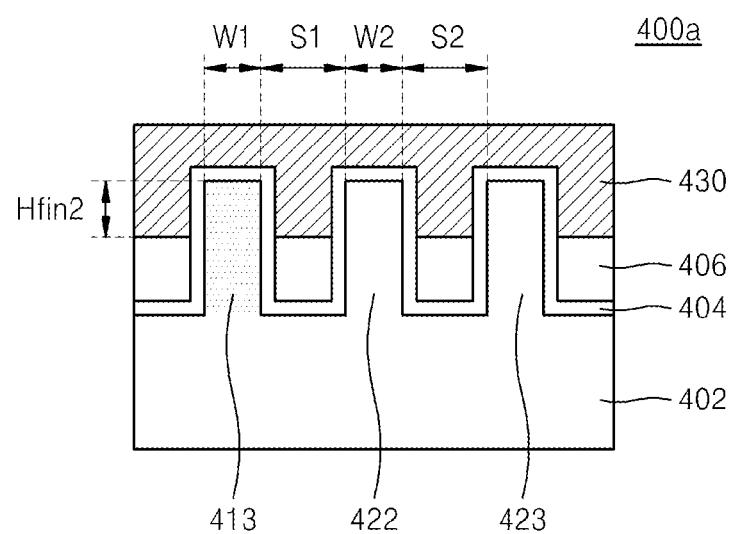
FIG. 17 is a cross-sectional view taken along line XVI-XVI' of FIG. 16.

FIG. 17 is a cross-sectional view taken along line XVI-XVI' of FIG. 16.

Referring to FIGS. 16 and 17, the semiconductor device 400a may be a bulk type fin FET. The semiconductor device 400a may include a substrate 402, a first insulating layer 404, a second insulating layer 406, a third active fin 413, a plurality of dummy fins 422 and 423, and a gate electrode 430. The semiconductor device 400a according to some example embodiments may configure a single fin FET of the single third active fin 413.

The substrate 402 may be a semiconductor substrate. For example, the substrate 402 may include one of silicon, silicon-on-insulator (SOI), silicon-on-sapphire (SOS), germanium, silicon-germanium, and gallium-arsenide.

The third active fin 413 and the plurality of dummy fins 422 and 423 may be arranged to be connected to the substrate 402. In some example embodiments, a protruding portion of the third active fin 413 that is perpendicular with respect to the substrate 402 may be an n+ or p+ doped active region, and protruding portions of the plurality of dummy fins 422 and 423 that are perpendicular with respect to the substrate 402 may be undoped regions. In some example embodiments, the third active fin 413 and the plurality of dummy fins 422 and 423 may all be n+ or p+ doped active regions.

The third active fin 413 may have the width W1 and a height Hfin2, and thus, may have a channel width (or an effective channel width) of (2*Hfin2+W1). The height Hfin2 indicates a height from an upper surface of the second insulating layer 406 to an upper surface of the third active fin 413. In some example embodiments, the third active fin 413 may constitute one fin FET, and thus the fin FET may have a channel width (or an effective channel width) of (2*Hfin2+W1).

The first and second insulating layers 404 and 406 may include an insulating material, for example, which may include one of an oxide layer, a nitride layer, and an oxynitride layer. The first insulating layer 404 may be disposed above the third active fin 413 and the plurality of dummy fins 422 and 423. The first insulating layer 404 may be disposed between the third active fin 413 and the gate electrode 430, and thus, may serve as a gate insulating layer. The second insulating layer 406 may be disposed in a space between the third active fin 413 and the plurality of dummy fins 422 and 423 to have a desired height (that may or may not be predetermined). The second insulating layer 406 may be disposed among the third active fin 413 and the plurality of dummy fins 422 and 423, and thus, may be used as a device isolation layer.

The gate electrode 430 may be arranged on the third active fin 413 and the corresponding first insulating layer 404 to have a structure surrounding the third active fin 413 and the corresponding first insulating layer 404, i.e., a structure including the third active fin 413 in the gate electrode 430. The gate electrode 430 may include at least one of a metallic material such as tungsten (W) and tantalum (Ta), a nitride thereof, a silicide thereof, and a doped polysilicon, and may be formed using a deposition process.

Figure 18:
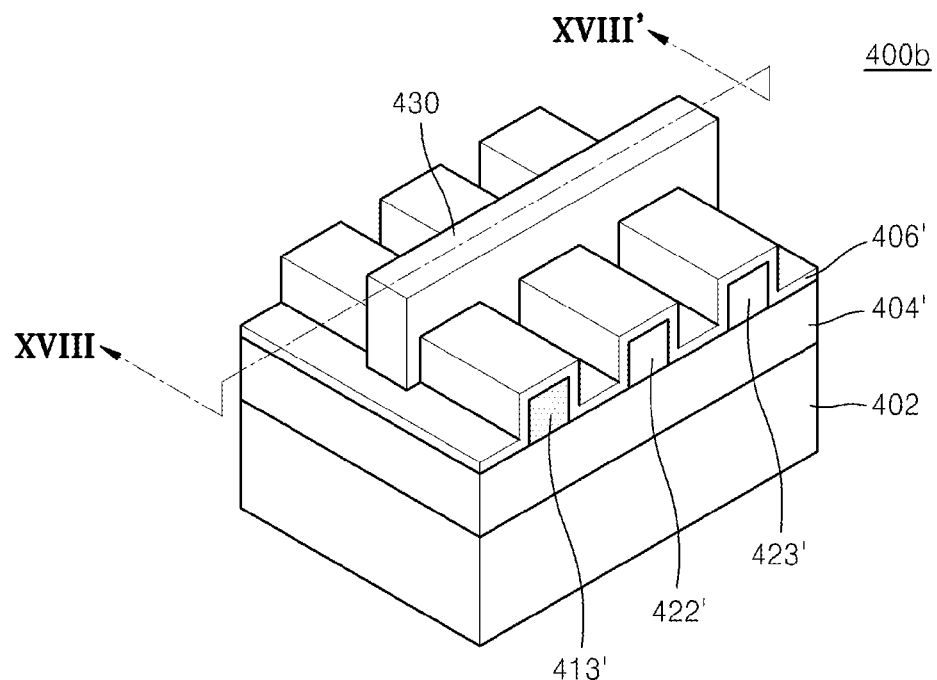
FIG. 18 is a perspective view of a semiconductor device with the layout of FIG. 15, according to some example embodiments of the inventive concepts.

FIG. 18 is a perspective view of a semiconductor device 400b with the layout of FIG. 15, according to some example embodiments of the inventive concepts.

Figure 19:
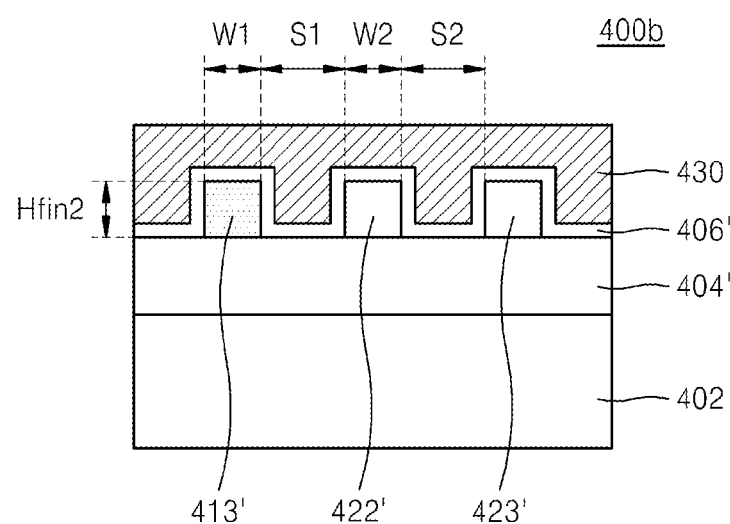
FIG. 19 is a cross-sectional view taken along line XVIII-XVIII' of FIG. 18.

FIG. 19 is a cross-sectional view taken along line XVIII-XVIII' of FIG. 18.

Referring to FIGS. 18 and 19, the semiconductor device 400b may be an SOI type fin FET. The semiconductor device 400b may include the substrate 402, a first insulating layer 404', a second insulating layer 406', a third active fin 413', a plurality of dummy fins 422' and 423', and the gate electrode 430. The semiconductor device 400b according to some example embodiments is a modification of the semiconductor device 400a of FIGS. 16 and 17, and thus differences therebetween will now be described, and redundant descriptions will be omitted here.

The second insulating layer 406' may be disposed between the third active fin 413' and the gate electrode 430, and thus, may serve as a gate insulating layer.

The third active fin 413' and the plurality of dummy fins 422' and 423' may be formed of a semiconductor material, for example, silicon or doped silicon. The third active fin 413' may have the width W1 and the height Hfin2, and thus a channel width of the third active pin 413' may be (2*Hfin2+W1). In this regard, the height Hfin2 indicates a height from an upper surface of the first insulating layer 404' to an upper surface of the third active fin 413'.

The gate electrode 430 may be arranged on the third active fin 413' and the corresponding second insulating layer 406' to have a structure surrounding the third active fin 413' and the corresponding second insulating layer 406', i.e., a structure including the third active fin 413' in the gate electrode 430.

Figure 20:
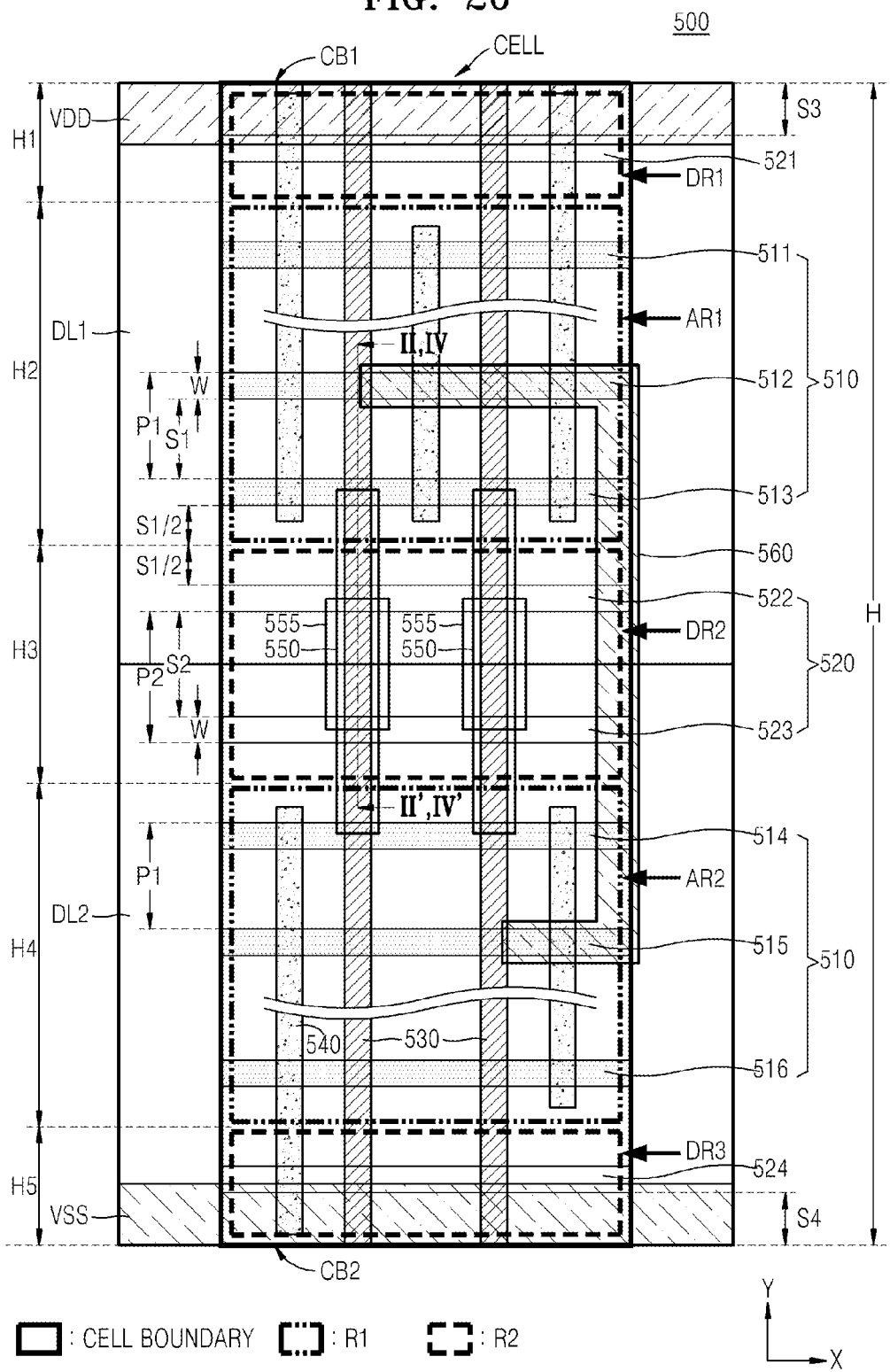
FIG. 20 is a layout of a semiconductor IC according to some example embodiments of the inventive concepts.

FIG. 20 is a layout of a semiconductor IC 500 according to some example embodiment of the inventive concepts.

Referring to FIG. 20, the semiconductor IC 500 may include the at least one cell CELL limited by a cell boundary indicated in a bold solid line. The cell CELL may include a plurality of active fins 510, a plurality of dummy fins 520, a plurality of gate electrodes 530, a plurality of source and drain contacts 540, two input terminals 550, two input contacts 555, an output terminal 560, and the two power lines VDD and VSS.

In some example embodiments, the cell CELL may be a standard cell. Such a standard cell based layout design method may reduce a time taken to design a layout by previously designing a device such as an OR gate or an AND gate that is repeatedly used as the standard cell, storing the standard cell in a computer system, and placing and wiring the standard cell at a necessary location during the layout design.

The plurality of active fins 510 may include first through sixth active fins 511 through 516. The plurality of dummy fins 520 may include first through fourth dummy fins 521 through 524. However, the number of the plurality of active fins 510 is not limited to 6, and may be modified in various ways. In some example embodiments of the inventive concepts, the number of the plurality of active fins 510 may be greater than 6. In some example embodiments of the inventive concepts, the number of the plurality of active fins 510 may be smaller than 6. Also, the number of the plurality of dummy fins 520 is not limited to 4, and may be modified in various ways.

In some example embodiments, the first through sixth active fins 511 through 516 and the first through fourth dummy fins 521 through 524 may have substantially the same width W. However, example embodiments of the inventive concepts are not limited thereto. In some example embodiments, the first through sixth active fins 511 through 516 may have different widths, and the first through fourth dummy fins 521 through 524 may have the same width W. In some example embodiments, the first through sixth active fins 511 through 516 may have different widths, and the first through fourth dummy fins 521 through 524 may also have different widths.

The first through third active fins 511 through 513 and the first and second dummy fins 521 and 522 may be disposed in the first limit layer DL1. The fourth through sixth active fins 514 through 516 and the third and fourth dummy fins 523 and 524 may be disposed in the second limit layer DL2. In the cell boundary limiting the cell CELL, an upper boundary, i.e. a boundary above the first dummy fin 521, may be referred to as a first cell boundary CB1, and a lower boundary, i.e., a boundary below the fourth dummy fin 524 may be referred to as a second cell boundary CB2.

The plurality of active fins 510 arranged adjacent to each other may constitute a fin FET. A channel width of the fin FET may be increased in proportional to the number of active fins constituting the fin FET, and thus, a current amount flowing through the fin FET may be increased. The channel width of the fin FET will be described later in greater detail with respect to FIGS. 22 through 24.

In some example embodiments, the first limit layer DL1 may be a p+ impurity doped PMOS limit layer, and the second limit layer DL2 may be an n+ impurity doped PMOS limit layer. The first through third active fins 511 through 513 disposed in the first limit layer DL1 may constitute a PMOS fin FET. The fourth through sixth active fins 514 through 516 disposed in the second limit layer DL2 may be an NMOS fin FET.

More specifically, the two gate electrodes 530 and the three source/drain contacts 540 are disposed above the first through third active fins 511 through 513, and thus the first through third active fins 511 through 513 may constitute two PMOS fin FETs connected in parallel to each other. The two gate electrodes 530 and the two source/drain contacts 540 are disposed above the fourth through sixth active fins 514 through 516, and thus the fourth through sixth active fins 514 through 516 may constitute two NMOS fin FETs connected in series to each other.

In some example embodiments, the cell CELL may include a first region R1 including the plurality of active fins 510 arranged in parallel to each other in a first direction (for example, an X direction) and a second region R2 including the plurality of dummy fins 520 arranged in parallel to the plurality of active fins 510. In this regard, the first region R1 may include a first active region AR1 and a second active region AR2, and the second region R2 may include a first dummy region DR1, a second dummy region DR2, and a third dummy region DR3.

In a size H of the cell CELL in the second direction (for example, a Y direction), a size H1 of the first dummy region DR1 in the second direction, a size H2 of the first active region AR1 in the second direction, a size H3 of the second dummy region DR2 in the second direction, a size H4 of the second active region AR2 in the second direction, and a size H5 of the third dummy region DR3 in the second direction, the second direction may be substantially perpendicular to the first direction. The sizes of the cell CELL, the first through third dummy regions DR1, DR2, and DR3, and the first and second active regions AR1 and AR2 are referred to as "heights" below.

The first active region AR1 may include the first through third active fins 511 through 513 arranged in parallel to each other in the first direction. The first pitch P1 of the first through third active fins 511 through 513 may have an invariable value. Similarly, the second active region AR2 may include the fourth through sixth active fins 514 through 516 arranged in parallel to each other in the first direction. The first pitch P1 of the fourth through sixth active fins 514 through 516 may have an invariable value.

In this regard, the first pitch P1 may be expressed as a sum of the width W of each of the first through sixth active fins 511 through 516 and the space S1 between two adjacent active fins (i.e. P1=W+S1). A height H2 of the first active region AR1 corresponds to a multiplication of the number (i.e. 3) of the first through third active fins 511 through 513 included in the first active region AR1 and the first pitch P1 (i.e. H2=3*P1=3*(W+S1)). Similarly, a height H4 of the second active region AR2 corresponds to a multiplication of the number (i.e. 3) of the fourth through sixth active fins 514 through 516 included in the second active region AR2 and the first pitch P1 (i.e. H4=3*P1=3*(W+S1)).

As described above, according to some example embodiments, although a new library is used to implement the semiconductor IC 500 due to a change in the height H of the cell CELL, the first pitch P1 of the plurality of active fins 510 has the invariable value, and thus a simulation tool for modeling the plurality of active fins 510, for example, a spice model, may not be changed. In other words, diverse libraries may be supported by using a single simulation tool having the first pitch P1 of the plurality of active fins 510 having the invariable value irrespective of the height H of the cell CELL.

The first dummy region DR1 may include a first dummy fin 521 disposed in parallel to the plurality of active fins 510. A second pitch P2 of the first dummy pin 521 may have a variable value. Similarly, the second dummy region DR2 may include second and third dummy fins 522 and 523 disposed in parallel to the plurality of active fins 510. The second pitch P2 of the second and third dummy fins 522 and 523 may have a variable value. Similarly, the third dummy region DR3 may include a dummy fin 524 disposed in parallel to the plurality of active fins 510. The second pitch P2 of the fourth dummy fin 524 may have a variable value.

In some example embodiments, a space S3 between the first dummy fin 521 and the first cell boundary CB1 may be substantially the same as a space S4 between the fourth dummy fin 524 and the second cell boundary CB2. In some example embodiments, the space S2 between the second and third dummy fins 522 and 523 may correspond to two times a space S3 between the first dummy fin 521 and the first cell boundary CB1 and a space S4 between the fourth dummy fin 524 and the second cell boundary CB2.

A space between a fourth dummy fin (not shown) included in another cell (not shown) disposed to be adjacent to the first dummy fin 521 and the first dummy fin 521 included in the cell CELL may be the same as the space S2 between the second dummy fin 522 and the third dummy fin 523. Likewise, a space between a first dummy fin (not shown) included in another cell (not shown) disposed to be adjacent to the fourth dummy fin 524 and the fourth dummy fin 524 included in the cell CELL may be the same as the space S2 between the second dummy fin 522 and the third dummy fin 523.

In this regard, the second pitch P2 may be expressed as a sum of the width W of each of the first through fourth dummy fins 521 through 524 and the space S2 between the two adjacent dummy fins 522 and 523 (i.e. P2=W+S2). In this regard, the second pitch P2 may have a value greater than or the same as that of the first pitch P1. The height H1 of the first dummy region DR1 may correspond to W+(S1)/2+S3. The height H3 of the second dummy region DR2 may correspond to 2W+S1+S2. The height H5 of the third dummy region DR3 may correspond to W+(S1)/2+S4.

In some example embodiments, the height H1 of the first dummy region DR1 may be substantially the same as the height H5 of the third dummy region DR3. In some example embodiments, the height H1 of the first dummy region DR1 may correspond to half the height H5 of the third dummy region DR3. In other words, the height H2 of the second dummy region DR2 may correspond to two times the height H1 of the first dummy region DR1 and the height H5 of the third dummy region DR3. In some example embodiments, the height H2 of the second dummy region DR2 may be two times greater than the height H1 of the first dummy region DR1 and the height H5 of the third dummy region DR3.

In some example embodiments, the second pitch P2 may be changed based on the height H of the cell CELL. The height H of the cell CELL may be changed based on the number of metal lines that are included in an upper layer of the cell CELL and arranged in parallel to each other in the first direction (for example, the X direction). Accordingly, the second pitch P2 may be changed based on the number of metal lines, which will be described later with reference to FIG. 26.

In some example embodiments, the first dummy region DR1 may be used as a power region in which the first power line VDD that supplies power (for example, a power voltage) to the plurality of active fins 510 is disposed. The third dummy region DR3 may also be used as a power region in which the second power line VSS that supplies power (for example, a ground voltage) to the plurality of active fins 510 is disposed.

As described above, according to some example embodiments, the second pitch P2 may be greater than or the same as the first pitch P1. Thus, the height H1 of the first dummy region DR1 and the height H5 of the third dummy region DR3 may be greater than or the same as those of a conventional semiconductor IC including a plurality of active fins and a plurality of dummy fins that have the same pitch. Therefore, the semiconductor IC 500 may secure a sufficient space necessary for the layout of the first and second power lines VDD and VSS, and thus a degree of freedom with respect to the layout of the first and second power lines VDD and VSS may be increased.

In some example embodiments, the second dummy region DR2 may be used as a middle region (for example, a middle of line (MOL) region) in which input and output terminals with respect to the cell CELL are disposed. More specifically, fins such as the input contacts 555 may be disposed in the second dummy region DR2.

As described above, according to some example embodiments, the second pitch P2 is greater than or the same as the first pitch P1. Thus, the height H3 of the second dummy region DR2 may be greater than or the same as that of the conventional semiconductor IC including a plurality of active fins and a plurality of dummy fins that have the same pitch. Therefore, the semiconductor IC 500 may secure a sufficient space necessary for the layout of the fins, and thus a degree of freedom with respect to the layout of the fins may be increased.

Figure 21:
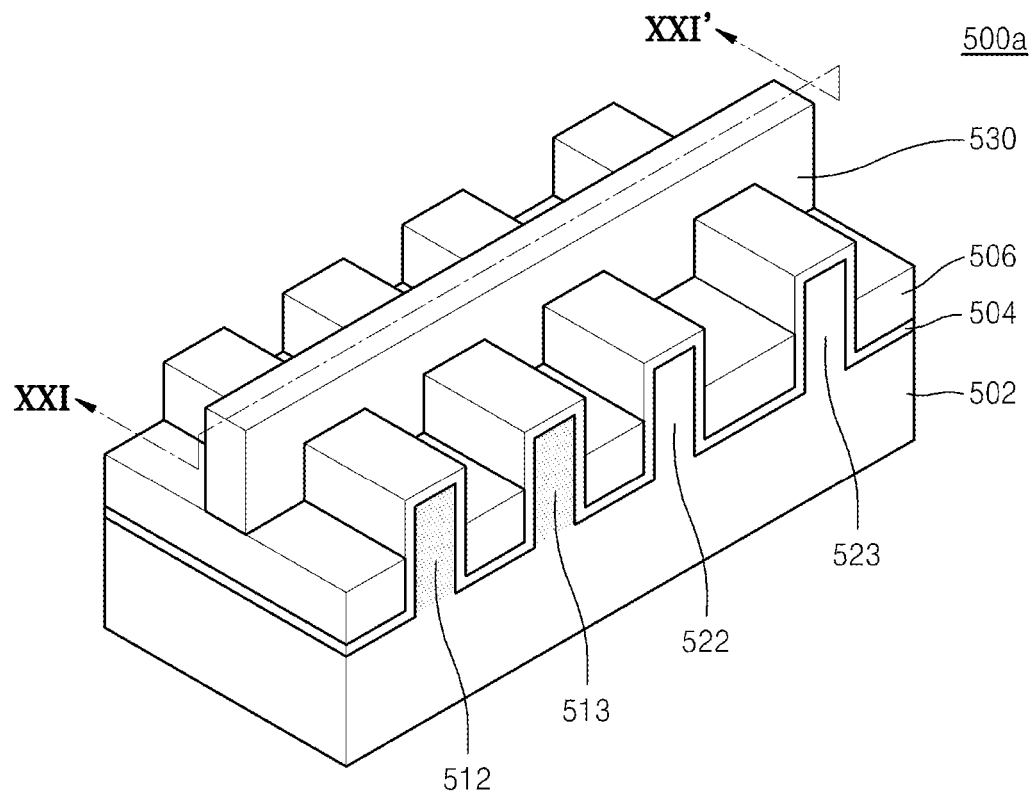
FIG. 21 is a perspective view of a semiconductor device with the layout of FIG. 20, according to some example embodiments of the inventive concepts.

FIG. 21 is a perspective view of a semiconductor device 500a with the layout of FIG. 20, according to some example embodiments of the inventive concepts.

Figure 22:
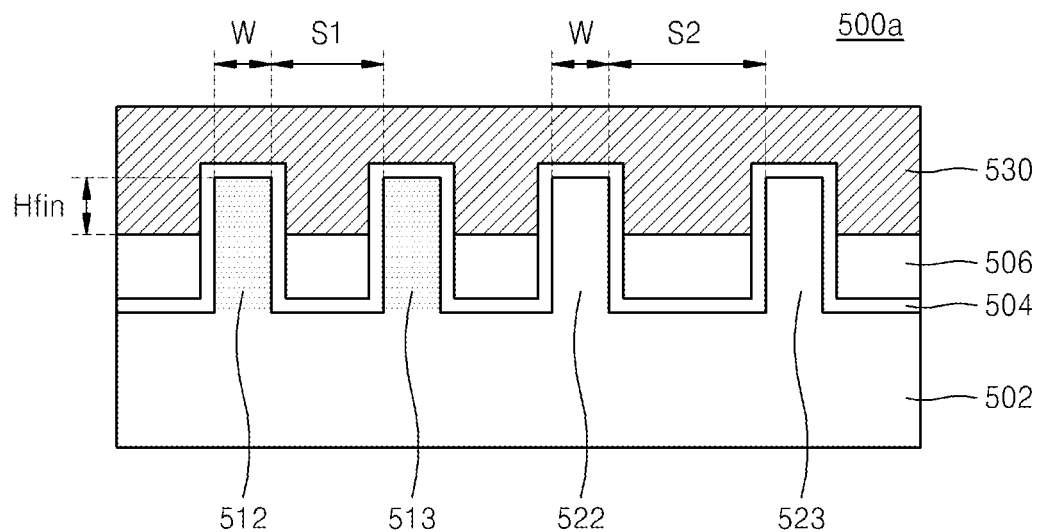
FIG. 22 is a cross-sectional view taken along line XXI-XXI' of FIG. 21.

FIG. 22 is a cross-sectional view taken along line XXI-XXI' of FIG. 21.

Referring to FIGS. 21 and 22, the semiconductor device 500a may be a bulk type fin FET. The semiconductor device 500a may include a substrate 502, a first insulating layer 504, a second insulating layer 506, second and third active fins 512 and 513, second and third dummy fins 522 and 523, and a gate electrode 530.

The substrate 502 may be a semiconductor substrate. For example, the substrate 502 may include one of silicon, silicon-on-insulator (SOI), silicon-on-sapphire (SOS), germanium, silicon-germanium, and gallium-arsenide.

The second and third active fins 512 and 513 and the second and third dummy fins 522 and 523 may be arranged to be connected to the substrate 502. In some example embodiments, protruding portions of the second and third active fins 512 and 513 that are perpendicular with respect to the substrate 502 may be n+ or p+ doped active regions, and protruding portions of the second and third dummy fins 522 and 523 that are perpendicular with respect to the substrate 502 may be undoped regions. In some example embodiments, the second and third active fins 512 and 513 and the second and third dummy fins 522 and 523 may all be n+ or p+ doped active regions.

The second and third active fins 512 and 513 may have the width W and a height Hfin, and thus, may have a channel width (or an effective channel width) of (Hfin*2+W). The height Hfin indicates a height from an upper surface of the second insulating layer 506 to upper surfaces of the second and third active fins 512 and 513. If an N number of active fins constitute a single fin FET, a channel width (or an effective channel width) of the fin FET may be (Hfin*2+W)*N.

In some example embodiments, the space S1 between the second and third active fins 512 and 513 may have an invariable value, and the space S2 between the second and third dummy fins 522 and 523 may have a variable value. The space S2 between the second and third dummy fins 522 and 523 may be greater than or the same as the space S1 between the second and third active fins 512 and 513.

The first and second insulating layers 504 and 506 may include an insulating material, for example, which may include one of an oxide layer, a nitride layer, and an oxynitride layer. The first insulating layer 504 may be disposed above the second and third active fins 512 and 513 and the second and third dummy fins 522 and 523. The first insulating layer 504 may be disposed between the second and third active fins 512 and 513 and the gate electrode 530, and thus, may serve as a gate insulating layer. The second insulating layer 506 may be disposed in a space between the second and third active fins 512 and 513 and the second and third dummy fins 522 and 523 to have a desired height (that may or may not be predetermined). The second insulating layer 506 may be disposed among the second and third active fins 512 and 513 and the second and third dummy fins 522 and 523, and thus, may be used as a device isolation layer.

The gate electrode 530 may be disposed on the first and second insulating layers 504 and 506 to have a structure surrounding the second and third active fins 512 and 513, the second and third dummy fins 522 and 523, and the second insulating layer 506, i.e., a structure including the second and third active fins 512 and 513 and the second and third dummy fins 522 and 523 in the gate electrode 530. The gate electrode 530 may include at least one of a metallic material such as tungsten (W) and tantalum (Ta), a nitride thereof, a silicide thereof, and a doped polysilicon, and may be formed using a deposition process.

Figure 23:
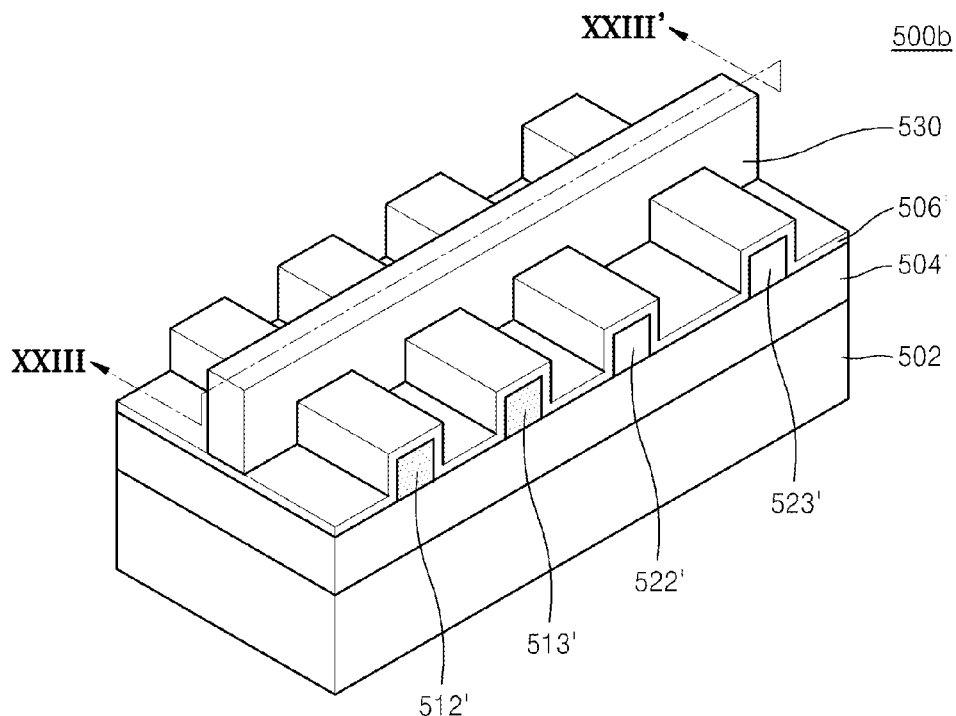
FIG. 23 is a perspective view of a semiconductor device with the layout of FIG. 20, according to some example embodiments of the inventive concepts.

FIG. 23 is a perspective view of a semiconductor device 500b with the layout of FIG. 20, according to some example embodiments of the inventive concepts.

Figure 24:
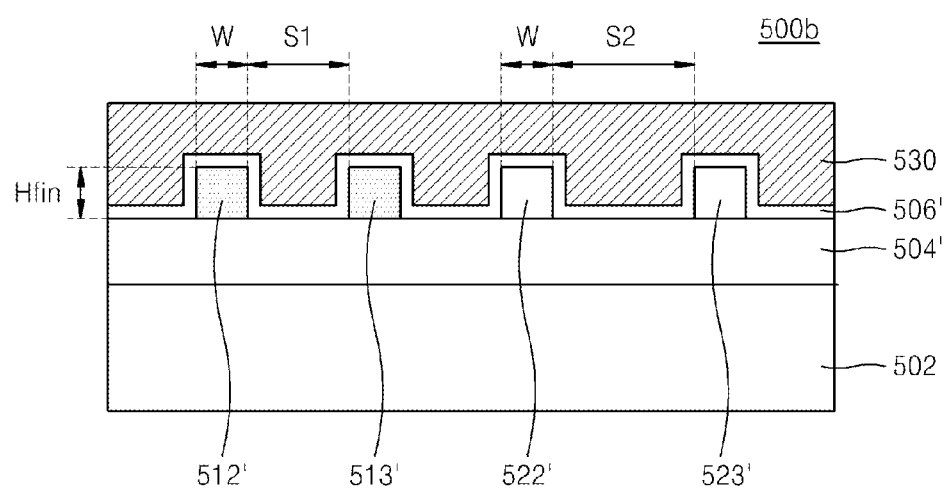
FIG. 24 is a cross-sectional view taken along line XXIII-XXXIII' of FIG. 23.

FIG. 24 is a cross-sectional view taken along line XXIII-XXIII' of FIG. 23.

Referring to FIGS. 23 and 24, the semiconductor device 500b may be an SOI type fin FET. The semiconductor device 500b may include the substrate 502, a first insulating layer 504', a second insulating layer 506', second and third active fins 512' and 513', second and third dummy fins 522' and 523', and the gate electrode 530. The semiconductor device 500b according to some example embodiments is a modification of the semiconductor device 500a of FIGS. 21 and 22, and thus differences therebetween will now be described, and redundant descriptions will be omitted here.

In some example embodiments, the space S1 between the second and third active fins 512' and 513' may have an invariable value, and the space S2 between the second and third dummy fins 522' and 523' may have a variable value. The space S2 between the second and third dummy fins 522' and 523' may be greater than or the same as the space S1 between the second and third active fins 512' and 513'.

The first insulating layer 504' may be disposed on the substrate 502. The second insulating layer 506' may be disposed between the second and third active fins 512' and 513', the second and third dummy fins 522' and 523', and the gate electrode 530, and thus, may serve as a gate insulating layer. The second and third active fins 512' and 513' and the second and third dummy fins 522' and 523' may be formed of a semiconductor material, for example, silicon or doped silicon.

The gate electrode 530 may be arranged on the second insulating layer 506' to have a structure surrounding the second and third active fins 512' and 513', the second and third dummy fins 522' and 523', and the second insulating layer 506', i.e., a structure including the second and third active fins 512' and 513' and the second and third dummy fins 522' and 523' in the gate electrode 530.

Figure 25:
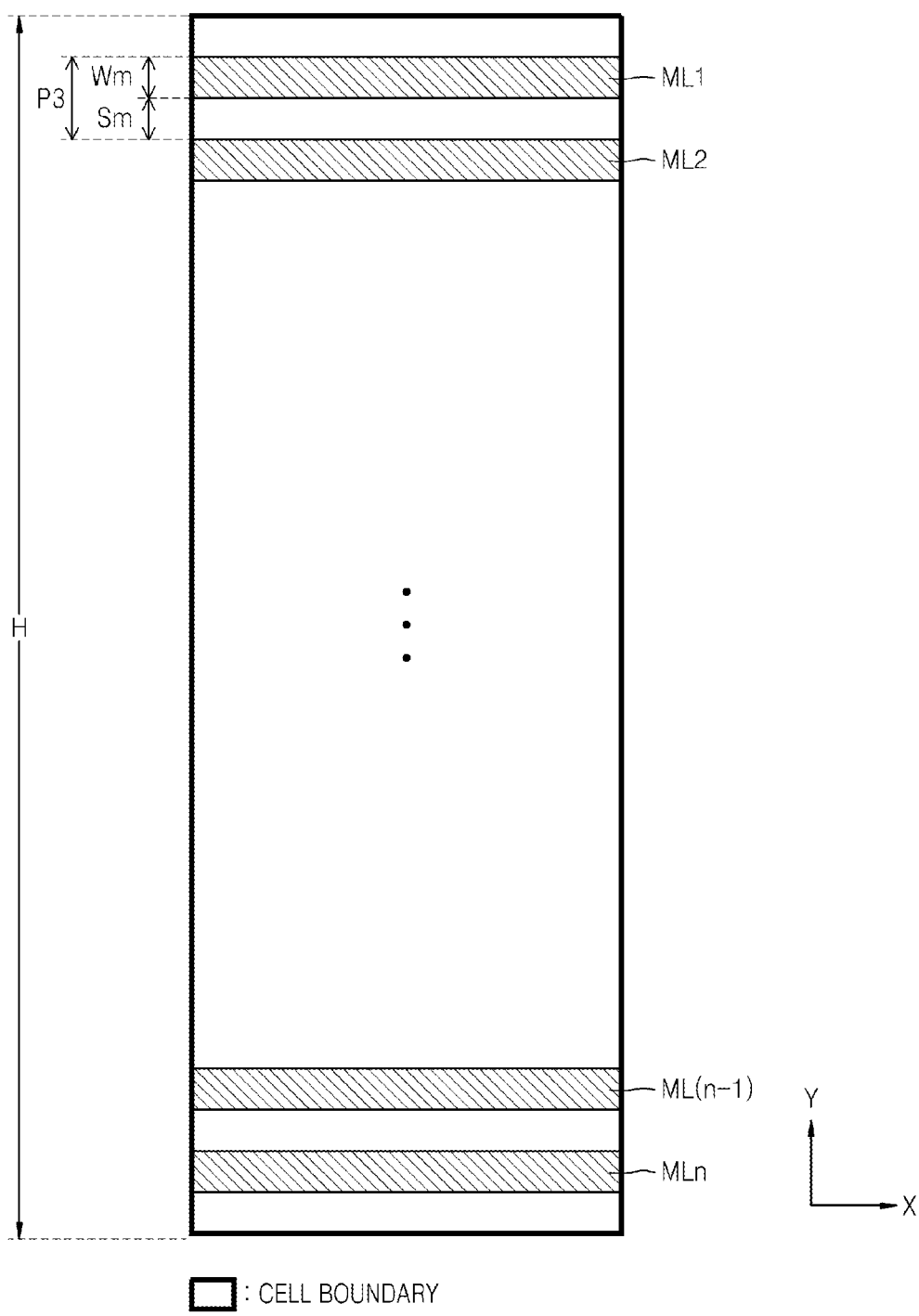
FIG. 25 is a layout of an upper layer of the semiconductor IC of FIG. 20 according to some example embodiments of the inventive concepts.

FIG. 25 is a layout of an upper layer 500U of the semiconductor IC 500 of FIG. 20 according to some example embodiments of the inventive concepts.

Referring to FIG. 25, the upper layer 500U of the semiconductor IC 500 of FIG. 20 may include a plurality of metal lines ML1, ML2, . . . , ML(n−1), MLn arranged in parallel to each other in a first direction (for example, an X direction). In the width Wm of each of the plurality of metal lines ML1, ML2, . . . , ML(n−1), MLn and the space Sm between two adjacent metal lines among the plurality of metal lines ML1, ML2, . . . , ML(n−1), MLn, the plurality of metal lines ML1, ML2, . . . , ML(n−1), MLn may have a third pitch P3 that is a sum of the width Wm and the space Sm (i.e. P3=Wm+Sm).

A plurality of metal layers (not shown) for wiring fin FETs formed in the cell CELL may be disposed above the semiconductor IC 500 including the cell CELL. Each of the plurality of metal layers may include a plurality of metal lines (not shown). In this regard, as shown in FIG. 25, at least one of the plurality of metal layers may include the plurality of metal lines ML1, ML2, . . . , ML(n−1), MLn arranged in parallel to each other in the first direction. For example, the upper layer 500U may be a second lower layer among the plurality of metal layers disposed above the cell CELL.

A size of the cell CELL in a second direction (for example, a Y direction), i.e. the height H, may correspond to the number of the plurality of metal lines ML1, ML2, . . . , ML(n−1), MLn arranged in parallel to each other in the first direction. Accordingly, layout of the plurality of metal lines ML1, ML2, . . . , ML(n−1), MLn and routing thereof may be facilitated.

In the semiconductor IC 500 including a fin FET, the active fins 511 through 516 constituting the fin FET are arranged in parallel to each other in the first direction based on a constant pitch. As described above, if the plurality of metal lines ML1, ML2, . . . , ML(n−1), MLn and the active fines 511 through 516 are arranged in parallel to each other in the first direction, the height H of the cell CELL may be changed according to a change in the number of the plurality of metal lines ML1, ML2, . . . , ML(n−1), MLn.

Therefore, the pitch of the active fins 511 through 516 needs to be changed by reflecting the changed height H of the cell CELL. If the pitch of the active fins 511 through 516 is changed, an amount of current flowing through the fin FET is changed, and thus a correction may be required throughout a process for manufacturing devices included in the semiconductor IC 500. If the pitch of the active fins 511 through 516 is changed whenever the height H of the cell CELL is changed, a plurality of simulation tools for supporting diverse pitches of the active fins 511 through 516 needs to be prepared.

Figure 26:
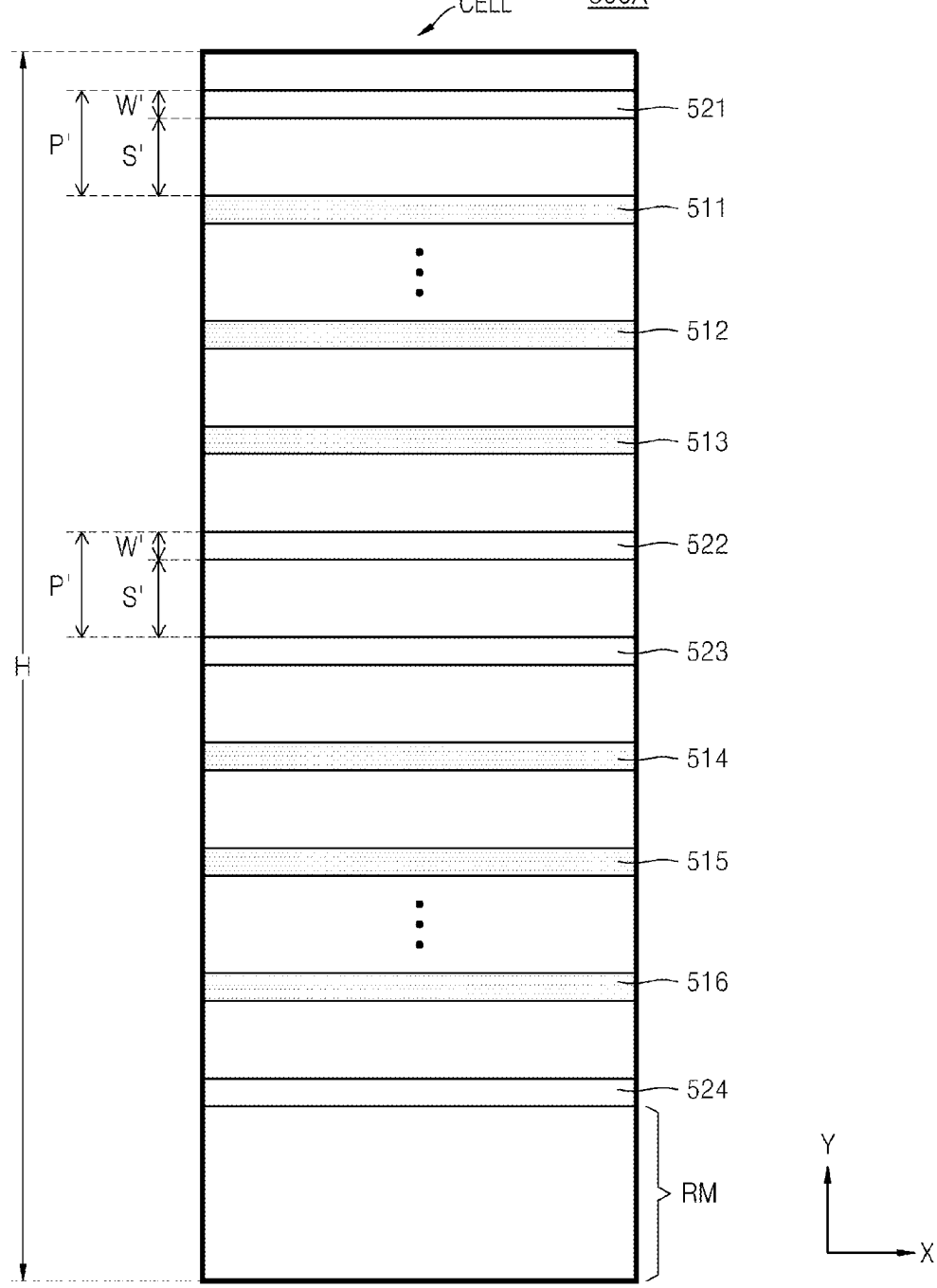
FIG. 26 is a layout of a semiconductor IC including the upper layer of FIG. 25 according to some example embodiments of the inventive concepts.

FIG. 26 is a layout of a semiconductor IC 500A including the upper layer 500U of FIG. 25 according to some example embodiments of the inventive concepts.

Referring to FIG. 26, the semiconductor IC 500A may include the cell CELL' whose size in a second direction (for example, a Y direction), i.e. the height H, may be determined to be the same as the height H of the upper layer 500U of FIG. 25. Thus, the height H of the cell CELL' may be changed based on the number of the plurality of metal lines ML1, ML2, . . . , ML(n−1), MLn included in the upper layer 500U.

The cell CELL' may include the plurality of active fins 511 through 516 and the plurality of dummy fins 521 through 524. FIG. 26 shows only the plurality of active fins 511 through 516 and the plurality of dummy fins 521 through 524 that are included in the cell CELL' for convenience of description. However, similarly to FIG. 20, the cell CELL' may include a gate electrode, source/drain contacts, input terminals, output terminals, etc.

A width W' of each of the plurality of active fins 511 through 516 and the plurality of dummy fins 521 through 524 may be substantially the same. Also, a space S' between the plurality of active fins 511 through 516 and two adjacent dummy fins among the plurality of dummy fins 521 through 524 may be substantially the same. Accordingly, a pitch P' of the plurality of active fins 511 through 516 and the plurality of dummy fins 521 through 524 may be substantially the same as a sum of the width W' and space S' (i.e. P'=W'+S').

In some example embodiments, the width W' and the space S' may have invariable values. In this regard, if the plurality of active fins 511 through 516 and the plurality of dummy fins 521 through 524 having the invariable width W' and space S' are disposed in the cell CELL', a remainder region RM is generated in the cell CELL'. As the number of the plurality of metal lines ML1, ML2, . . . , ML(n−1), MLn disposed on the upper layer 500U increases (i.e., as n increases), the height H of the cell CELL' increases, and thus the higher the height H of the cell CELL' increases, the higher the height of the remainder region RM increases.

As described above, if the pitch P' of the plurality of active fins 511 through 516 and the plurality of dummy fins 521 through 524 is not changed in spite of the change in the height H of the cell CELL', the higher the height H of the cell CELL' increases, the higher the height of the remainder region RM increases. If the remainder region RM increases, wires (for example, power wires) for commonly connecting adjacent cells are not easily disposed between the adjacent cells.

Figure 27:
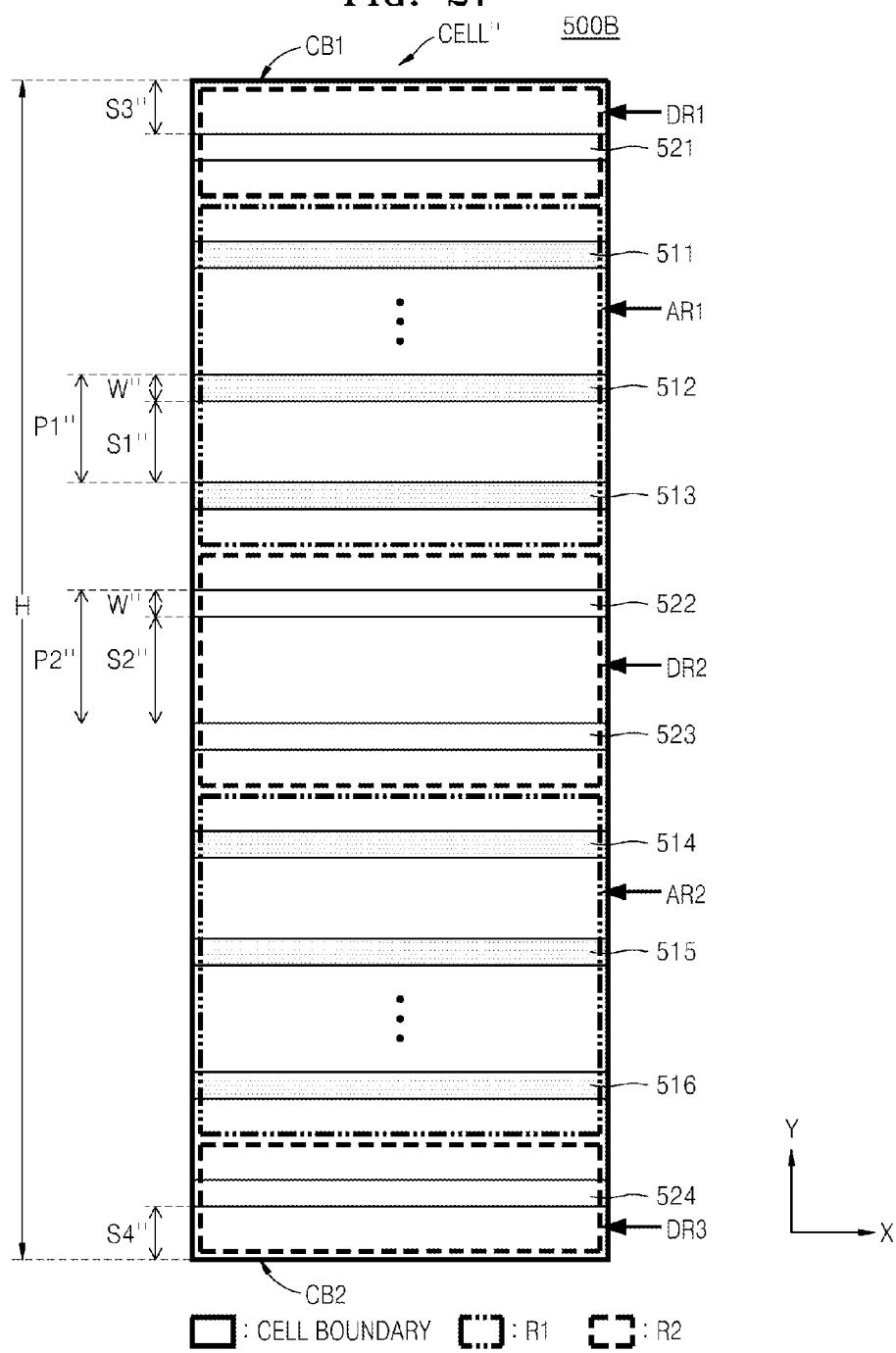
FIG. 27 is a layout of a semiconductor IC including the upper layer of FIG. 25 according to some example embodiments of the inventive concepts.

FIG. 27 is a layout of a semiconductor IC 500B including the upper layer 500U of FIG. 25 according to some example embodiments of the inventive concepts.

Referring to FIG. 27, the semiconductor IC 500B may include a cell CELL" whose size in a second direction (for example, a Y direction), i.e. the height H, may be determined to be the same as the height H of the upper layer 500U of FIG. 25. Thus, the height H of the cell CELL" may be changed based on the number of the plurality of metal lines ML1, ML2, . . . , ML(n−1), MLn included in the upper layer 500U.

The cell CELL" may include the plurality of active fins 511 through 516 and the plurality of dummy fins 521 through 524. FIG. 27 shows only the plurality of active fins 511 through 516 and the plurality of dummy fins 521 through 524 that are included in the cell CELL" for convenience of description. However, similarly to FIG. 20, the cell CELL" may include a gate electrode, source/drain contacts, input terminals, output terminals, etc.

A width W" of each of the plurality of active fins 511 through 516 and the plurality of dummy fins 521 through 524 may be substantially the same. In some example embodiments, a first pitch P1" of the plurality of active fins 511 through 516 may have an invariable value, and a second pitch P2" of the plurality of dummy fins 521 through 524 may have a variable value. In this regard, the second pitch P2" of the plurality of dummy fins 521 through 524 may be changed based on the height H of the cell CELL". The height H of the cell CELL" may be changed based on the number of the plurality of metal lines ML1, ML2, . . . , ML(n−1), MLn arranged in parallel to each other in a first direction.

More specifically, a space S1" between two adjacent active fins among the plurality of active fins 511 through 516 may have an invariable value, and thus the first pitch P1" of the plurality of active fins 511 through 516 may have an invariable value (i.e., P1"=W"+S1"). Meanwhile, a space S2" between two adjacent dummy fins among the plurality of dummy fins 521 through 524 may have a variable value, and thus the second pitch P2" of the plurality of dummy fins 521 through 524 may have a variable value (i.e., P2"=W"+S2"). In this regard, the space S2" between two adjacent dummy fins may be changed based on the height H of the cell CELL". The height H of the cell CELL" may be changed based on the number of the plurality of metal lines ML1, ML2, . . . , ML(n−1), MLn arranged in parallel to each other in a first direction.

In some example embodiments, a space S3" between the first dummy fin 521 and the first boundary cell CB1 may correspond to half a space S2" between the second dummy fin 522 and the third dummy fin 523. Also, a space S4" between the fourth dummy fin 524 and the second boundary cell CB2 may correspond to half the space S2" between the second dummy fin 522 and the third dummy fin 523.

As described above, according to some example embodiments, if the height H of the cell CELL" is changed, the first pitch P1" of the plurality of active fins 511 through 516 may not be changed, and the second pitch P2" of the plurality of dummy fins 521 through 524 may be changed. Therefore, a single simulation tool for supporting the invariable first pitch P1" of the plurality of active fins 511 through 516 may be used to support diverse libraries according to the change in the height H of the cell CELL". Since the first pitch P1" of the plurality of active fins 511 through 516 is not changed, an amount of current flowing through a fin FET is not changed, and thus a correction is not required throughout a process for manufacturing devices included in the semiconductor IC 500B.

Furthermore, the second pitch P2" of the plurality of dummy fins 521 through 524 is adaptively changed with respect to the height H of the cell CELL", and thus, unlike FIG. 26, remainder regions may be uniformly arranged substantially. Therefore, the second dummy region DR2 may secure a sufficient space for the layout of fins, and thus a plurality of fins may be easily disposed in the second dummy region DR2. Also, the first and third dummy regions DR1 and DR3 may secure sufficient spaces for wires (for example, power wires) disposed between adjacent cells for commonly connecting the adjacent cells, and thus the wires may be easily disposed in the first and third dummy regions DR1 and DR3.

Figure 28:
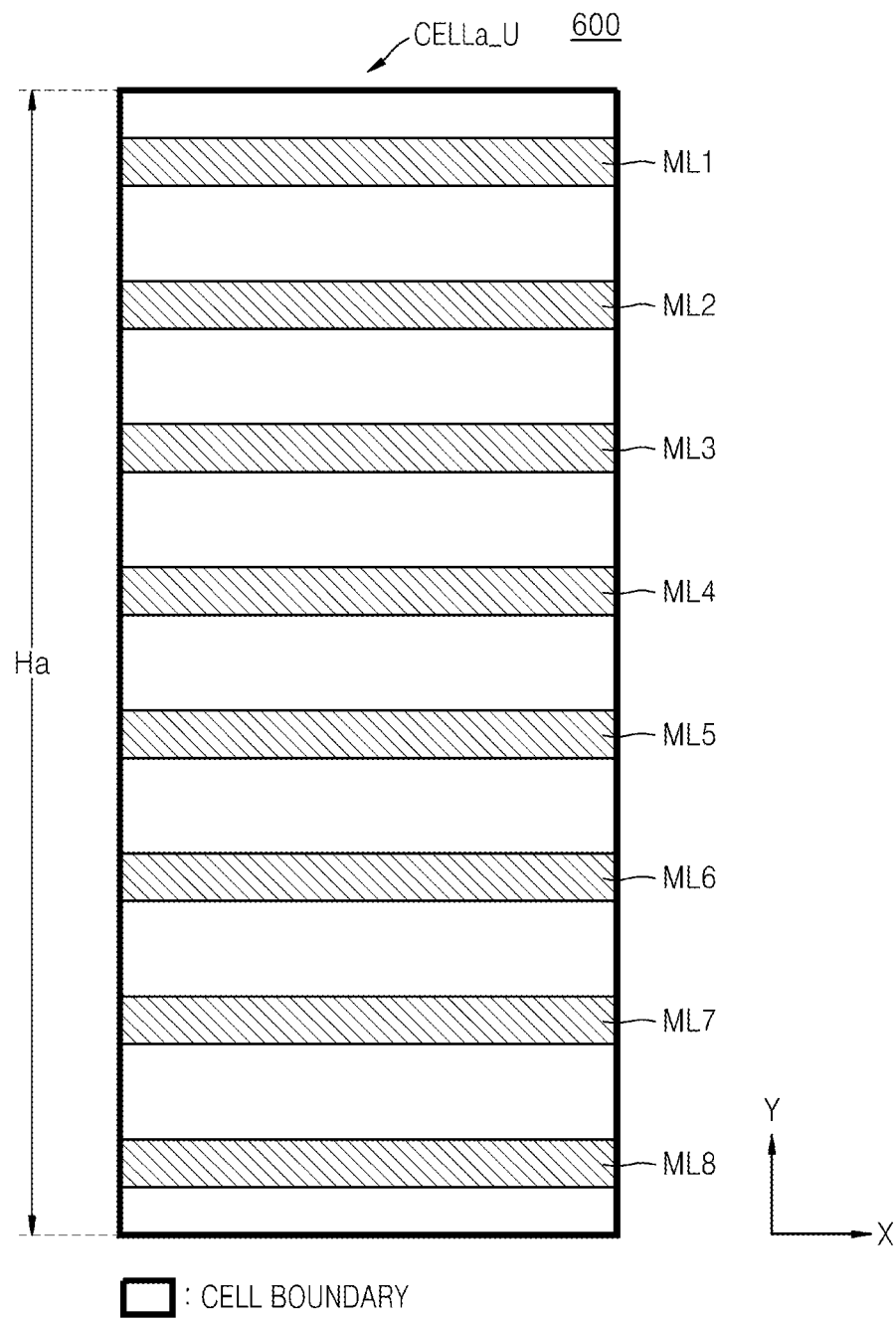
FIG. 28 is a layout of an upper layer of the semiconductor IC according to some example embodiments of the inventive concepts.

FIG. 28 is a layout of an upper layer CELLa_U of the semiconductor IC 600 according to some example embodiments of the inventive concepts.

Referring to FIG. 28, the semiconductor IC 600 may include the cell CELLa (FIG. 29) including the upper layer CELLa_U that may include 8 metal lines ML1 through ML8 arranged in parallel to each other in a first direction (for example, an X direction). For example, a pitch of the 8 metal lines ML1 through ML8 may be 45 and thus, the height Ha of the cell CELLa may be 360 (=8*45). In this regard, the pitch of the 8 metal lines ML1 through ML8 and the height Ha of the cell CELLa are normalized values. Likewise, all values of pitches and heights described below are normalized values.

Figure 29:
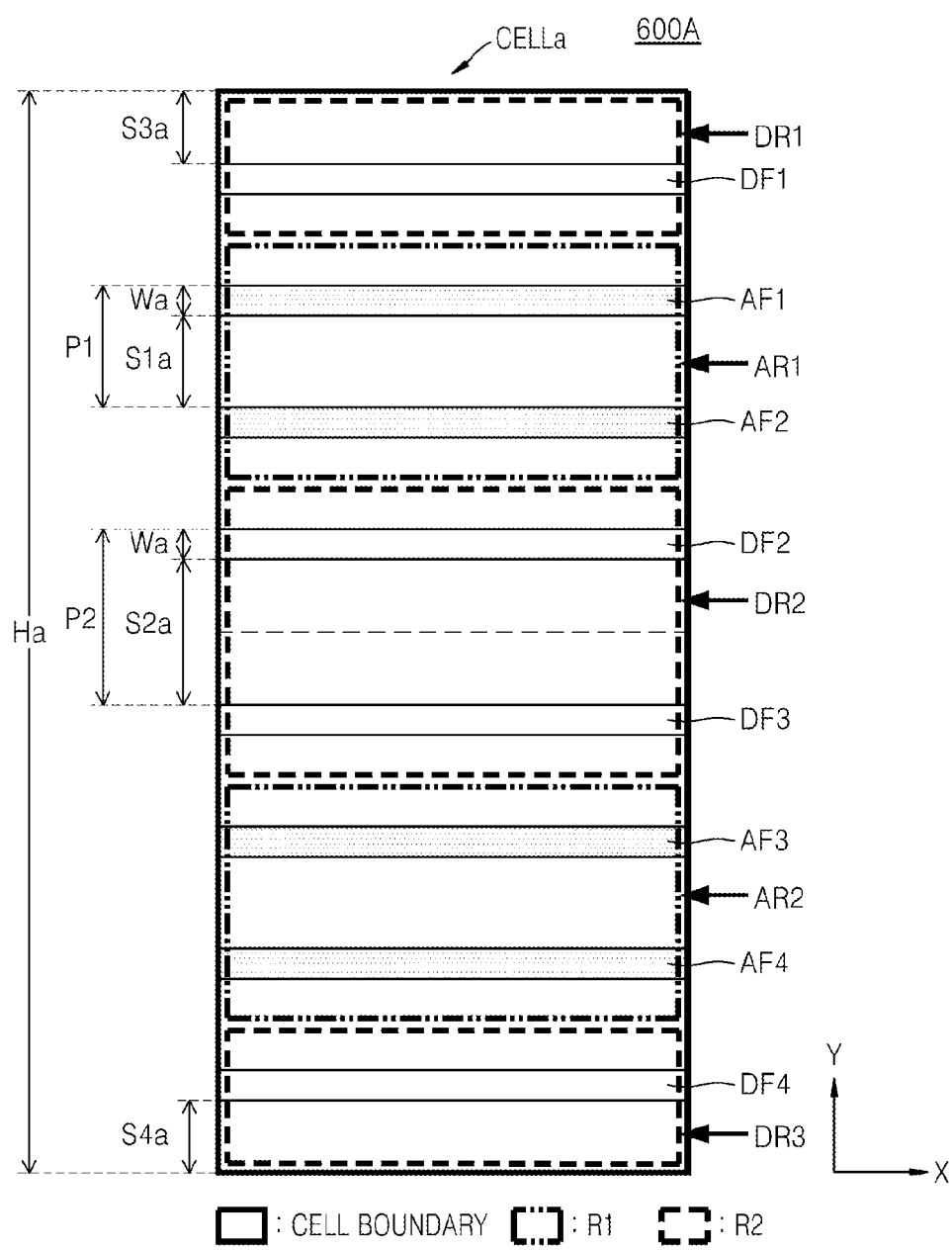
FIG. 29 is a layout of a semiconductor IC including the upper layer of FIG. 28 according to some example embodiments of the inventive concepts.

FIG. 29 is a layout of a semiconductor IC 600A including the upper layer CELLa_U of FIG. 28 according to some example embodiments of the inventive concepts.

Referring to FIG. 29, the semiconductor IC 600A may include the cell CELLa whose height Ha may be, for example, 360. Therefore, if a minimum value of a pitch of active fins or dummy fins that are included in the cell CELLa is 40.5, the cell CELLa may include 8 active fins or dummy fins (i.e., 40.5*8≤360).

The cell CELLa may include the first through fourth active fins AF1 through AF4 and the first through fourth dummy fins DF1 through DF4 that are arranged in parallel to each other in a first direction (for example, an X direction), and may be divided into the first and second active regions AR1 and AR2 and the first through third dummy regions DR1, DR2, and DR3. More specifically, the first active region AR1 may include the first and second active fins AF1 and AF2, and the second active region AR2 may include the third and fourth active fins AF3 and AF4. Also, the first dummy region DR1 may include the first dummy fin DF1, the second dummy region DR2 may include the second and third dummy fins DF2 and DF3, and the third dummy region DR3 may include the fourth dummy fin DF4.

In some example embodiments, a width Wa of each of the first through fourth active fins AF1 through AF4 and the first through fourth dummy fins DF1 through DF4 may be substantially the same. Also, a space S1a between two adjacent active fins among the first through fourth active fins AF1 through AF4 may have an invariable value, and thus the first pitch P1 of the first through fourth active fins AF1 through AF4 may have an invariable value. Also, a space S2a between two adjacent dummy fins among the first through fourth dummy fins DF1 through DF4 may have a variable value, and thus the second pitch P2 of the first through fourth dummy fins DF1 through DF4 may have a variable value. In this regard, the second pitch P2 of the first through fourth dummy fins DF1 through DF4 may be changed based on the height Ha of the cell CELLa.

For example, the width Wa of each of the first through fourth active fins AF1 through AF4 and the first through fourth dummy fins DF1 through DF4 may be 10, the first pitch P1 of the first through fourth active fins AF1 through AF4 may be 40.5, and the second pitch P2 of the first through fourth dummy fins DF1 through DF4 may be 58.5. Therefore, the space S2a between the second and third dummy fins DF2 and DF3 may be 48.5.

Figure 30:
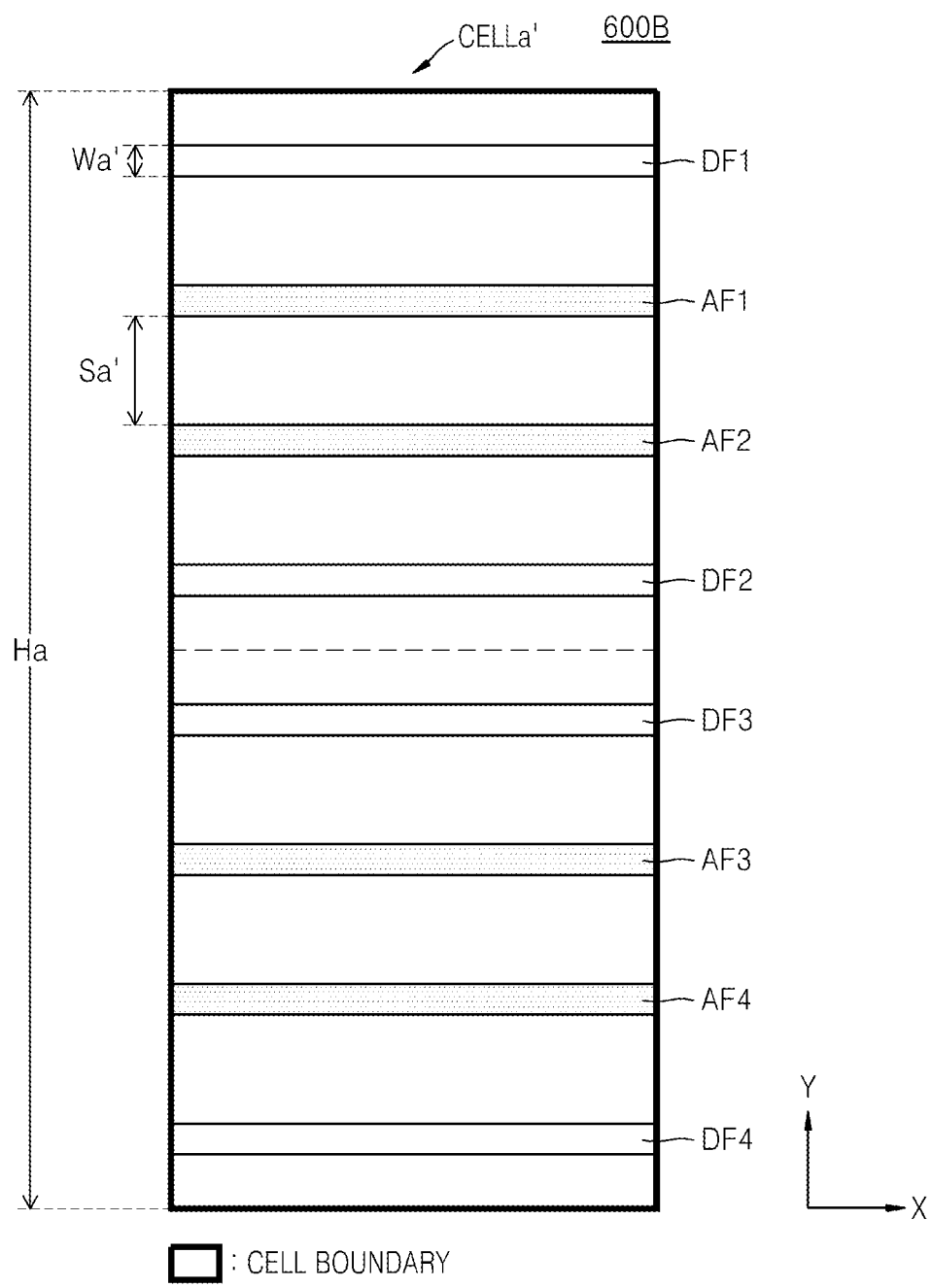
FIG. 30 is a layout of a semiconductor IC including the upper layer of FIG. 28, according to a comparison example.

FIG. 30 is a layout of a semiconductor IC 600B including the upper layer CELLa_U of FIG. 28, according to a comparison example.

Referring to FIG. 30, the semiconductor IC 600B may include the cell CELLa' whose height Ha may be, for example, 360. Therefore, if a minimum value of a pitch of active fins or dummy fins that are included in the cell CELLa' is 40.5, the cell CELLa' may include 8 active fins or dummy fins (i.e., 40.5*8≤360).

The cell CELLa' may include the first through fourth active fins AF1 through AF4 and the first through fourth dummy fins DF1 through DF4 that are arranged in parallel to each other in a first direction (for example, an X direction). In this regard, a width Wa' of each of the first through fourth active fins AF1 through AF4 and the first through fourth dummy fins DF1 through DF4 may be substantially the same. Also, a space Sa' between two adjacent fins among the first through fourth active fins AF1 through AF4 and the first through fourth dummy fins DF1 through DF4 may be substantially the same. Therefore, a pitch of the first through fourth active fins AF1 through AF4 and the first through fourth dummy fins DF1 through DF4 may have an invariable value.

For example, the width Wa' of each of the first through fourth active fins AF1 through AF4 and the first through fourth dummy fins DF1 through DF4 may be 10, and the pitch of the first through fourth active fins AF1 through AF4 and the first through fourth dummy fins DF1 through DF4 may be 45.

Figure 31:
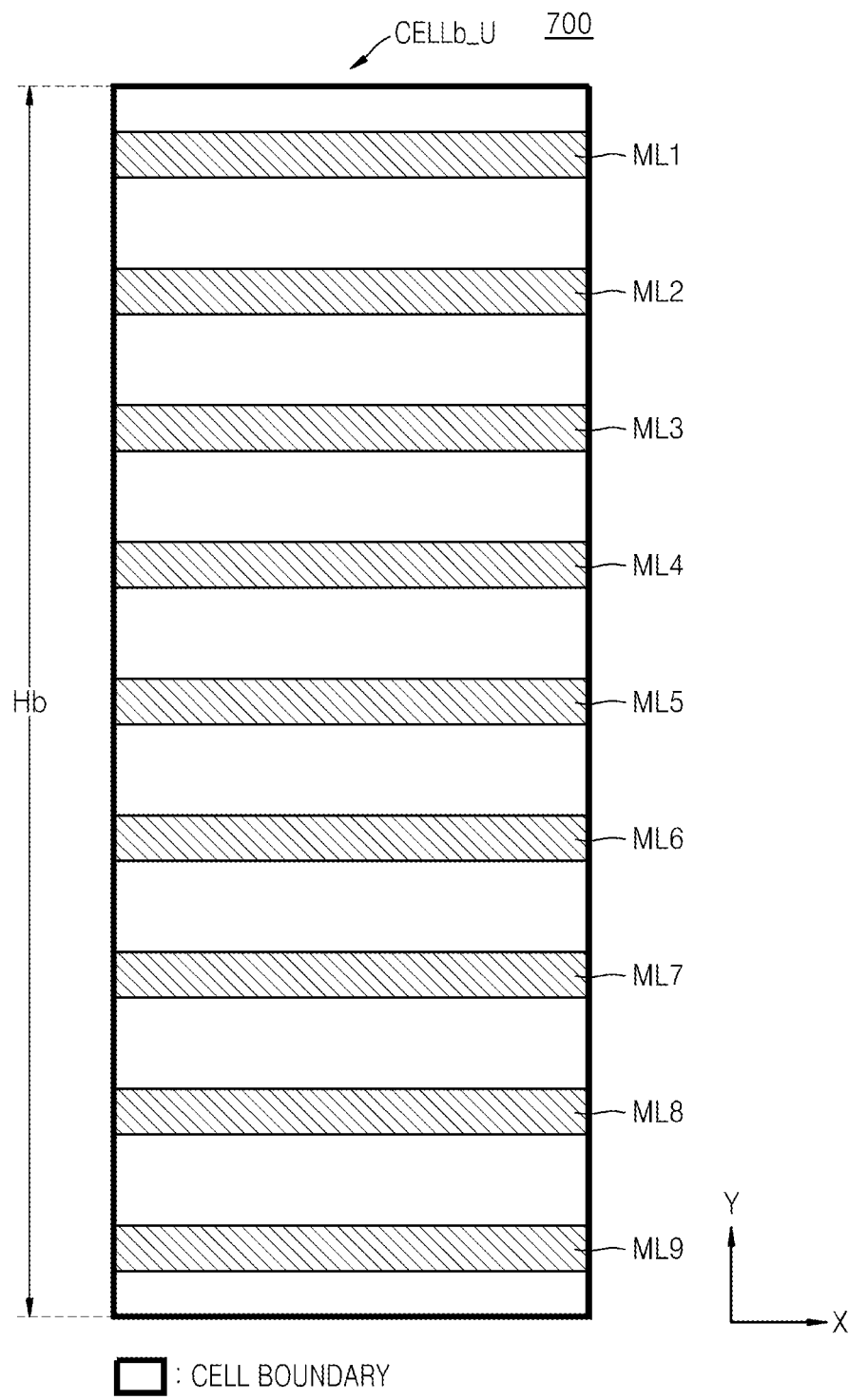
FIG. 31 is a layout of an upper layer of the semiconductor IC according to some example embodiments of the inventive concepts.

FIG. 31 is a layout of an upper layer CELLb_U of the semiconductor IC 700 according to some example embodiments of the inventive concepts.

Referring to FIG. 31, the semiconductor IC 700 may include the cell CELLb (FIG. 32) including the upper layer CELLb_U that may include 9 metal lines ML1 through ML9 arranged in parallel to each other in a first direction (for example, an X direction). For example, a pitch of the 9 metal lines ML1 through ML9 may be 45 and thus, the height Hb of the cell CELLb may be 405 (=9*45).

Figure 32:
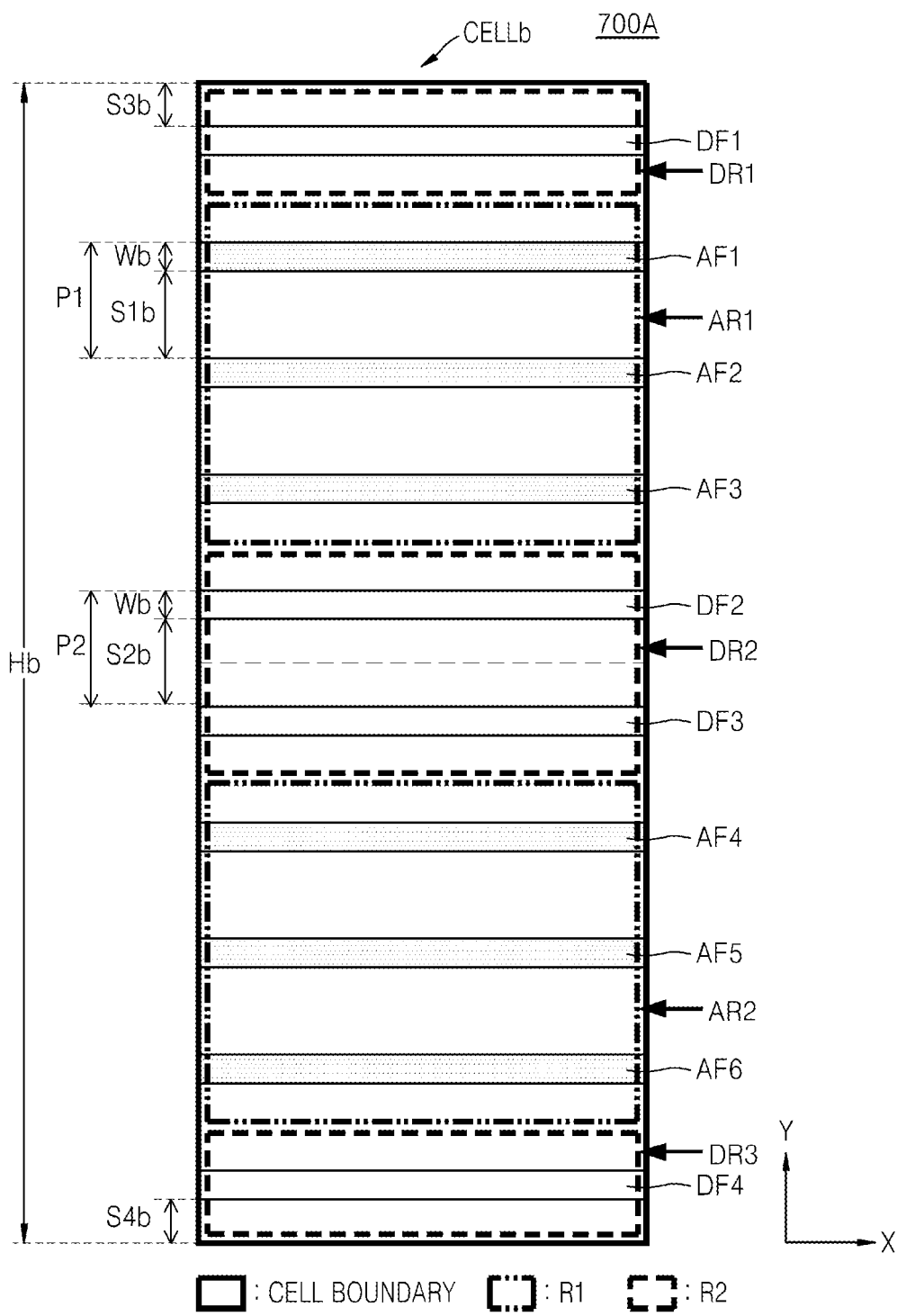
FIG. 32 is a layout of a semiconductor IC including the upper layer of FIG. 31 according to some example embodiments of the inventive concepts.

FIG. 32 is a layout of a semiconductor IC 700A including the upper layer CELLb_U of FIG. 31 according to some example embodiments of the inventive concepts.

Referring to FIG. 32, the semiconductor IC 700A may include the cell CELLb whose height Hb may be, for example, 405. Therefore, if a minimum value of a pitch of active fins or dummy fins that are included in the cell CELLb is 40.5, the cell CELLb may include 10 active fins or dummy fins (i.e., 40.5*10≤405).

The cell CELLb may include the first through sixth active fins AF1 through AF6 and the first through fourth dummy fins DF1 through DF4 that are arranged in parallel to each other in a first direction (for example, an X direction), and may be divided into the first and second active regions AR1 and AR2 and the first through third dummy regions DR1, DR2, and DR3. More specifically, the first active region AR1 may include the first through third active fins AF1, AF2, and AF3, and the second active region AR2 may include the fourth through sixth active fins AF4, AF5, and AF6. Also, the first dummy region DR1 may include the first dummy fin DF1, the second dummy region DR2 may include the second and third dummy fins DF2 and DF3, and the third dummy region DR3 may include the fourth dummy fin DF4.

In some example embodiments, a width Wb of each of the first through sixth active fins AF1 through AF6 and the first through fourth dummy fins DF1 through DF4 may be substantially the same. Also, a space S1b between two adjacent active fins among the first through sixth active fins AF1 through AF6 may have an invariable value, and thus the first pitch P1 of the first through sixth active fins AF1 through AF6 may have an invariable value. Also, a space S2b between two adjacent dummy fins among the first through fourth dummy fins DF1 through DF4 may have a variable value, and thus the second pitch P2 of the first through fourth dummy fins DF1 through DF4 may have a variable value. In this regard, the second pitch P2 of the first through fourth dummy fins DF1 through DF4 may be changed based on the height Hb of the cell CELLb.

For example, the width Wb of each of the first through sixth active fins AF1 through AF6 and the first through fourth dummy fins DF1 through DF4 may be 10, the first pitch P1 of the first through sixth active fins AF1 through AF6 may be 40.5, and the second pitch P2 of the first through fourth dummy fins DF1 through DF4 may be 58.5. Therefore, the space S2b between the second and third dummy fins DF2 and DF3 may be 30.5.

Figure 33:
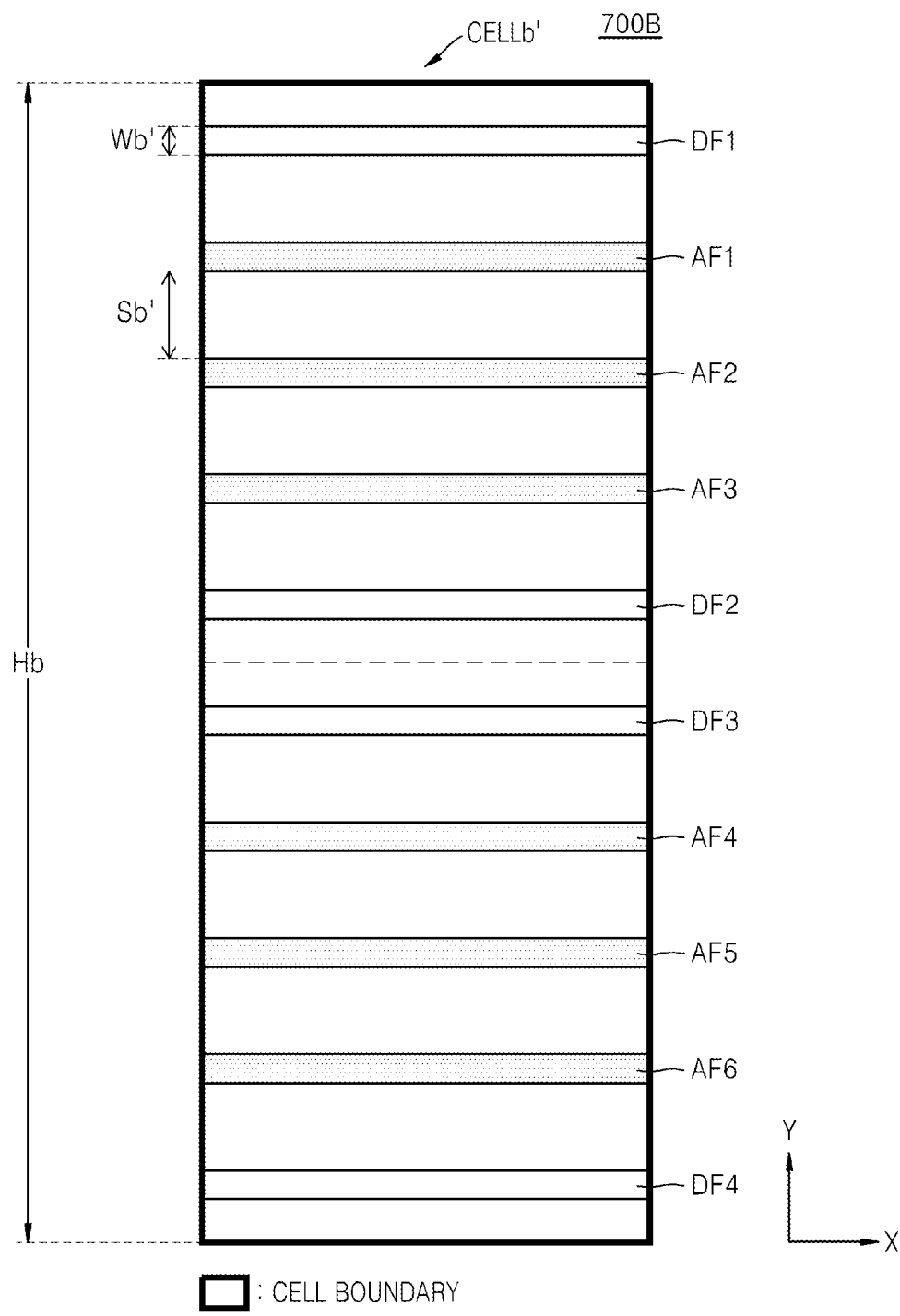
FIG. 33 is a layout of a semiconductor IC including the upper layer of FIG. 31, according to a comparison example.

FIG. 33 is a layout of a semiconductor IC 700B including the upper layer CELLb_U of FIG. 31, according to a comparison example.

Referring to FIG. 33, the semiconductor IC 700B may include the cell CELLb' whose height Hb may be, for example, 405. Therefore, if a minimum value of a pitch of active fins or dummy fins that are included in the cell CELLb' is 40.5, the cell CELLb' may include 10 active fins or dummy fins (i.e., 40.5*10≤360).

The cell CELLb' may include the first through sixth active fins AF1 through AF6 and the first through fourth dummy fins DF1 through DF4 that are arranged in parallel to each other in a first direction (for example, an X direction). In this regard, a width Wb' of each of the first through sixth active fins AF1 through AF6 and the first through fourth dummy fins DF1 through DF4 may be substantially the same. Also, a space Sb' between two adjacent fins among the first through sixth active fins AF1 through AF6 and the first through fourth dummy fins DF1 through DF4 may be substantially the same. Therefore, a pitch of the first through sixth active fins AF1 through AF6 and the first through fourth dummy fins DF1 through DF4 may have an invariable value.

For example, the width Wb' of each of the first through sixth active fins AF1 through AF6 and the first through fourth dummy fins DF1 through DF4 may be 10, and the pitch of the first through sixth active fins AF1 through AF6 and the first through fourth dummy fins DF1 through DF4 may be 40.5.

Figure 34:
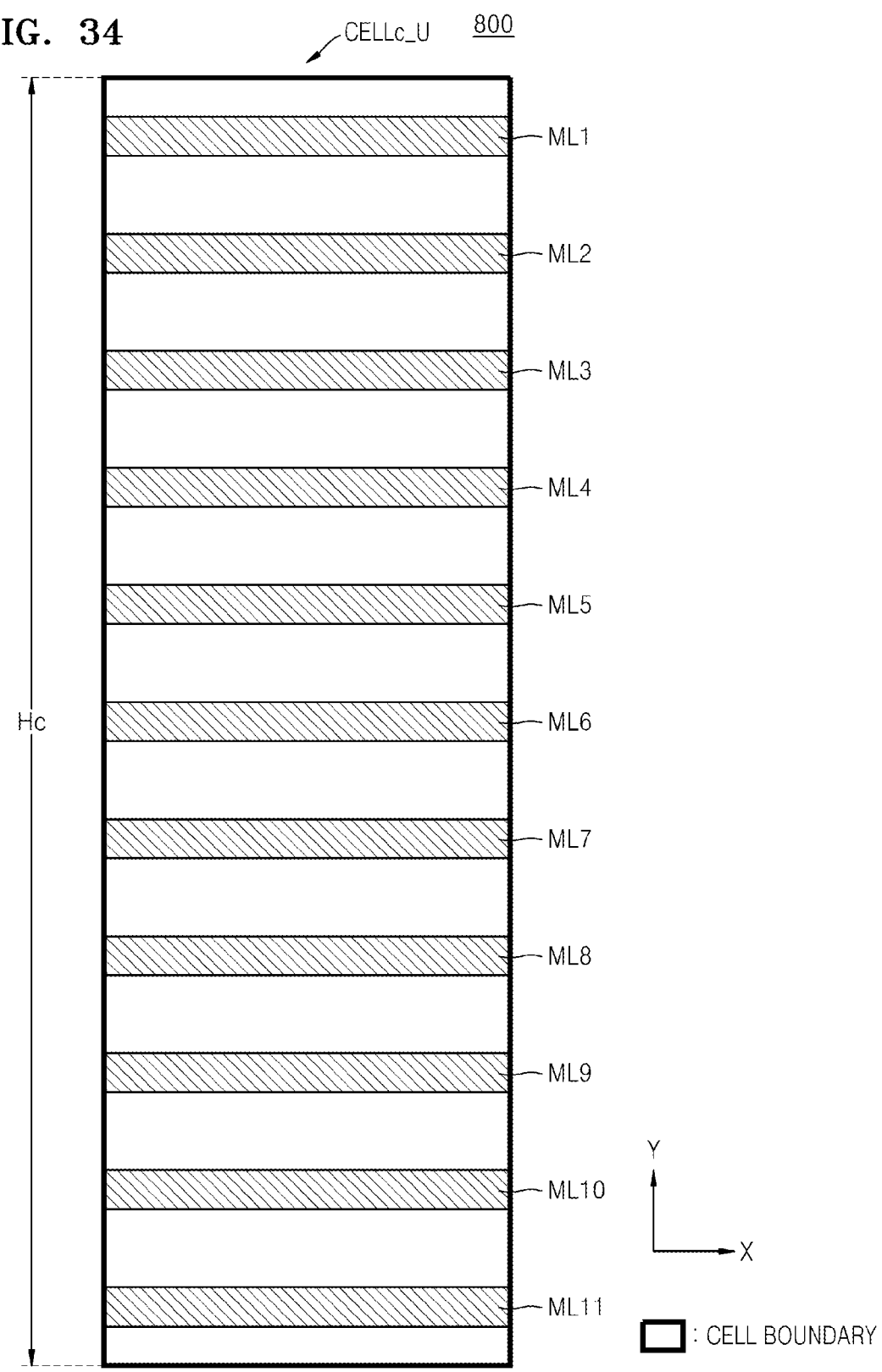
FIG. 34 is a layout of an upper layer of the semiconductor IC according to some example embodiments of the inventive concepts.

FIG. 34 is a layout of an upper layer CELLc_U of the semiconductor IC 800 according to some example embodiments of the inventive concepts.

Referring to FIG. 34, the semiconductor IC 800 may include the cell CELLc (FIG. 35) including the upper layer CELLc_U that may include 11 metal lines ML1 through ML11 arranged in parallel to each other in a first direction (for example, an X direction). For example, a pitch of the 11 metal lines ML1 through ML11 may be 45 and thus, the height Hc of the cell CELLc may be 495 (=11*45).

Figure 35:
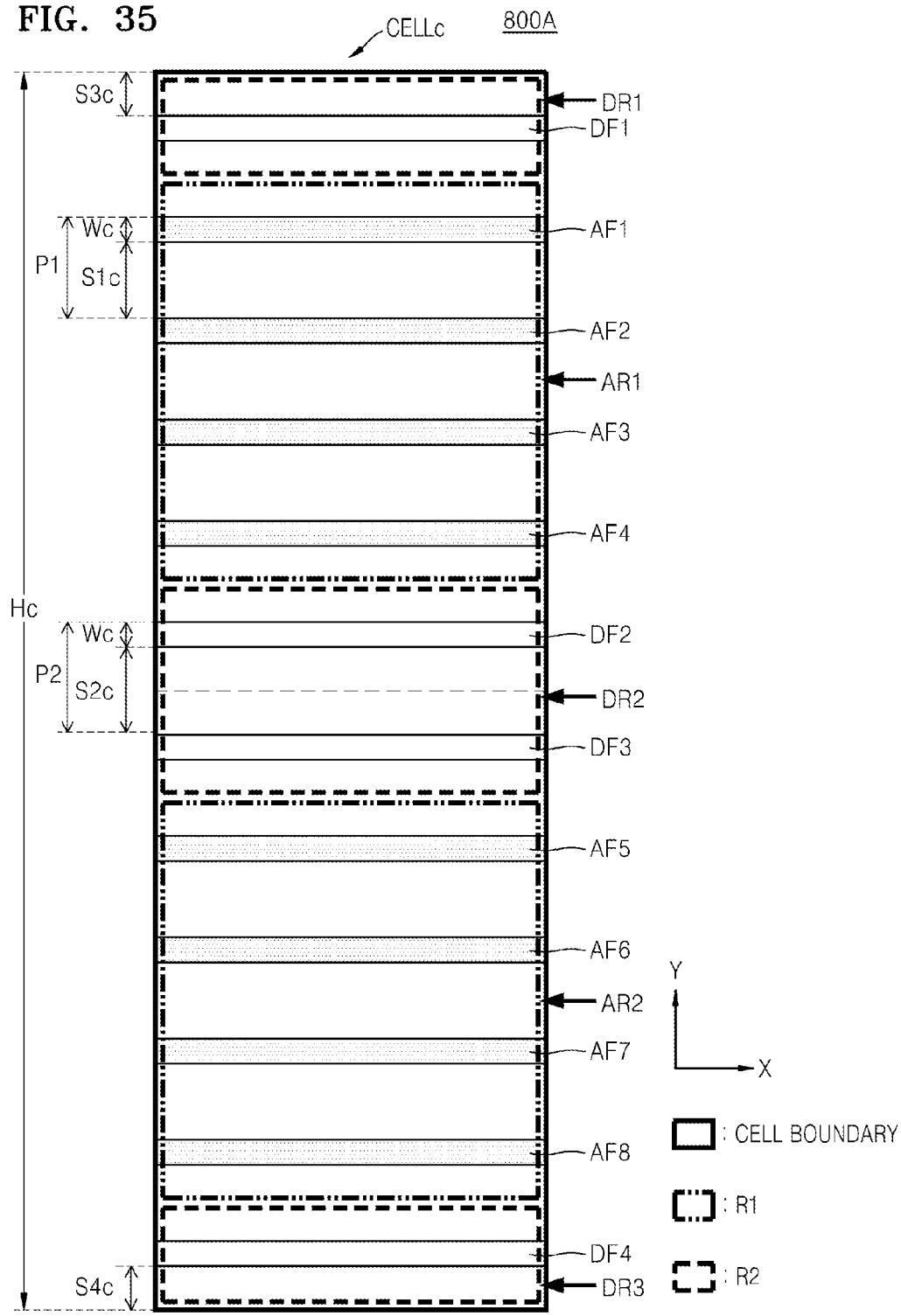
FIG. 35 is a layout of a semiconductor IC including the upper layer of FIG. 34 according to some example embodiments of the inventive concepts.

FIG. 35 is a layout of a semiconductor IC 800A including the upper layer CELLc_U of FIG. 34 according to some example embodiments of the inventive concepts.

Referring to FIG. 35, the semiconductor IC 800A may include the cell CELLc whose height Hc may be, for example, 495. Therefore, if a minimum value of a pitch of active fins or dummy fins that are included in the cell CELLc is 40.5, the cell CELLc may include 12 active fins or dummy fins (i.e., 40.5*12≤495).

The cell CELLc may include the first through eighth active fins AF1 through AF8 and the first through fourth dummy fins DF1 through DF4 that are arranged in parallel to each other in a first direction (for example, an X direction), and may be divided into the first and second active regions AR1 and AR2 and the first through third dummy regions DR1, DR2, and DR3. More specifically, the first active region AR1 may include the first through fourth active fins AF1 through AF4, and the second active region AR2 may include the fifth thorough eighth active fins AF5 through AF8. Also, the first dummy region DR1 may include the first dummy fin DF1, the second dummy region DR2 may include the second and third dummy fins DF2 and DF3, and the third dummy region DR3 may include the fourth dummy fin DF4.

In some example embodiments, a width Wc of each of the first through eighth active fins AF1 through AF8 and the first through fourth dummy fins DF1 through DF4 may be substantially the same. Also, a space S1c between two adjacent active fins among the first through eighth active fins AF1 through AF8 may have an invariable value, and thus the first pitch P1 of the first through eighth active fins AF1 through AF8 may have an invariable value. Also, a space S2c between two adjacent dummy fins among the first through fourth dummy fins DF1 through DF4 may have a variable value, and thus the second pitch P2 of the first through fourth dummy fins DF1 through DF4 may have a variable value. In this regard, the second pitch P2 of the first through fourth dummy fins DF1 through DF4 may be changed based on the height Hc of the cell CELLc.

For example, the width Wc of each of the first through eighth active fins AF1 through AF8 and the first through fourth dummy fins DF1 through DF4 may be 10, the first pitch P1 of the first through eighth active fins AF1 through AF8 may be 40.5, and the second pitch P2 of the first through fourth dummy fins DF1 through DF4 may be 45.5. Therefore, the space S2c between the second and third dummy fins DF2 and DF3 may be 35.5.

Figure 36:
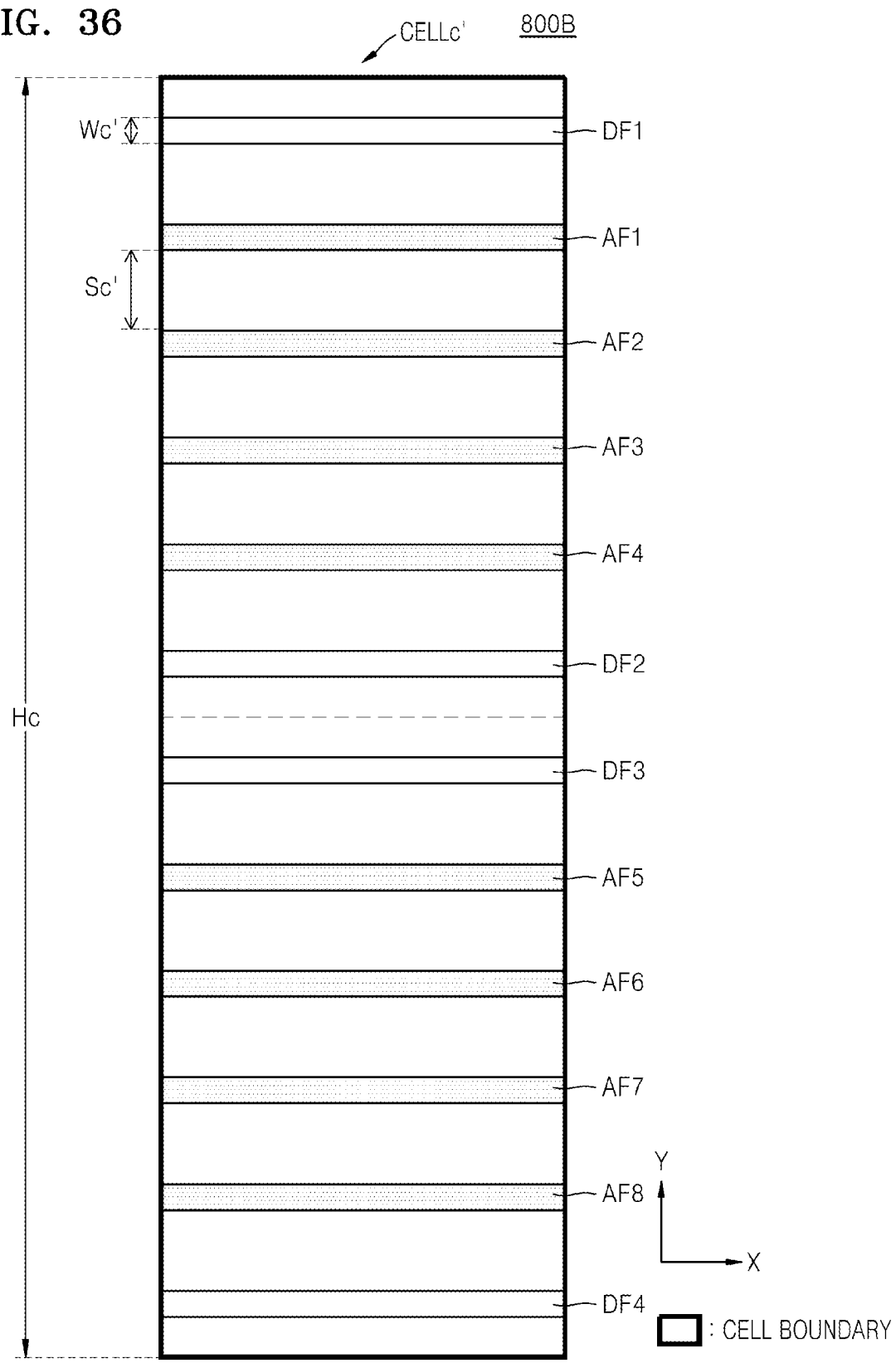
FIG. 36 is a layout of a semiconductor IC including the upper layer of FIG. 34, according to a comparison example.

FIG. 36 is a layout of a semiconductor IC 800B including the upper layer CELLc_U of FIG. 34, according to a comparison example.

Referring to FIG. 36, the semiconductor IC 800B may include the cell CELLc' whose height Hc may be, for example, 495. Therefore, if a minimum value of a pitch of active fins or dummy fins that are included in the cell CELLc' is 40.5, the cell CELLc' may include 12 active fins or dummy fins (i.e., 40.5*12≤495).

The cell CELLc' may include the first through eighth active fins AF1 through AF8 and the first through fourth dummy fins DF1 through DF4 that are arranged in parallel to each other in a first direction (for example, an X direction). In this regard, a width Wc' of each of the first through eighth active fins AF1 through AF8 and the first through fourth dummy fins DF1 through DF4 may be substantially the same. Also, a space Sc' between two adjacent fins among the first through eighth active fins AF1 through AF8 and the first through fourth dummy fins DF1 through DF4 may be substantially the same. Therefore, a pitch of the first through eighth active fins AF1 through AF8 and the first through fourth dummy fins DF1 through DF4 may have an invariable value.

For example, the width Wc' of each of the first through eighth active fins AF1 through AF8 and the first through fourth dummy fins DF1 through DF4 may be 10, and the pitch of the first through eighth active fins AF1 through AF8 and the first through fourth dummy fins DF1 through DF4 may be 41.25.

Referring to FIGS. 28 through 36, as the number of metal lines in FIGS. 28, 31, and 34 are increased to 8, 9, and 11, respectively, heights of cells are also increased to 360, 405, and 495. As shown in FIGS. 30, 33, and 36, if a pitch of active fins and dummy fins is changed adaptively with respect to changes in the heights of the cells, a plurality of libraries needs to be prepared according to a change in the pitch, and a plurality of simulation tools for supporting the plurality of libraries needs to be prepared. Therefore, it is not relatively easy to adaptively implement a fin FET with respect to the changes in the heights of the cells.

However, in some example embodiments, as shown in FIGS. 29, 32, and 35, if the pitch of the dummy fins is adaptively changed with respect to the changes in the heights of the cells and the pitch of the active fins is not changed, a single simulation tool may be used to support the plurality of libraries. Therefore, it is relatively easy to adaptively implement the fin FET with respect to the changes in the heights of the cells.

Figure 37:
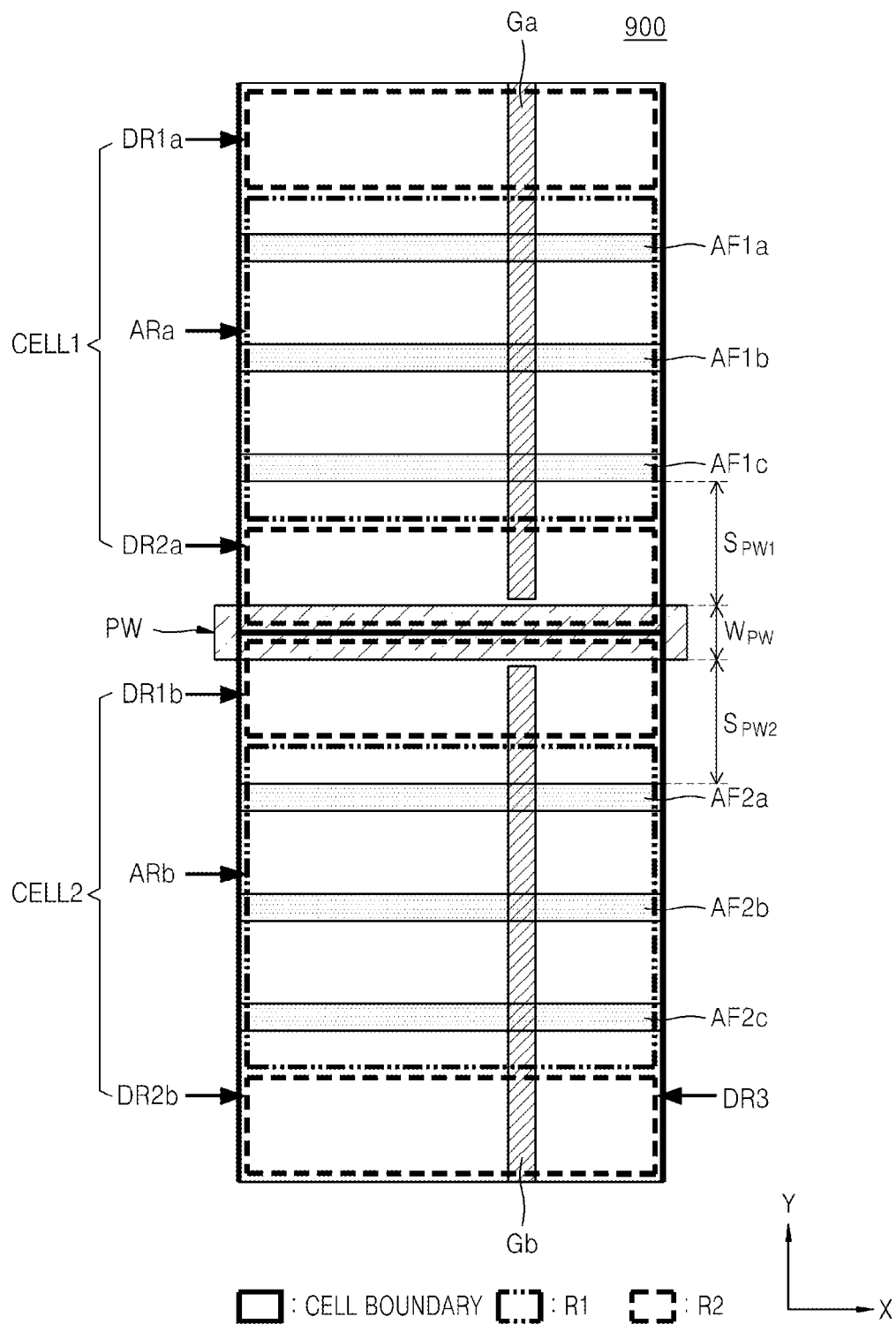
FIG. 37 is a layout of a semiconductor IC including a power region according to some example embodiments of the inventive concepts.

FIG. 37 is a layout of a semiconductor IC 900 including a power region according to some example embodiments of the inventive concepts.

Referring to FIG. 37, the semiconductor IC 900 may include first and second cells CELL1 and CELL2 that are disposed to be adjacent to each other in a second direction (for example, a Y direction). The first cell CELL1 may include an active region ARa and dummy regions DR1a and DR2a. The second cell CELL2 may include an active region ARb and dummy regions DR1b and DR2b. As described above, FIG. 37 shows a lower part of the first cell CELL1 and an upper part of the second cell CELL2 for convenience of description.

The active region ARa of the first cell CELL1 may include a plurality of active fins AF1a, AF1b, and AF1c, and may further include a gate electrode Ga disposed to cross the plurality of active fins AF1a, AF1b, and AF1c. Similarly, the active region ARb of the second cell CELL2 may include a plurality of active fins AF2a, AF2b, and AF2c, and may further include a gate electrode Gb disposed to cross the plurality of active fins AF2a, AF2b, and AF2c. As described above, although FIG. 37 shows active fins and a single gate electrode for convenience of description, similar to FIG. 20, the first and second cells CELL1 and CELL2 may further include dummy fins, a gate electrode, source/drain contacts, input terminals, an output terminal, etc.

According to some example embodiments, a power line PW may be disposed in a boundary region between the first and second cells CELL1 and CELL2. In other words, the lower dummy region DR2a included in the first cell CELL1 and the upper dummy region DR1b included in the second cell CELL2 may correspond to the power region in which the power line PW for supplying power to the plurality of active fins AF1a, AF1b, and AF1c included in the first cell CELL1 and the plurality of active fins AF2a, AF2b, and AF2c included in the second cell CELL2 is disposed.

A space greater than a sum (i.e., $W_{PW}+S_{PW1}+S_{PW2}$) of a minimum width $W_{PW}$ of the power line PW, a minimum space $S_{PW1}$ between the power line PW and the adjacent active fin AF1c, and a minimum space $S_{PW2}$ between the power line PW and the adjacent active fin AF2a needs to be secured for the layout of the power line PW. According to some example embodiments, a pitch of dummy fins may be adaptively changed with respect to changes in heights of the first and second cells CELL1 and CELL2. The pitch of the dummy fins may be greater than or the same as a pitch of active fins. Accordingly, the power region for the layout of the power line PW may be sufficiently secured, and a further enough layout for the power line PW may be secured.

Figure 38:
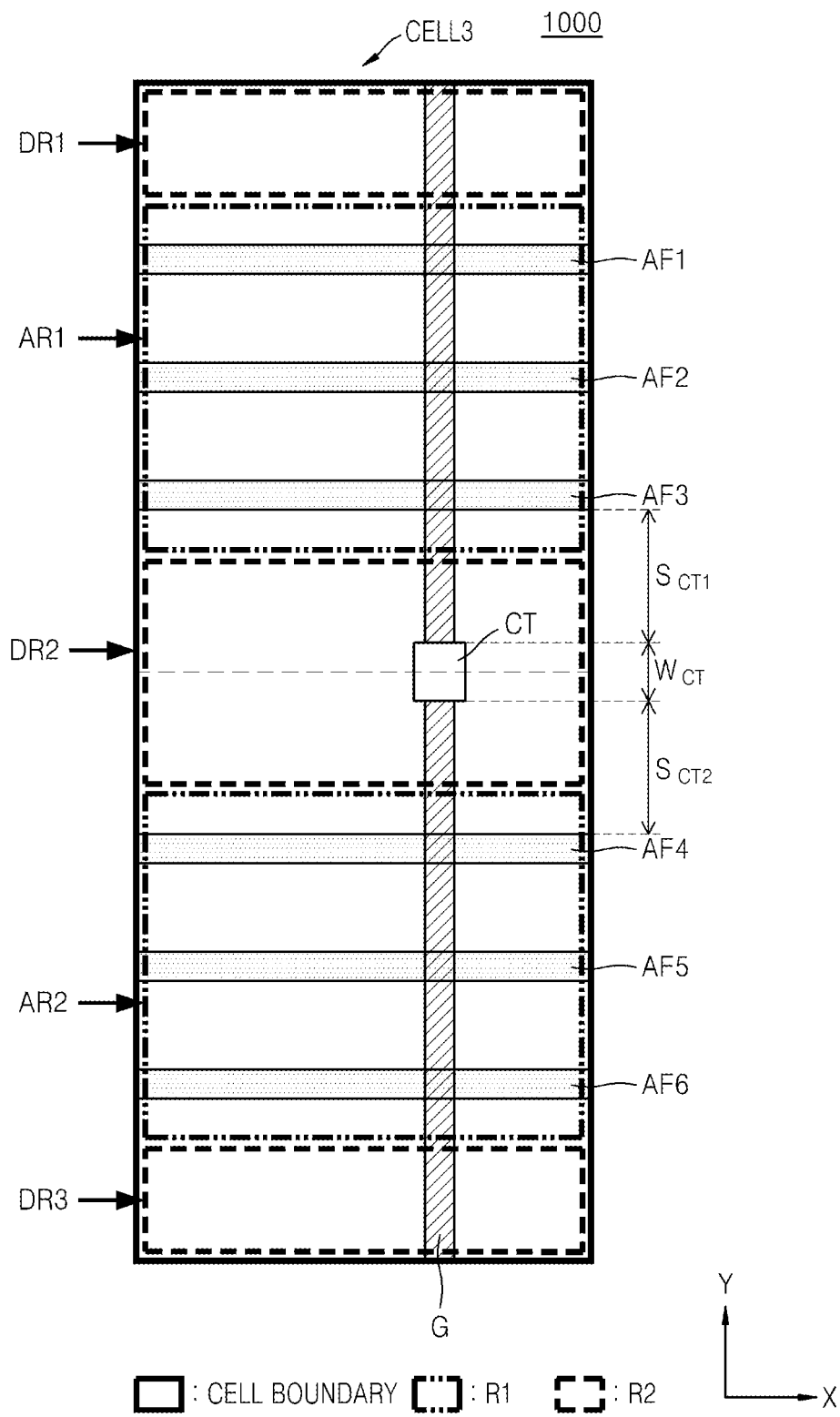
FIG. 38 is a layout of a semiconductor IC including a middle region according to some example embodiments of the inventive concepts.

FIG. 38 is a layout of a semiconductor IC 1000 including a middle region according to some example embodiments of the inventive concepts.

Referring to FIG. 38, the semiconductor IC 1000 may include a cell CELL3 that may include the plurality of active fins AF1 through AF6 and may further include a gate electrode G disposed to cross the plurality of active fins AF1 through AF6. As described above, although FIG. 38 shows active fins and a single gate electrode for convenience of description, similar to FIG. 20, the cell CELL3 may further include dummy fins, a gate electrode, source and drain contacts, input terminals, an output terminal, etc.

The cell CELL3 may be divided into the first and second active regions AR1 and AR2 and the first through third dummy regions DR1, DR2, and DR3. According to some example embodiments, the second dummy region DR2 may correspond to the middle region (for example, an MOL region) in which an input and output terminal, i.e., an input and output contact CT, with respect to the cell CELL3 is disposed.

A space greater than a sum (i.e., $W_{CT}+S_{CT1}+S_{CT2}$) of a minimum width $W_{CT}$ of the input and output contact CT, a minimum space $S_{CT1}$ between the input and output contact CT and the adjacent upper active fin AF3, and a minimum space $S_{CT2}$ between the input and output contact CT and the adjacent lower active fin AF4 needs to be secured for the layout of the input and output contact CT. According to some example embodiments, a pitch of dummy fins may be adaptively changed with respect to a change in the height of the cell CELL3. The pitch of the dummy fins may be greater than or the same as a pitch of active fins. Accordingly, the middle region for the layout of the input and output contact CT may be sufficiently secured, and a further enough layout for the input and output contact CT may be secured.

Figure 39:
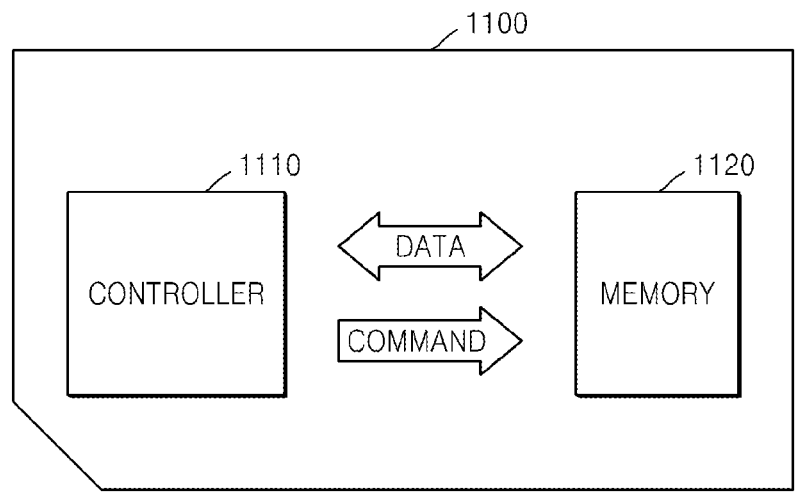
FIG. 39 is a schematic diagram of a memory card including a semiconductor IC according to some example embodiments of the inventive concepts.

FIG. 39 is a schematic diagram of a memory card 1100 including a semiconductor IC according to some example embodiments of the inventive concepts.

Referring to FIG. 39, the memory card 1100 may include a controller 1110 and a memory 1120 that may exchange electric signals with each other. For example, when the controller 1110 transmits a command to the memory 1120, the memory 1120 may transmit data to the controller 1110.

The controller 1110 and the memory 1120 may include a semiconductor IC according to some example embodiments of the inventive concepts. In particular, at least one of a plurality of semiconductor devices included in the controller 1110 and the memory 1120 may include a fin FET including active fins having an invariable pitch and dummy fins having a variable pitch. In particular, the controller 1110 and the memory 1120 may include the fin FET or the semiconductor IC including the fin FET described in some example embodiments of the inventive concepts described above.

The memory card 1100 may include any of a variety of memory cards, for example, a memory stick card, a smart media (SM) card, a secure digital (SD) card, a mini SD card, and a multimedia card (MMC).

Figure 40:
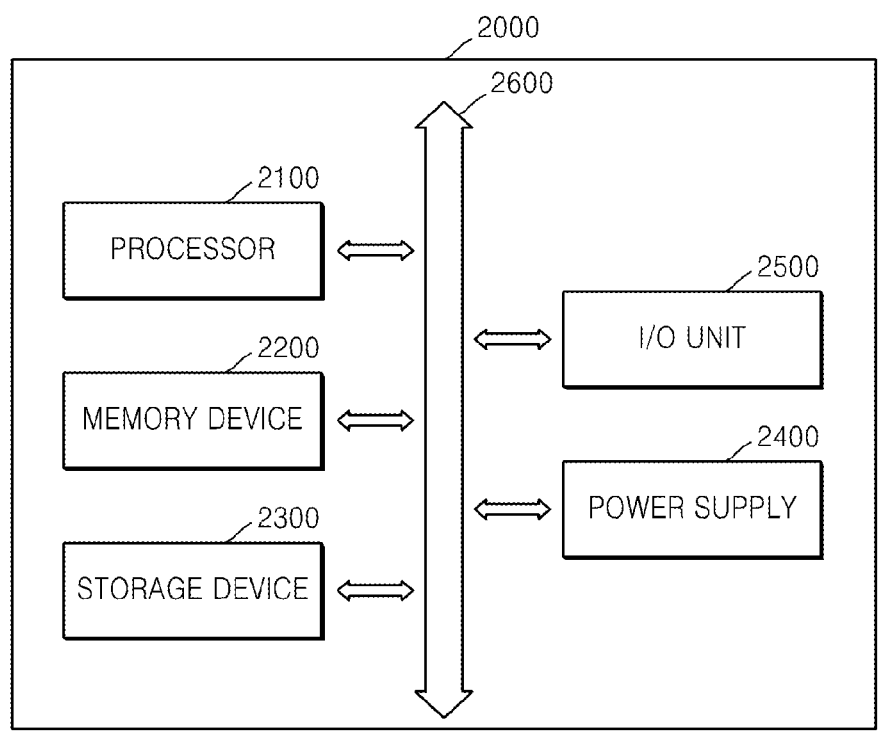
FIG. 40 is a schematic diagram of a computing system including a semiconductor IC according to some example embodiments of the inventive concepts.

FIG. 40 is a schematic diagram of a computing system 2000 including a semiconductor IC according to some example embodiments of the inventive concepts.

Referring to FIG. 40, the computing system 2000 may include a processor 2100, a memory device 2200, a storage device 2300, a power supply 2400, and an input/output (I/O) unit 2500. Although not illustrated in FIG. 40, the computing system 2000 may further include ports for communication with a video card, a sound card, a memory card, or a universal serial bus (USB), or with other electronic devices.

The processor 2100, the memory device 2200, the storage device 2300, the power supply 2400, and the I/O unit 2500 in the computing system 2000 may include a semiconductor IC according to some example embodiments of the inventive concepts. In particular, at least one of a plurality of semiconductor devices included in the processor 2100, the memory device 2200, the storage device 2300, the power supply 2400, and the I/O unit 2500 may include a fin FET including active fins having an invariable pitch and dummy fins having a variable pitch. In particular, the processor 2100, the memory device 2200, the storage device 2300, the power supply 2400, and the I/O unit 2500 in the computing system 2000 may include the fin FET or the semiconductor IC including the fin FET described in some example embodiments of the inventive concepts described above.

The processor 2100 may perform specific computations or tasks. In some example embodiments, the processor 2100 may be a micro-processor, a central processing unit (CPU), or the like. The processor 2100 may communicate with the memory device 2200, the storage device 2300, and the I/O unit 2500 via a bus 2600, for example, an address bus, a control bus, and a data bus. In some example embodiments, the processor 2100 may be connected with an extended bus, such as a peripheral component interconnect (PCI) bus.

The memory device 2200 may store data used for operation of the computing system 2000. For example, the memory device 2200 may be implemented as a dynamic random access memory (DRAM), a mobile DRAM, a static random access memory (SRAM), a parameter random access memory (PRAM), a ferroelectric random access memory (FRAM), a resistive random access memory (RRAM), and/or a magnetoresistive random access memory (MRAM). The storage device 2300 may include, for example, a solid state drive, a hard disk drive, or a compact disc read-only memory (CD-ROM).

The I/O unit 2500 may include an input unit such as a keyboard, a keypad, or a mouse, and an output unit such as a printer or a display. The power supply 2400 may supply an operating voltage to the computing system 2000.

The semiconductor ICs according to some example embodiments of the inventive concepts described above may be implemented as any of a variety of package forms. For example, at least some elements of the semiconductor IC chip may be mounted using packages, for example, Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline IC (SOIC), Shrink Small Outline Package (SSOP), Thin Small Outline (TSOP), System In Package (SIP), Multi Chip Package (MCP), Wafer-level Fabricated Package (WFP), and Wafer-Level Processed Stack Package (WSP).

While example embodiments have been particularly shown and described, it will be understood by those of ordinary skill in the art that various changes in form and details may be made therein without departing from the spirit and scope of the present invention as defined by the following claims.

What is claimed is:

1. A semiconductor integrated circuit (IC), comprising:
    at least one cell having at least one fin field-effect transistor (FET);
    wherein the at least one cell comprises a plurality of fins that extend in a first direction and are arranged in parallel to each other in a second direction that is perpendicular to the first direction,
    wherein the at least one cell comprises a plurality of metal lines extending in the first direction and arranged in parallel to each other in the second direction,
    wherein a size of the at least one cell in the second direction corresponds to a number and a pitch of the plurality of fins, wherein the plurality of metal lines comprises two power lines arranged at both ends of the at least one cell in the second direction and a plurality of wires between the power lines, and wherein the plurality of fins include a plurality of active fins and a plurality of dummy fins.

2. The semiconductor IC of claim 1, wherein the plurality of active fins are adjacent to each other; and the plurality of dummy fins are adjacent to each other.

3. The semiconductor IC of claim 1, wherein the metal lines have a same width.

4. The semiconductor IC of claim 1, wherein the wires have a same width.

5. The semiconductor IC of claim 1, wherein a width of each of the power lines is greater than a width of each of the wires.

6. The semiconductor IC of claim 1, wherein the pitch of the fins has a constant value irrespective of the number of fins included in the at least one cell, and wherein the number of fins is determined according to a number of the metal lines included in the at least one cell.

7. A semiconductor integrated circuit (IC), comprising:

at least one cell having at least one fin field-effect transistor (FET);

wherein the at least one cell comprises, a first region comprising a plurality of active fins arranged in parallel to each other in a first direction; and a second region comprising a plurality of dummy fins arranged in parallel to the plurality of active fins; and wherein the second region further comprises, a power region in which a power line configured to supply power to the plurality of active fins is disposed; and at least one middle region in which input and output terminals with respect to the at least one cell are disposed.

8. The semiconductor IC of claim 7, wherein the first region includes no dummy fins.

9. The semiconductor IC of claim 7, wherein the second region includes no active fins.

10. The semiconductor IC of claim 7, wherein a first pitch of the active fins is less than a second pitch of the dummy fins.

11. The semiconductor IC of claim 7, wherein the active fins and the dummy fins have a same width.

12. The semiconductor IC of claim 7, wherein the first region includes no dummy fins, and wherein the second region includes no active fins.

13. The semiconductor IC of claim 7, wherein the first region further comprises:

a first active region; and a second active region; and wherein the second region further comprises, a first dummy region between a first cell boundary of the at least one cell and the first active region;

a second dummy region between the first active region and the second active region; and a third dummy region between a second cell boundary of the at least one cell and the second active region.

14. The semiconductor IC of claim 7, wherein the at least one cell further comprises a plurality of metal lines arranged in parallel to the active fins and dummy fins, and above the first and second regions, and wherein a pitch of the dummy fins is determined according to a number of the metal lines included in the at least one cell.

15. A semiconductor integrated circuit (IC), comprising:

at least one cell having at least one fin field-effect transistor (FET);

wherein the at least one call comprises a first region, and a second region that does not overlap the first region, wherein the first region comprises at least two active fins arranged in parallel to each other with a first pitch, the first pitch being irrespective of a height of the at least one cell, wherein the second region comprises at least two dummy fins arranged in parallel to each other with a second pitch, the second pitch being determined based on the height of the at least one cell.

16. The semiconductor IC of claim 15, wherein the second pitch is greater than or equal to the first pitch.

17. The semiconductor IC of claim 15, wherein the first region includes no dummy fins, and wherein the second region includes no active fins.

18. The semiconductor IC of claim 15, wherein two or more of the at least two active fins are arranged consecutively in a direction that is perpendicular to an arrangement direction of the at least two active fins, wherein two or more of the at least two dummy fins are arranged consecutively in a direction that is perpendicular to an arrangement direction of the at least two dummy fins, or wherein two or more of the at least two active fins are arranged consecutively in the direction that is perpendicular to the arrangement direction of the at least two active fins, and two or more of the at least two dummy fins are arranged consecutively in the direction that is perpendicular to the arrangement direction of the at least two dummy fins.

19. The semiconductor IC of claim 15, wherein the at least one cell further comprises a plurality of metal lines arranged in parallel to the active fins and dummy fins, and above the first and second regions, and wherein the second pitch is determined according to a number of the metal lines included in the at least one cell.

* * * * *